(12) United States Patent
Ohmaru

(10) Patent No.: US 10,163,948 B2
(45) Date of Patent: Dec. 25, 2018

(54) IMAGING DEVICE AND ELECTRONIC DEVICE

(71) Applicant: Semiconductor Energy Laboratory Co., Ltd., Atsugi-shi, Kanagawa-ken (JP)

(72) Inventor: Takuro Ohmaru, Fukuoka (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/211,113

(22) Filed: Jul. 15, 2016

(65) Prior Publication Data
US 2017/0025456 A1    Jan. 26, 2017

(30) Foreign Application Priority Data
Jul. 23, 2015  (JP) ................ 2015-145656

(51) Int. Cl.
| | | |
|---|---|---|
| H01L 29/10 | (2006.01) | |
| H01L 27/146 | (2006.01) | |
| H01L 29/786 | (2006.01) | |
| H01L 31/0272 | (2006.01) | |
| H04N 5/3745 | (2011.01) | |
| H04N 5/378 | (2011.01) | |

(52) U.S. Cl.
CPC .. H01L 27/14616 (2013.01); H01L 27/14607 (2013.01); H01L 27/14618 (2013.01); H01L 27/14625 (2013.01); H01L 29/7869 (2013.01); H01L 31/0272 (2013.01); H04N 5/378 (2013.01); H04N 5/37455 (2013.01)

(58) Field of Classification Search
CPC ................. H01L 27/14607; H01L 29/7869
USPC .................................................. 257/43
See application file for complete search history.

(56) References Cited

U.S. PATENT DOCUMENTS

| | | | | |
|---|---|---|---|---|
| 5,075,237 A | * | 12/1991 | Wu ............... | H01L 31/1136 148/DIG. 1 |
| 5,304,803 A | * | 4/1994 | Sakaino ............ | H01L 27/1465 250/332 |
| 5,525,813 A | * | 6/1996 | Miyake ............ | H01L 27/14665 250/208.1 |
| 5,796,448 A | * | 8/1998 | Kim ................ | G02F 1/136213 349/38 |

(Continued)

FOREIGN PATENT DOCUMENTS

JP    2011-119711 A    6/2011

OTHER PUBLICATIONS

He et al., "Four-Thin Film Transistor Pixel Electrode Circuits for Active-Matrix Organic Light-Emitting Displays", Japanese Journal of Applied Physics 40 (2001) pp. 1199-1208.*

*Primary Examiner* — Jay C Kim
(74) *Attorney, Agent, or Firm* — Fish & Richardson P.C.

(57) ABSTRACT

An imaging device capable of obtaining high-quality imaging data is provided. The imaging device can correct variation in the threshold voltage of amplifier transistors included in pixel circuits. The amplifier transistor includes two gates facing each other with a channel formation region provided therebetween. The amplifier transistor operates in such a manner that one of the gates holds a potential for correcting variation in the threshold voltage and the other thereof is supplied with a potential corresponding to imaging data.

14 Claims, 61 Drawing Sheets

(56) References Cited

U.S. PATENT DOCUMENTS

| | | | |
|---|---|---|---|
| 6,091,793 A * | 7/2000 | Kamashita | G11C 19/282 257/258 |
| 6,310,683 B1 * | 10/2001 | Fujiwara | G06K 9/0004 250/556 |
| 6,486,504 B1 * | 11/2002 | Guidash | H04N 5/35554 257/222 |
| 6,566,685 B2 * | 5/2003 | Morikawa | H01L 27/14609 257/432 |
| 6,747,638 B2 * | 6/2004 | Yamazaki | H01L 27/14678 257/E27.147 |
| 6,888,571 B1 * | 5/2005 | Koshizuka | H04N 5/353 348/222.1 |
| 7,551,059 B2 * | 6/2009 | Farrier | H01L 27/14603 250/208.1 |
| 7,652,713 B2 * | 1/2010 | Yamasaki | G02B 7/34 348/345 |
| 7,755,711 B2 * | 7/2010 | Kenmochi | G02F 1/13338 345/91 |
| 8,242,837 B2 * | 8/2012 | Yamazaki | H04M 1/0266 327/581 |
| 8,319,874 B2 * | 11/2012 | Suzuki | H01L 27/14603 348/308 |
| 8,378,391 B2 * | 2/2013 | Koyama | H01L 27/1225 257/223 |
| 8,581,170 B2 | 11/2013 | Kurokawa | |
| 8,586,905 B2 | 11/2013 | Kurokawa | |
| 8,610,696 B2 | 12/2013 | Kurokawa | |
| 8,680,478 B2 * | 3/2014 | Ofuji | H04N 5/32 250/336.1 |
| 8,716,712 B2 * | 5/2014 | Kozuma | H01L 27/14603 257/444 |
| 8,773,560 B2 * | 7/2014 | Okita | H04N 5/335 250/208.1 |
| 8,895,343 B2 * | 11/2014 | Peterson | H01L 27/14609 257/432 |
| 8,916,869 B2 | 12/2014 | Koyama et al. | |
| 8,946,794 B2 * | 2/2015 | Ahn | H01L 31/02 257/239 |
| 8,952,313 B2 * | 2/2015 | Tamura | H01L 27/14612 250/208.1 |
| 9,117,713 B2 | 8/2015 | Koyama | |
| 9,147,722 B2 * | 9/2015 | Kanegae | H01L 27/1225 |
| 9,196,645 B2 * | 11/2015 | Tazoe | H01L 27/14603 |
| 9,225,329 B2 * | 12/2015 | Kozuma | H03K 19/0008 |
| 9,257,590 B2 * | 2/2016 | Chan | H01L 31/12 |
| 9,324,747 B2 * | 4/2016 | Yamazaki | H01L 27/14616 |
| 9,437,642 B2 * | 9/2016 | Kimura | H01L 27/14607 |
| 9,473,714 B2 * | 10/2016 | Aoki | G09G 3/3413 |
| 9,576,994 B2 * | 2/2017 | Inoue | H01L 29/7869 |
| 9,576,995 B2 * | 2/2017 | Inoue | H01L 29/7869 |
| 9,584,707 B2 * | 2/2017 | Inoue | H04N 5/2253 |
| 9,634,048 B2 * | 4/2017 | Kurokawa | H01L 27/14616 |
| 9,741,761 B2 * | 8/2017 | Jiang | H01L 27/14649 |
| 9,748,291 B2 * | 8/2017 | Ikeda | H01L 27/14634 |
| 9,761,730 B2 * | 9/2017 | Kurokawa | H01L 29/78654 |
| 9,761,739 B2 * | 9/2017 | Carey | H01L 27/14629 |
| 9,825,057 B2 * | 11/2017 | Yamazaki | H01L 27/1225 |
| 9,837,457 B2 * | 12/2017 | Kurokawa | H01L 29/786 |
| 9,960,280 B2 * | 5/2018 | Sato | H01L 29/7869 |
| 2007/0072439 A1 | 3/2007 | Akimoto et al. | |
| 2008/0054319 A1 | 3/2008 | Mouli | |
| 2010/0044711 A1 * | 2/2010 | Imai | H01L 27/14676 257/59 |
| 2011/0001860 A1 * | 1/2011 | Taruki | H04N 5/359 348/300 |
| 2013/0222584 A1 | 8/2013 | Aoki et al. | |
| 2014/0246670 A1 | 9/2014 | Koyama | |
| 2015/0048366 A1 | 2/2015 | Koyama et al. | |
| 2015/0171156 A1 * | 6/2015 | Miyake | H01L 29/7869 257/43 |
| 2015/0243738 A1 * | 8/2015 | Shimomura | H01L 29/24 257/43 |
| 2016/0064443 A1 | 3/2016 | Inoue et al. | |
| 2016/0064444 A1 | 3/2016 | Inoue et al. | |
| 2016/0104734 A1 | 4/2016 | Hirose et al. | |

* cited by examiner

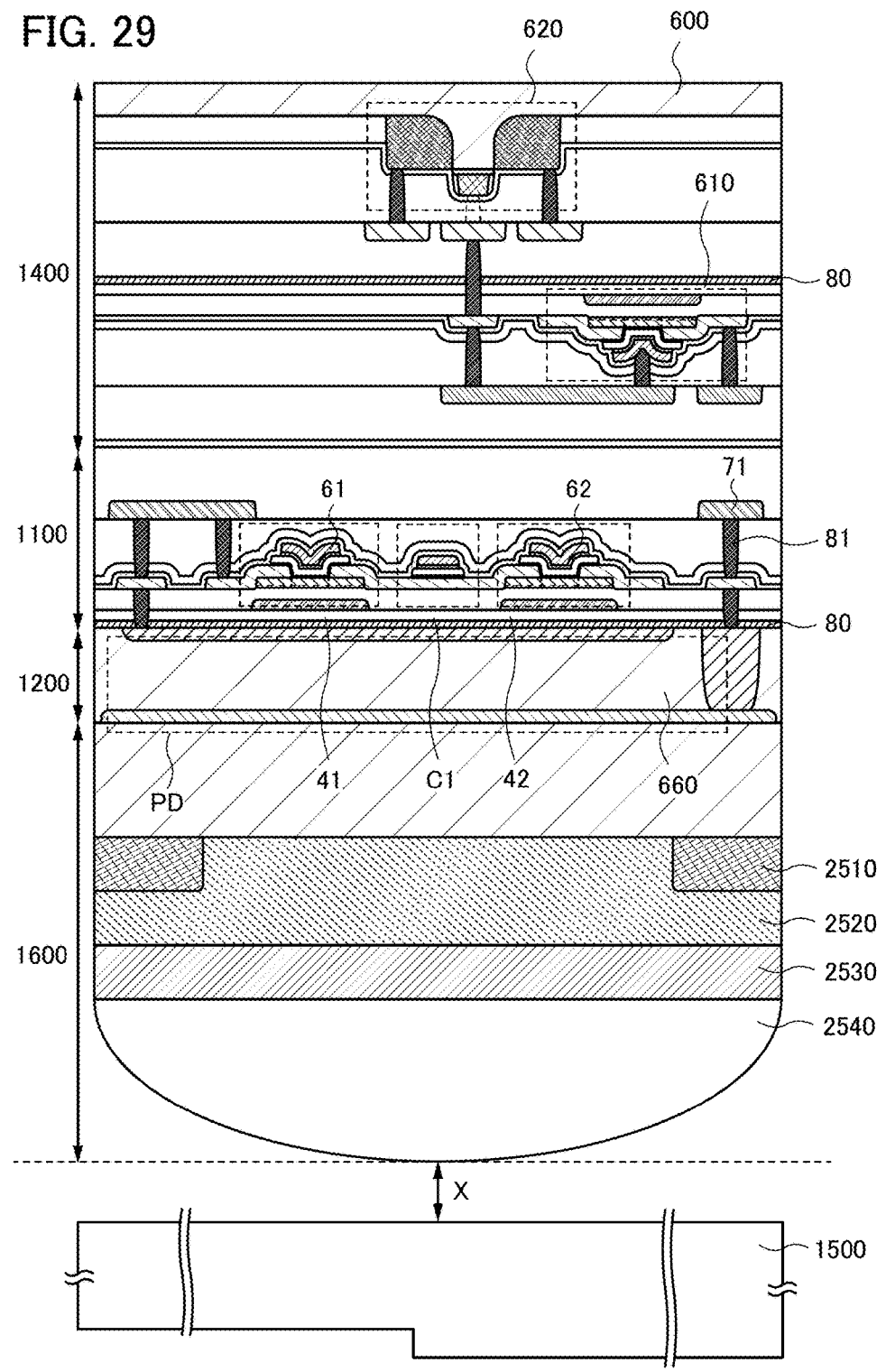

FIG. 30A1
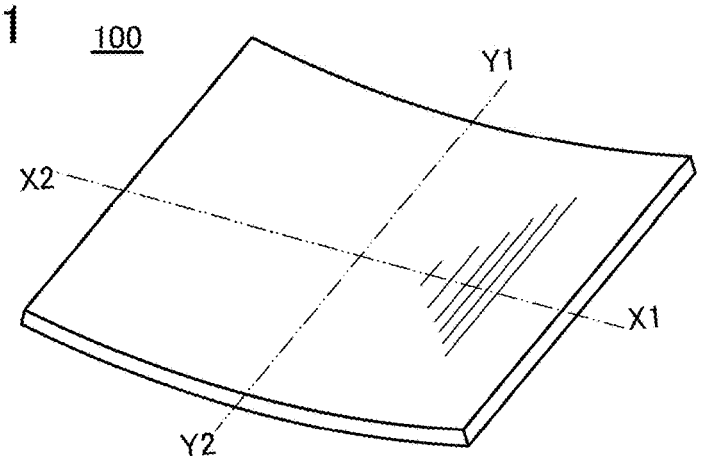
FIG. 30A2 
FIG. 30A3 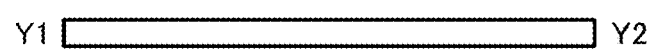
FIG. 30B1
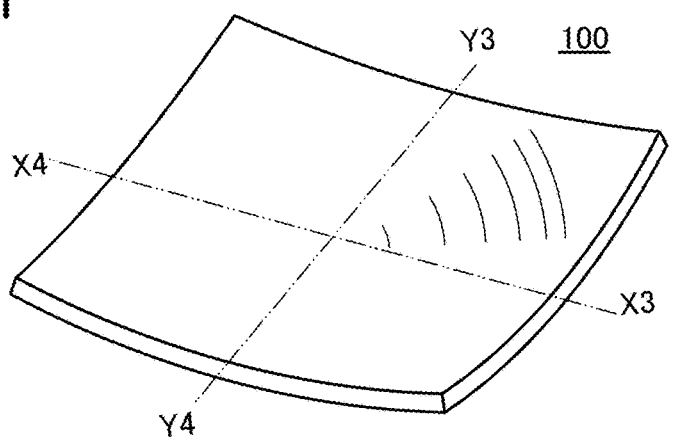
FIG. 30B2 
FIG. 30B3 

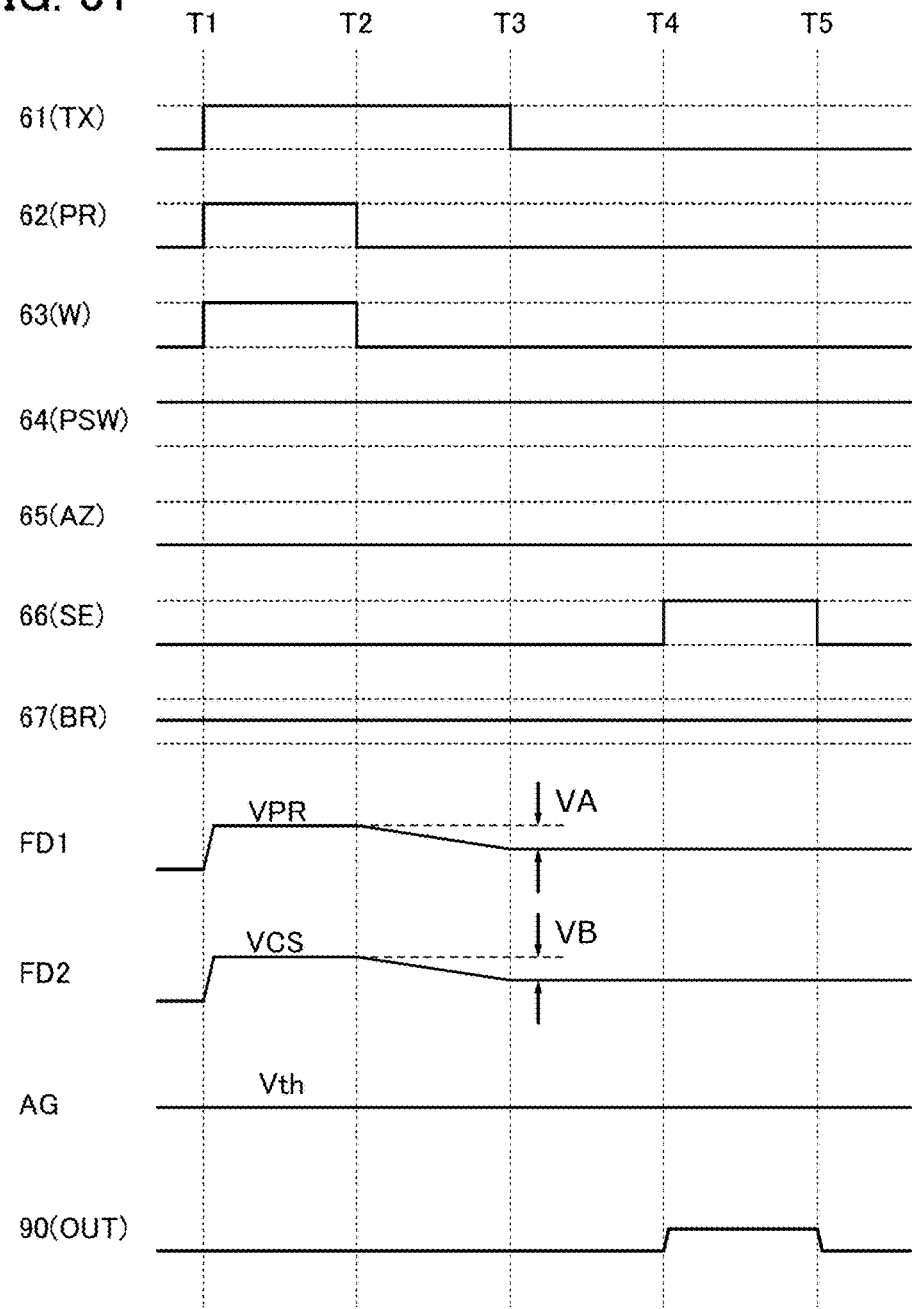

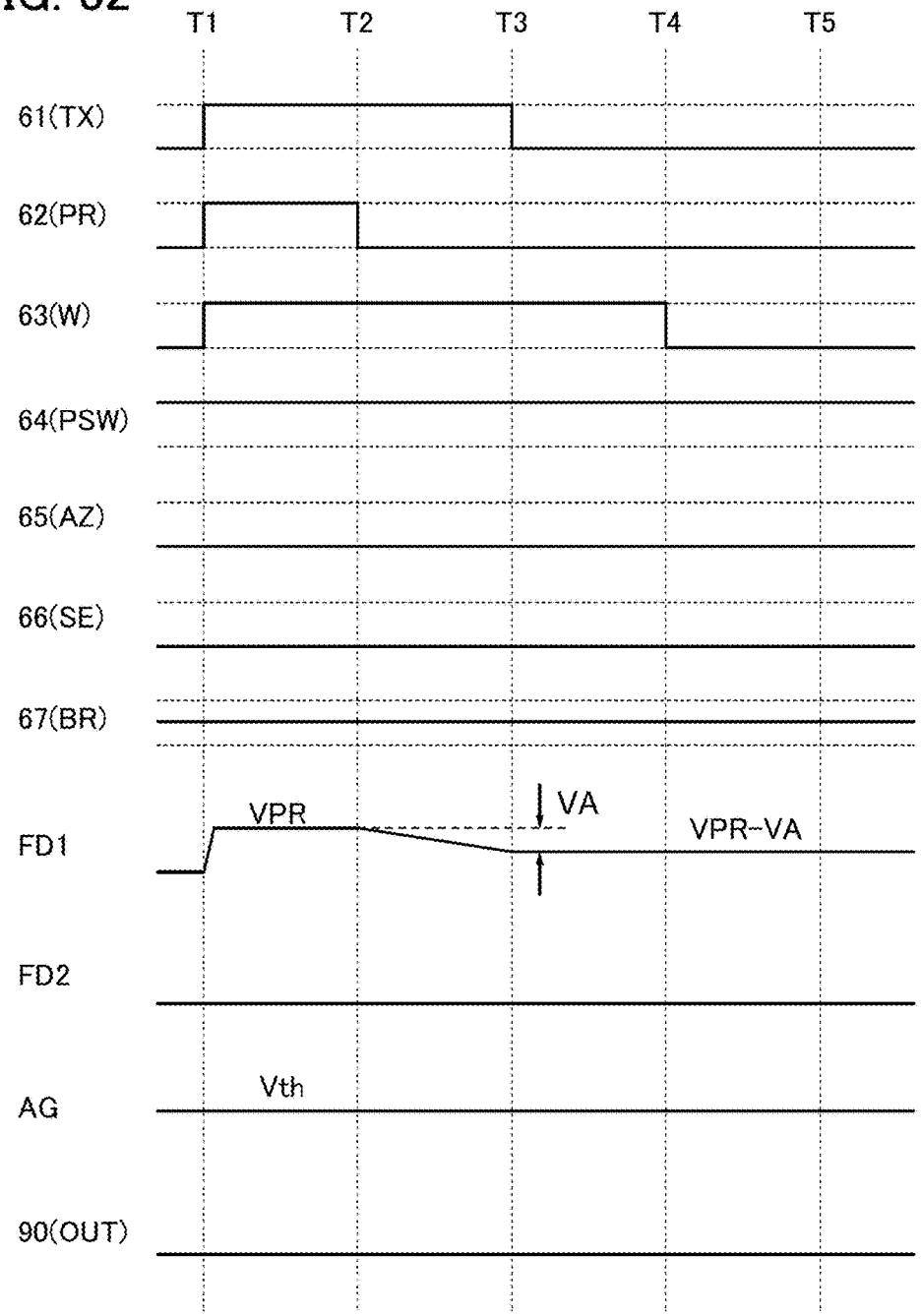

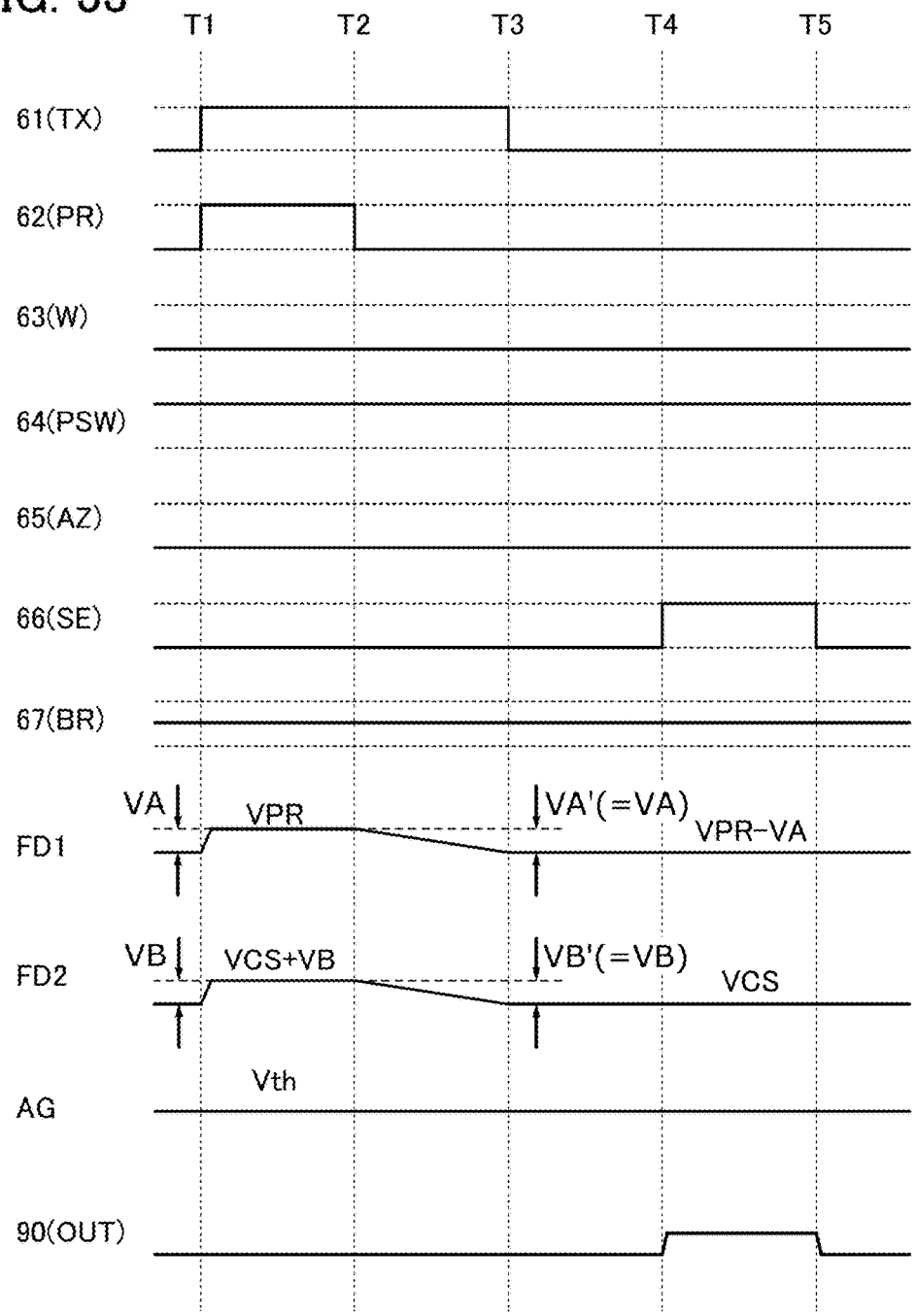

IMAGING DEVICE AND ELECTRONIC DEVICE

BACKGROUND OF THE INVENTION

1. Field of the Invention

One embodiment of the present invention relates to an imaging device and an operation method thereof.

Note that one embodiment of the present invention is not limited to the above technical field. The technical field of one embodiment of the invention disclosed in this specification and the like relates to an object, a method, or a manufacturing method. In addition, one embodiment of the present invention relates to a process, a machine, manufacture, or a composition of matter. Specifically, examples of the technical field of one embodiment of the present invention disclosed in this specification include a semiconductor device, a display device, a liquid crystal display device, a light-emitting device, a lighting device, a power storage device, a memory device, an imaging device, a method for operating any of them, and a method for manufacturing any of them.

In this specification and the like, a semiconductor device generally means a device that can function by utilizing semiconductor characteristics. A transistor and a semiconductor circuit are embodiments of semiconductor devices. In some cases, a storage device, a display device, an imaging device, or an electronic device includes a semiconductor device.

2. Description of the Related Art

As a semiconductor device in which pixels each provided with a photosensor are arranged in a matrix, a complementary metal oxide semiconductor (CMOS) image sensor is known. CMOS image sensors are provided in many portable devices such as digital cameras or cellular phones as imaging elements.

Silicon is widely known as a semiconductor material applicable to a transistor included in a semiconductor device or the like. As another material, an oxide semiconductor has attracted attention.

For example, Patent Document 1 discloses that a transistor including an oxide semiconductor and having extremely low off-state current is used in part of a pixel circuit and a transistor including a silicon semiconductor with which a CMOS circuit can be formed is used in a peripheral circuit, so that an imaging device with high speed operation and low power consumption can be manufactured.

REFERENCE

Patent Document

[Patent Document 1] Japanese Published Patent Application No. 2011-119711

SUMMARY OF THE INVENTION

A CMOS image sensor includes an amplifier transistor for outputting data in each pixel. In order to obtain high-quality imaging data, electrical characteristics of the amplifier transistors in all the pixels are preferably uniform. However, as the miniaturization of the design rule progresses, the degree of difficulty of a transistor manufacturing process increases, and it is difficult to suppress variation in electrical characteristics.

Thus, an object of one embodiment of the present invention is to provide an imaging device capable of obtaining high-quality imaging data. Another object of one embodiment of the present invention is to provide an imaging device capable of correcting variation in the threshold voltage of amplifier transistors included in pixel circuits. Another object of one embodiment of the present invention is to provide an imaging device capable of taking an image with low noise. Another object of one embodiment of the present invention is to provide an imaging device with low power consumption. Another object of one embodiment of the present invention is to provide an imaging device suitable for high-speed operation. Another object of one embodiment of the present invention is to provide an imaging device with high sensitivity. Another object of one embodiment of the present invention is to provide an imaging device with a wide dynamic range. Another object of one embodiment of the present invention is to provide an imaging device with high resolution. Another object of one embodiment of the present invention is to provide an imaging device formed at low cost. Another object of one embodiment of the present invention is to provide an imaging device with high reliability. Another object of one embodiment of the present invention is to provide a novel imaging device or the like. Another object of one embodiment of the present invention is to provide a novel semiconductor device or the like. Another object of one embodiment of the present invention is to provide a method for operating any of the above imaging devices. Another object of one embodiment of the present invention is to provide a method for operating the semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention relates to an imaging device capable of correcting variation in the threshold voltage of amplifier transistors included in pixel circuits.

One embodiment of the present invention is an imaging device including a photoelectric conversion element, a first transistor, a second transistor, a third transistor, a fourth transistor, a fifth transistor, a sixth transistor, a seventh transistor, a first capacitor, and a second capacitor. The fourth transistor includes a first gate and a second gate. The second gate is provided to face the first gate with a channel formation region provided therebetween. One terminal of the photoelectric conversion element is electrically connected to one of a source and a drain of the first transistor. The other of the source and the drain of the first transistor is electrically connected to one of a source and a drain of the second transistor. The other of the source and the drain of the first transistor is electrically connected to one terminal of the first capacitor. The other terminal of the first capacitor is electrically connected to one of a source and a drain of the third transistor. The other terminal of the first capacitor is electrically connected to the first gate of the fourth transistor. One of a source and a drain of the fourth transistor is electrically connected to one of a source and a drain of the fifth transistor. The one of the source and the drain of the fourth transistor is electrically connected to one of a source and a drain of the sixth transistor. The other of the source and the drain of the fourth transistor is electrically connected to one of a source and a drain of the seventh transistor. The other of the source and the drain of the sixth transistor is electrically connected to one terminal of the second capacitor. The other of the source and the drain of the sixth transistor is electrically connected to the second gate of the fourth transistor. The other terminal of the second capacitor is electrically connected to the other of the source and the drain of the fourth transistor.

In the above structure, the imaging device may further include a third capacitor. One terminal of the third capacitor may be electrically connected to the other terminal of the first capacitor.

In either of the above structures, the imaging device may further include a fourth capacitor. One terminal of the fourth capacitor may be electrically connected to the one terminal of the second capacitor.

Each of the first to seventh transistors preferably includes an oxide semiconductor in an active layer, and the oxide semiconductor preferably includes In, Zn, and M (M is Al, Ti, Ga, Sn, Y, Zr, La, Ce, Nd, or Hf).

In the photoelectric conversion element, selenium or a compound containing selenium can be used for a photoelectric conversion layer. For example, amorphous selenium or crystalline selenium can be used as selenium.

According to one embodiment of the present invention, an imaging device capable of obtaining high-quality imaging data can be provided. An imaging device capable of correcting variation in the electrical characteristics of amplifier transistors included in pixel circuits can be provided. An imaging device capable of taking an image with low noise can be provided. An imaging device with low power consumption can be provided. An imaging device suitable for high-speed operation can be provided. An imaging device with high sensitivity can be provided. An imaging device with a wide dynamic range can be provided. An imaging device with high resolution can be provided. An imaging device formed at low cost can be provided. An imaging device with high reliability can be provided. A novel imaging device or the like can be provided. A novel semiconductor device or the like can be provided. A method for operating any of the above imaging devices can be provided. A method for operating the semiconductor device can be provided.

Note that one embodiment of the present invention is not limited to these effects. For example, depending on circumstances or conditions, one embodiment of the present invention might produce another effect. Furthermore, depending on circumstances or conditions, one embodiment of the present invention might not produce any of the above effects.

BRIEF DESCRIPTION OF THE DRAWINGS

In the accompanying drawings:
FIG. 29 is a cross-sectional view illustrating a structure of an imaging device;
FIGS. 30A1, 30A2, 30A3, 30B1, 30B2, and 30B3 illustrate bent imaging devices;
FIG. 31 is a timing chart illustrating operation of an imaging device;
FIG. 32 is a timing chart illustrating operation of an imaging device;
FIG. 33 is a timing chart illustrating operation of an imaging device.

DETAILED DESCRIPTION OF THE INVENTION

Figure 1:
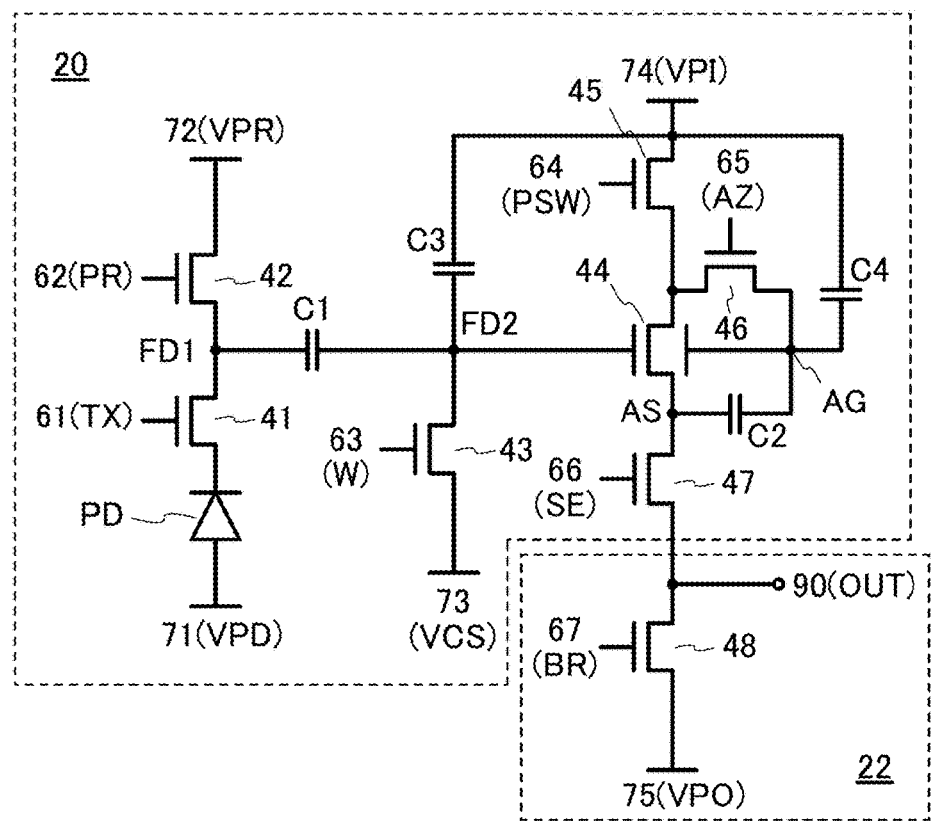
FIG. 1 is a circuit diagram illustrating an imaging device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. The present invention therefore should not be construed as being limited to the following description of the embodiments. In structures of the invention described below, the same portions or portions having similar functions are denoted by the same reference numerals in different drawings, and the description thereof is not repeated in some cases. The same components are denoted by different hatching patterns in different drawings, or the hatching patterns are omitted in some cases.

Note that the ordinal numbers such as "first" and "second" are used for convenience and do not denote the order of steps or the stacking order of layers. Therefore, for example, the term "first" can be replaced with the term "second", "third", or the like as appropriate. In addition, the ordinal numbers in this specification and the like do not correspond to the ordinal numbers which specify one embodiment of the present invention in some cases.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, each of X and Y denotes an object (e.g., a device, an element, a circuit, a wiring, an electrode, a terminal, a conductive film, or a layer).

Examples of the case where X and Y are directly connected include the case where an element that enables electrical connection between X and Y (e.g., a switch, a transistor, a capacitor, an inductor, a resistor, a diode, a display element, a light-emitting element, or a load) is not connected between X and Y, and the case where X and Y are connected without the element that enables electrical connection between X and Y provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a difference amplifier circuit, a source follower circuit, or a buffer circuit; a signal generation circuit; a storage circuit; or a control circuit) can be connected between X and Y. Note that for example, in the case where a signal output from X is transmitted to Y even when another circuit is provided between X and Y, X and Y are functionally connected. The case where X and Y are functionally connected includes the case where X and Y are directly connected and X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the explicit description "X and Y are connected".

For example, the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to part of Z1 and another part of Z1 is directly connected to X while a drain (or a second terminal or the like) of the transistor is directly connected to part of Z2 and another part of Z2 is directly connected to Y, can be expressed by using any of the following expressions.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in that order," "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in that order," and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are connected in that order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". It is also possible to use the expression "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path". Still another example of the expressions is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, or a layer).

Even when independent components are electrically connected to each other in a circuit diagram, one component has functions of a plurality of components in some cases. For example, when part of a wiring also functions as an electrode, one conductive film functions as the wiring and the electrode. Thus, the term "electrical connection" in this specification also means such a case where one conductive film has functions of a plurality of components.

Note that the terms "film" and "layer" can be interchanged with each other depending on circumstances or conditions. For example, the term "conductive layer" can be changed into the term "conductive film" in some cases. In addition, the term "insulating film" can be changed into the term "insulating layer" in some cases.

Note that in general, a potential (a voltage) is relative and is determined depending on the amount relative to a certain potential. Therefore, even when the expression "ground", "GND", or the like is used, the potential is not necessarily 0 V. For example, the "ground potential" or "GND" may be defined using the lowest potential in a circuit as a reference. Alternatively, the "ground potential" or "GND" may be defined using an intermediate potential in a circuit as a reference. In those cases, a positive potential and a negative potential are set using the potential as a reference.

Embodiment 1

In this embodiment, an imaging device that is one embodiment of the present invention is described with reference to drawings.

One embodiment of the present invention is a pixel circuit including a circuit for correcting variation in the threshold voltage of a transistor. The transistor includes two gates facing each other with a channel formation region provided therebetween. The transistor operates in such a manner that one of the gates holds a potential for correcting variation in the threshold voltage and the other thereof is supplied with a potential corresponding to imaging data. Therefore, high-quality imaging data with low noise can be obtained.

FIG. 1 is an example of a circuit diagram of a circuit 20 that can function as a pixel and a circuit 22 that can function as a current source circuit included in an imaging device in one embodiment of the present invention. Although an example in which n-channel transistors are used is illustrated in FIG. 1 and the like, one embodiment of the present invention is not limited thereto and some of the n-channel transistors may be replaced with p-channel transistors.

Figure 2:
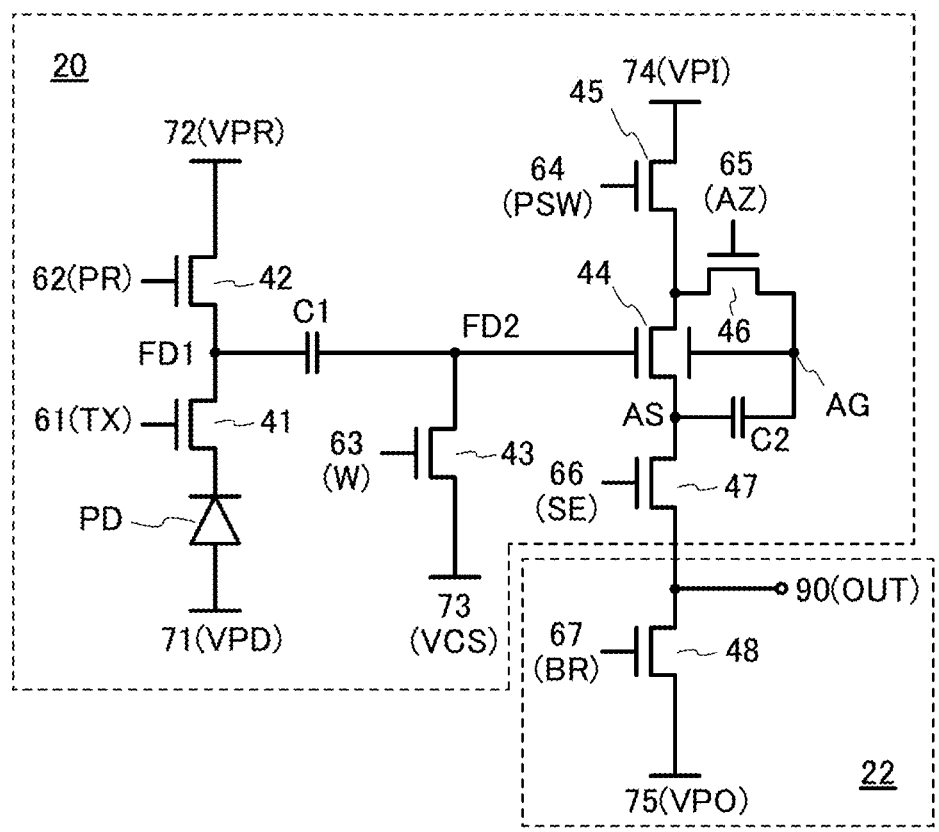
FIG. 2 is a circuit diagram illustrating an imaging device.

The circuit 20 includes a photoelectric conversion element PD, a transistor 41, a transistor 42, a transistor 43, a transistor 44, a transistor 45, a transistor 46, a transistor 47, a capacitor C1, a capacitor C2, a capacitor C3, and a capacitor C4. Note that the capacitor C3 and the capacitor C4 are not necessarily included as illustrated in FIG. 2. Alternatively, either the capacitor C3 or the capacitor C4 may be provided for the structure illustrated in FIG. 2.

The transistor 44 includes a first gate and a second gate facing each other with a channel formation region provided therebetween. The first gate can also be called a front gate and the second gate can also be called a back gate or a bottom gate.

One terminal of the photoelectric conversion element PD is electrically connected to one of a source and a drain of the transistor 41. The other of the source and the drain of the transistor 41 is electrically connected to one of a source and a drain of the transistor 42. The other of the source and the drain of the transistor 41 is electrically connected to one terminal of the capacitor C1. The other terminal of the capacitor C1 is electrically connected to one of a source and a drain of the transistor 43. The other terminal of the capacitor C1 is electrically connected to the first gate of the transistor 44. The other terminal of the capacitor C1 is electrically connected to one terminal of the capacitor C3. One of a source and a drain of the transistor 44 is electrically connected to one of a source and a drain of the transistor 45. The one of the source and the drain of the transistor 44 is electrically connected to one of a source and a drain of the transistor 46. The other of the source and the drain of the transistor 44 is electrically connected to one of a source and a drain of the transistor 47. The other of the source and the drain of the transistor 46 is electrically connected to one terminal of the capacitor C2. The other of the source and the drain of the transistor 46 is electrically connected to the second gate of the transistor 44. The one terminal of the capacitor C2 is electrically connected to one terminal of the capacitor C4. The other terminal of the capacitor C2 is electrically connected to the other of the source and the drain of the transistor 44.

Here, a node to which the other of the source and the drain of the transistor 41, the one of the source and the drain of the transistor 42, and the one terminal of the capacitor C1 are connected is denoted by FD1. A node to which the other terminal of the capacitor C1, the one of the source and the drain of the transistor 43, the first gate of the transistor 44, and the one terminal of the capacitor C3 are connected is denoted by FD2. A node to which the second gate of the transistor 44, the other of the source and the drain of the transistor 46, the one terminal of the capacitor C2, and the one terminal of the capacitor C4 are connected is denoted by AG. A node to which the other of the source and the drain of the transistor 44, the one of the source and the drain of the transistor 47, and the other terminal of the capacitor C2 are connected is denoted by AS.

The other terminal of the photoelectric conversion element PD is electrically connected to a wiring 71 (VPD). The other of the source and the drain of the transistor 42 is electrically connected to a wiring 72 (VPR). The other of the source and the drain of the transistor 43 is electrically connected to a wiring 73 (VCS). The other of the source and the drain of the transistor 45, the other terminal of the capacitor C3, and the other terminal of the capacitor C4 are electrically connected to a wiring 74 (VPI). The other of the source and the drain of the transistor 47 is electrically connected to the circuit 22, a wiring 75 (VPO), and a wiring 90 (OUT).

In the circuit 22, one of a source and a drain of a transistor 48 is electrically connected to the other of the source and the drain of the transistor 47 and the wiring 90 (OUT), and the other of the source and the drain of the transistor 48 is electrically connected to the wiring 75 (VPO).

The wiring 71 (VPD), the wiring 72 (VPR), the wiring 73 (VCS), the wiring 74 (VPI), and the wiring 75 (VPO) can function as power supply lines. For example, the wiring 71 (VPD), the wiring 73 (VCS), and the wiring 75 (VPO) can function as low potential power supply lines. The wiring 72 (VPR) and the wiring 74 (VPI) can function as high potential power supply lines.

A gate of the transistor 41 is electrically connected to a wiring 61 (TX). A gate of the transistor 42 is electrically connected to a wiring 62 (PR). A gate of the transistor 43 is electrically connected to a wiring 63 (W). A gate of the transistor 45 is electrically connected to a wiring 64 (PSW). A gate of the transistor 46 is electrically connected to a wiring 65 (AZ). A gate of the transistor 47 is electrically connected to a wiring 66 (SE).

In the circuit 22, a gate of the transistor 48 is electrically connected to a wiring 67 (BR).

The wiring 61 (TX), the wiring 62 (PR), the wiring 63 (W), the wiring 64 (PSW), and the wiring 67 (BR) can function as signal lines for controlling conduction of the transistors.

In the above structure, the other terminal of the capacitor C3 and the other terminal of the capacitor C4 may be connected to not the wiring 74 (VPI) but another wiring or the like capable of supplying a fixed potential.

A diode element formed using a silicon substrate with a pn junction or a pin junction can be used as the photoelectric conversion element PD. Alternatively, a pin diode element formed using an amorphous silicon film, a microcrystalline silicon film, or the like may be used. Note that although the circuit 20 includes the photodiode, the circuit 20 may include another photoelectric conversion element. For example, a diode-connected transistor may be used. Alternatively, a variable resistor or the like utilizing a photoelectric effect may be formed using silicon, germanium, selenium, or the like.

Alternatively, a photodiode that includes selenium utilizing avalanche multiplication may be used. Such a photodiode can be a highly sensitive sensor in which the amplification of electrons with respect to the amount of incident light is large.

In the circuit 20, the photoelectric conversion element PD is a light-receiving element and can have a function of generating current corresponding to the amount of light incident on the circuit 20. The transistor 41 can have a function of controlling accumulation of charge in the node FD1 by the photoelectric conversion element PD. The transistor 42 can have a function of executing operation of resetting the potential of the node FD1. The transistor 43 can have a function of executing operation of resetting the potential of the node FD2. The transistor 44 can have a function of executing operation of outputting a signal based on the potential of the node FD2. The transistors 45 and 46 can each have a function of controlling current that the transistor 44 supplies. The transistor 47 can have a function of executing operation of controlling selection of the circuit 20 at the time of reading.

In the circuit 22, the transistor 48 can function as a current source transistor. In addition, the transistor 48 can have a function of outputting a voltage signal based on current supplied to the transistor 48 to the wiring 90 (OUT).

Note that the above structures of the circuit 20 and the circuit 22 are just examples, and some of the transistors, some of the capacitors, some of the wirings, or the like might not be included. Alternatively, a transistor, a capacitor, a wiring, or the like that is not included in the above structures might be included. Alternatively, connection of some wirings might be different from the above connection.

Figure 3A:
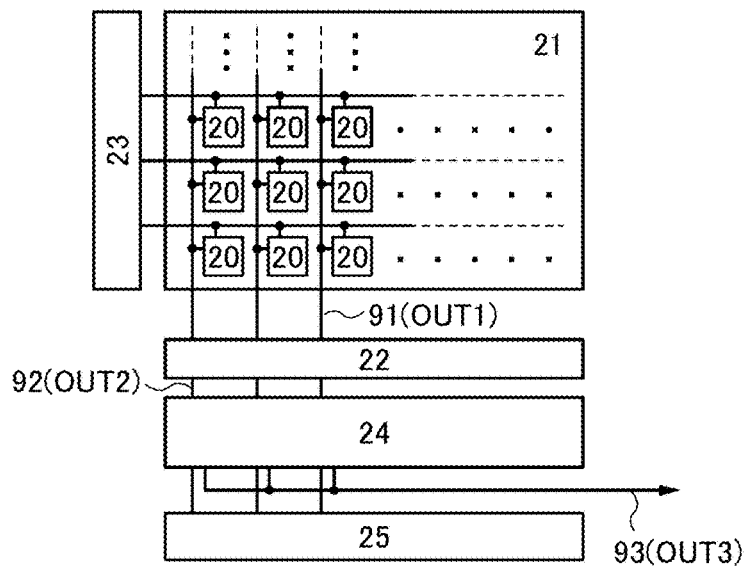
FIGS. 3A to 3C are block diagrams each illustrating an imaging device.

FIG. 3A illustrates an imaging device of one embodiment of the present invention. The imaging device includes a pixel array 21 that includes the circuits 20 arranged in a matrix, the circuit 22 that functions as a current source circuit and outputs a signal obtained by the circuit 20 as an appropriate analog signal, a circuit 23 (row driver) that has a function of driving the circuits 20, a circuit 24 (A/D converter circuit) that has a function of digital conversion of the analog signal output from the circuit 22, and a circuit 25 (column driver) that has a function of selecting and reading data converted by the circuit 24.

The circuit 23 and the circuit 25 can each include a shift register circuit, a NAND circuit, a buffer circuit, or the like. The circuit 24 can include a comparator circuit, a counter circuit, or the like.

A plurality of power supply voltages is required in the circuit 20, the circuit 22, the circuit 23, the circuit 24, the circuit 25, or the like in some cases. For example, high power supply voltages are supplied to the wiring 72 (VPR) and the wiring 74 (VPI) in the circuit 20, and different power supply voltages may be supplied to each wiring so that the circuit 20 can appropriately operate. Different power supply voltages may be supplied to each of the circuits 22 to 25 so that the circuits 22 to 25 can appropriately operate.

In that case, the number of terminals and wirings might increase to input a plurality of power supply voltages from the outside, leading to an increase in the circuit area. Therefore, a circuit (hereinafter referred to as a voltage generation circuit) that has a function of raising or lowering an input voltage may be provided in the periphery of the circuits 20 to 25 and one power supply voltage may be input to the voltage generation circuit.

Figure 3B:
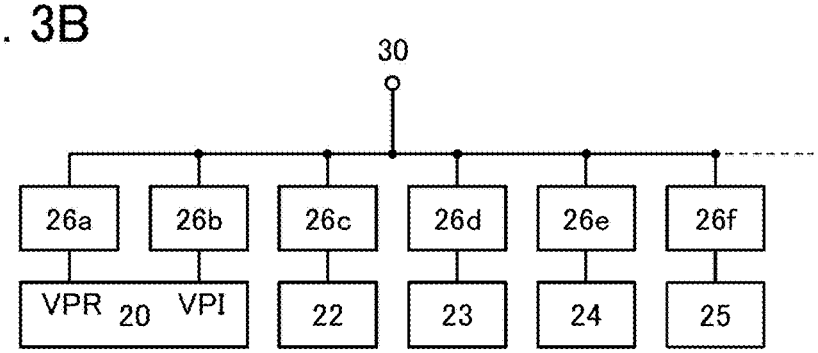
Figure 3C:
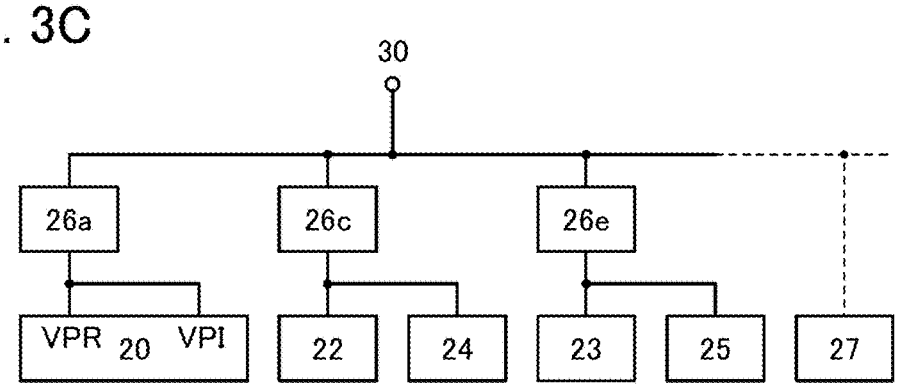

FIG. 3B illustrates an example of connections between circuits 26a to 26f having functions as voltage generation circuits and the circuits 20 and 22 to 25. With the circuits 26a to 26f, one input terminal 30 can function as a plurality of terminals for inputting a power supply voltage from the outside, and thus the number of wirings can be reduced. In the case where one power supply voltage can be used in a plurality of circuits, a power supply voltage may be supplied to a plurality of circuits from one voltage generation circuit as illustrated in FIG. 3C. A power supply voltage of a circuit 27 not illustrated in FIG. 3A may be supplied to the input terminal 30.

For example, a voltage of 1 V to 2 V, preferably a voltage of approximately 1.2 V to 1.5 V may be supplied to the input terminal 30 to be converted into power supply voltages that the circuits 20, 22, 23, 24, 25, and the like require. Note that the structures illustrated in FIGS. 3B and 3C are merely examples and the circuits 22 to 25 and 27 each require a plurality of power supply voltages in some cases. In that case, different power supply voltages may be supplied from a plurality of voltage generation circuits.

Figure 4:
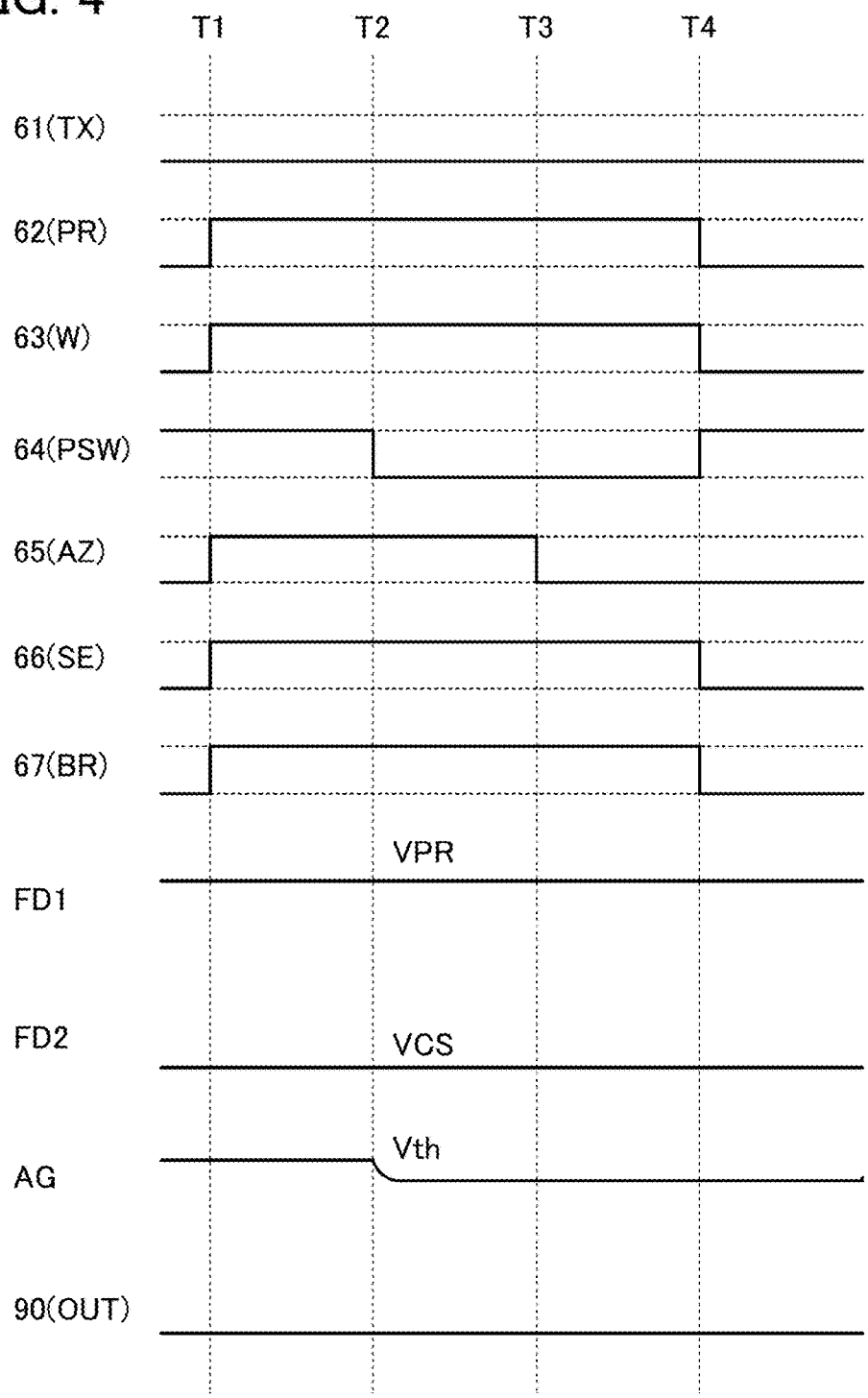
FIG. 4 is a timing chart illustrating operation of correcting variation in the threshold voltage.

Operation of correcting variation in the threshold voltage of the transistor 44 by the circuit 20 and the circuit 22 is described with a timing chart in FIG. 4, FIG. 5, FIG. 6, and FIG. 7. The timing chart in FIG. 4 shows potentials of the wiring 61 (TX), the wiring 62 (PR), the wiring 63 (W), the wiring 64 (PSW), the wiring 65 (AZ), the wiring 66 (SE), the wiring 67 (BR), the node FD1, the node FD2, the node AG, and the wiring 90. Note that the transistors are turned on or off in accordance with potentials supplied to the above-mentioned wirings connected to the gates of the transistors.

Figure 5:
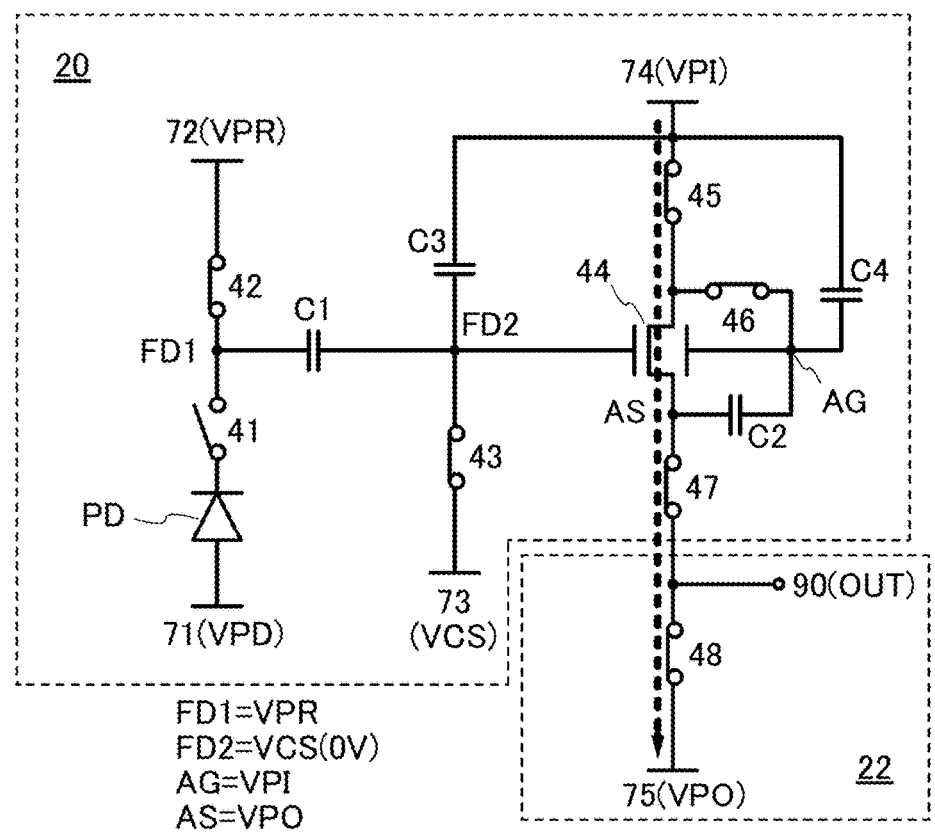
FIG. 5 illustrates operation of correcting variation in the threshold voltage.
Figure 6:
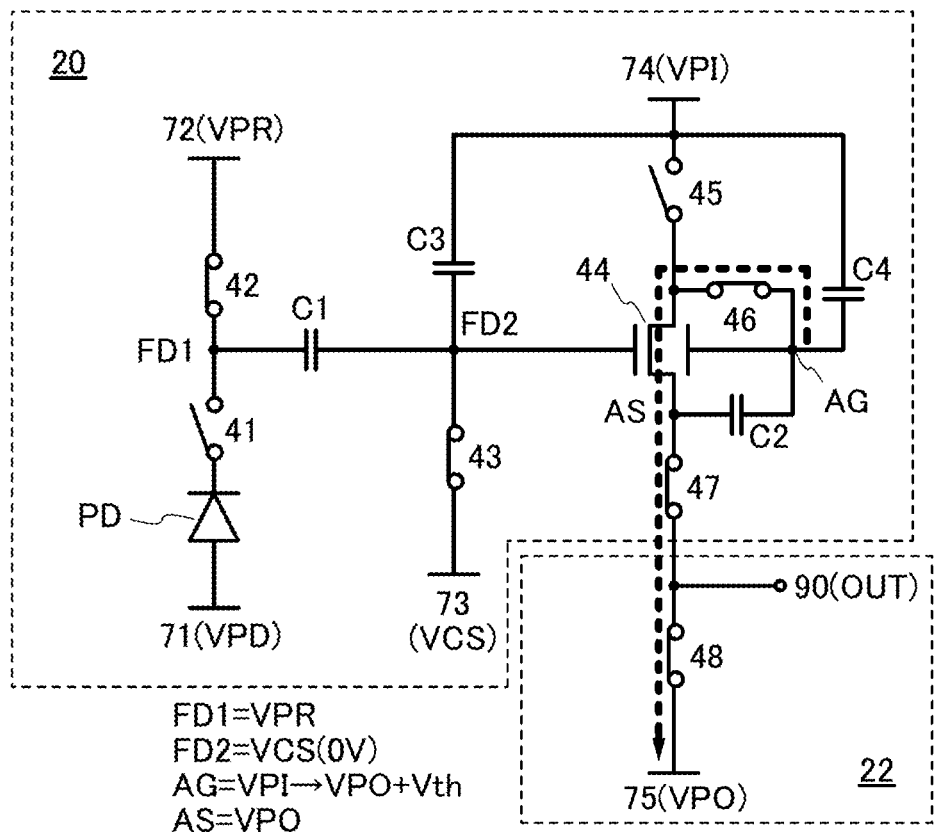
FIG. 6 illustrates operation of correcting variation in the threshold voltage.
Figure 7:
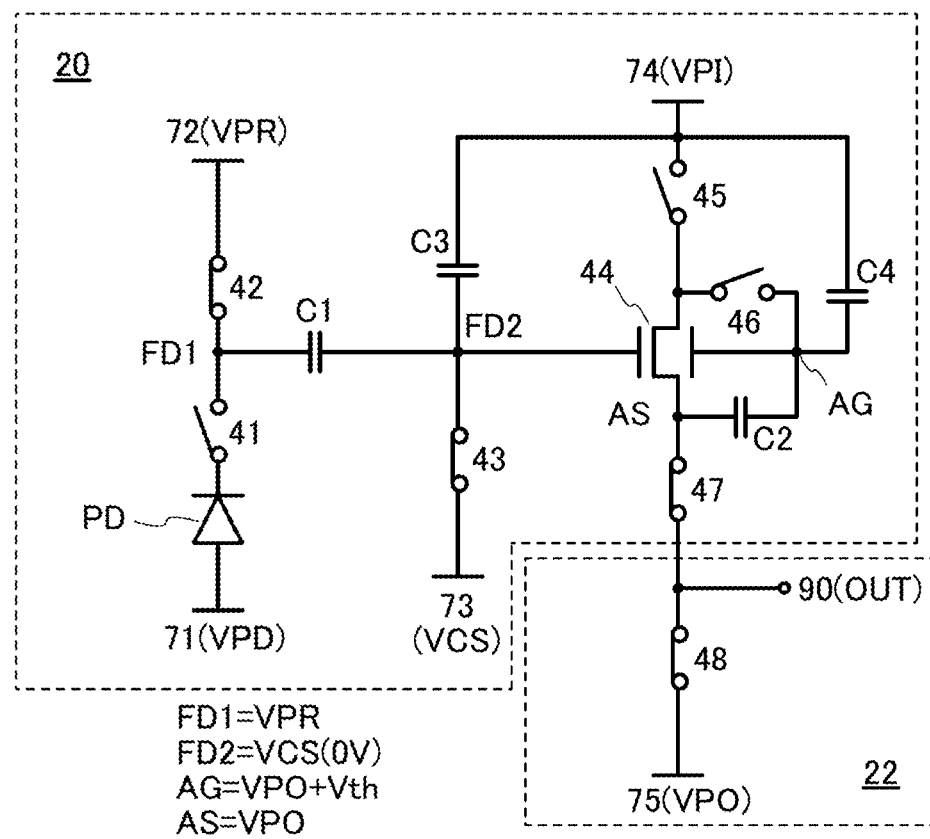
FIG. 7 illustrates operation of correcting variation in the threshold voltage.

In FIG. 5, FIG. 6, and FIG. 7, the transistors other than the transistor 44 are denoted by switch symbols in order to clarify the on/off states of the transistors. In addition, some reference numerals are omitted. Low power supply voltages are supplied to the wiring 71 (VPD), the wiring 73 (VCS), and the wiring 75 (VPO), and high power supply voltages are supplied to the wiring 72 (VPR) and the wiring 74 (VPI).

At time T1, the transistors 42, 43, 44, 45, 46, 47, and 48 are on and the transistor 41 is off. At this time, the potential of the node FD1 is a potential "VPR" of the wiring 72 (VPR). The potential of the node FD2 is a potential "VCS" of the wiring 73 (VCS). The potential of the node AG is a potential "VPI" of the wiring 74 (VPI). Accordingly, the potential of the second gate of the transistor 44 is "VPI", the transistor 44 is turned on, and bias current flows (see a current path indicated by a broken line). Note that "VCS" is typically preferably set to a GND potential or 0 V, but may be higher than the threshold voltage of the transistor 44 and correcting operation may be performed.

Next, at time T2, the transistor 45 is turned off to shut off a bias current path and to discharge the potential of the node AG (see FIG. 6). At this time, the potential of the node AG changes from "VPI" to a potential "VPO+Vth" that is a sum of the potential "VPO" of the wiring 75 (VPO) and the threshold voltage "Vth" of the transistor 44, and the discharge is terminated.

At time T3, the transistor 46 is turned off and the threshold voltage "Vth" of the transistor 44 is held in the node AG (see FIG. 7). Although the capacitor C2 functions as a storage capacitor for holding "Vth", it is preferable to provide the capacitor C4 to suppress the change in the potential of the node AG due to the change in the potential of the node AS. The capacitance value of the capacitor C4 is preferably larger than that of the capacitor C2.

At time T4, the transistor 45 is turned on and the transistors 42, 43, 47, and 48 are turned off in order to prepare for imaging operation.

By the above operation, a voltage for correcting variation in the threshold voltage on the first gate side of the transistor 44 is held in the second gate of the transistor 44, so that output variation of the transistors 44 in the imaging operation can be reduced.

Figure 8A:
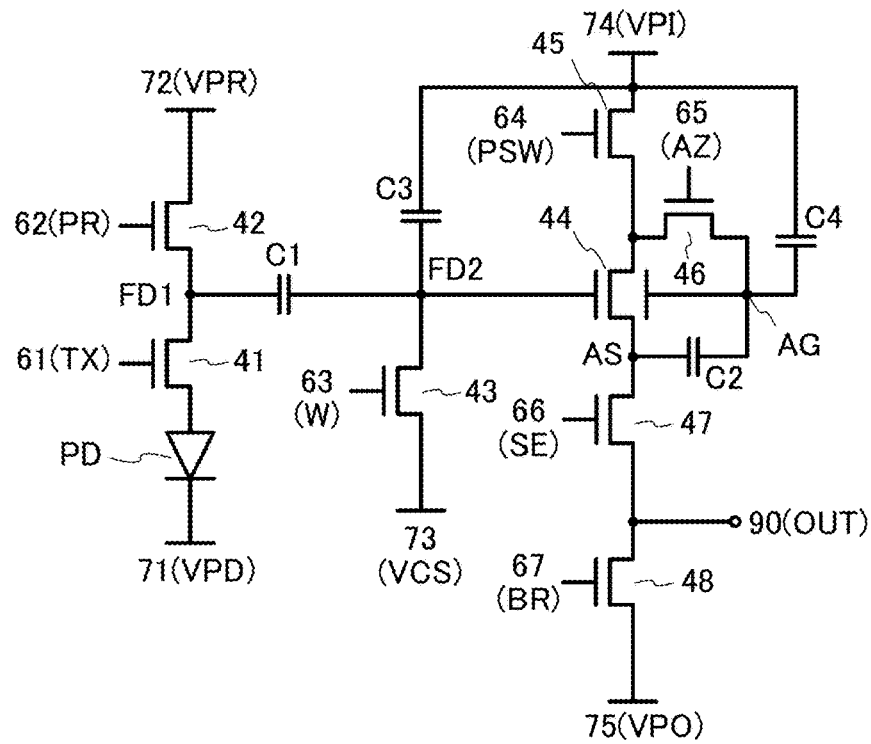
FIGS. 8A and 8B are circuit diagrams each illustrating a pixel.

The structure of the circuit 20 is not limited to the one illustrated in FIG. 1 and the circuit 20 may have a structure illustrated in FIG. 8A. The connection direction of the photoelectric conversion element PD in FIG. 8A is opposite to that in FIG. 1. In this case, the circuit 20 can operate when low power supply potentials are supplied to the wiring 72 (VPR) and the wiring 75 (VPO) and high power supply potentials are supplied to the wiring 71 (VPD), the wiring 73 (VCS), and the wiring 74 (VPI).

Figure 8B:
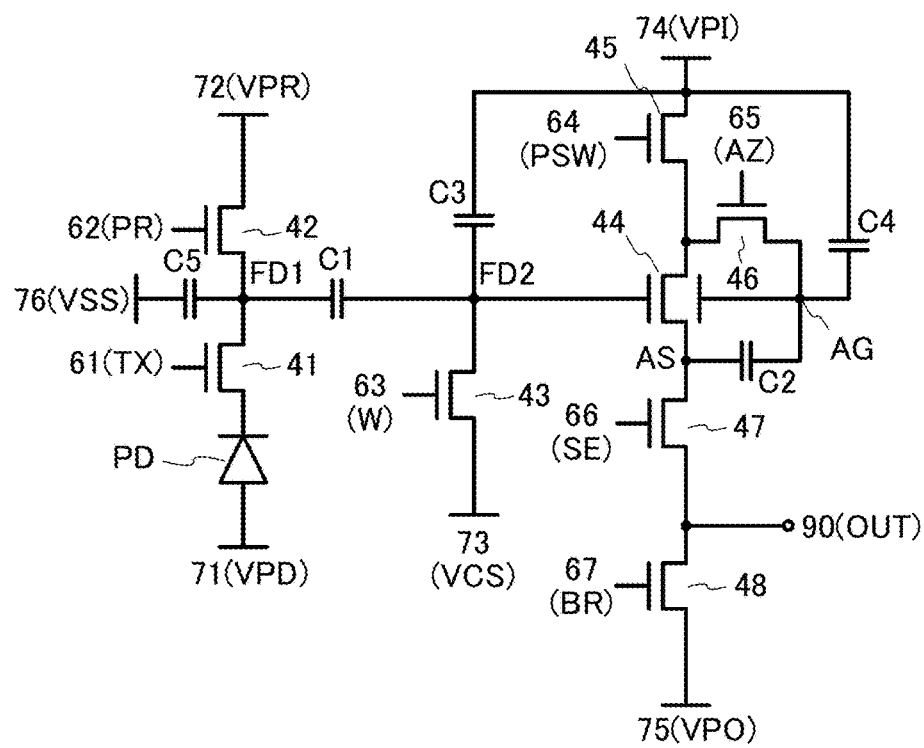

As illustrated in FIG. 8B, the circuit 20 may have a structure in which one terminal of a capacitor C5 is connected to the one terminal of the photoelectric conversion element PD. Although the other terminal of the capacitor C5 is electrically connected to a wiring 76 (VSS) for supplying a low power supply voltage in FIG. 8B, the other terminal of the capacitor C5 may be connected to another wiring for supplying a constant potential.

Figure 9A:
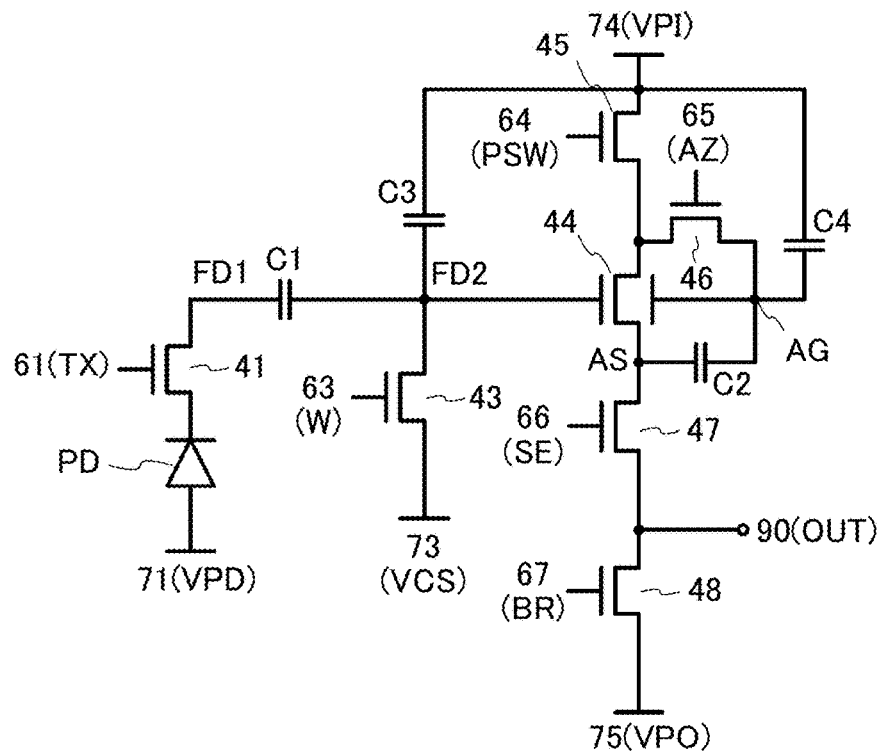
FIGS. 9A and 9B are circuit diagrams each illustrating a pixel.

As illustrated in FIG. 9A, the circuit 20 may have a structure in which the transistor 42 is not provided. In this structure, when the potential of the wiring 71 (VPD) is variable, the potential of the node FD1 can be reset by setting the wiring 71 (VPD) at a low potential.

Figure 9B:
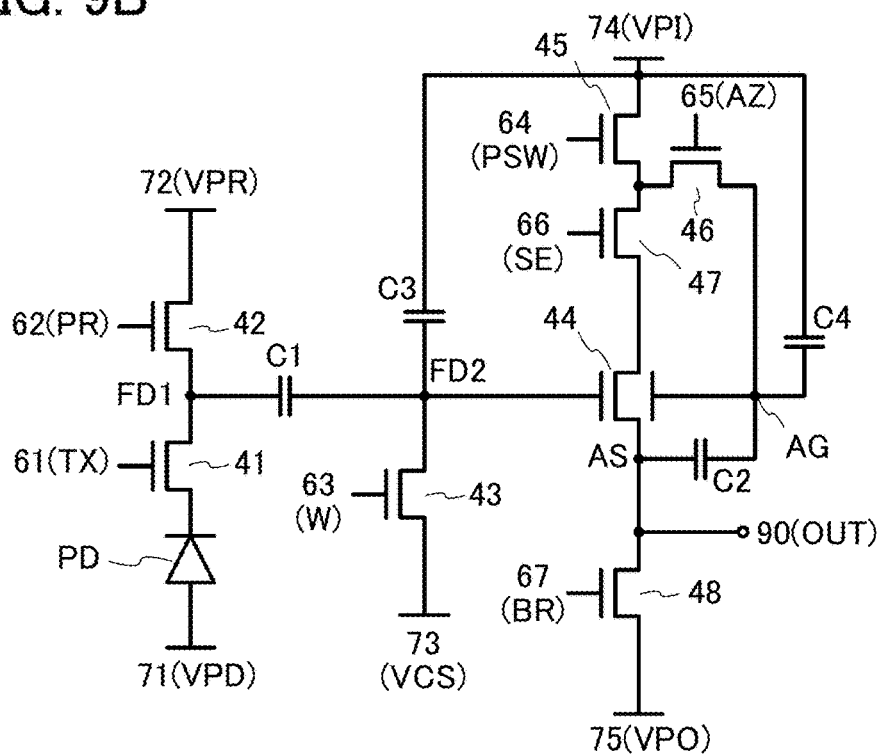

As illustrated in FIG. 9B, the transistor 47 may be provided between the transistors 44 and 45 in the circuit 20.

Figure 10A:
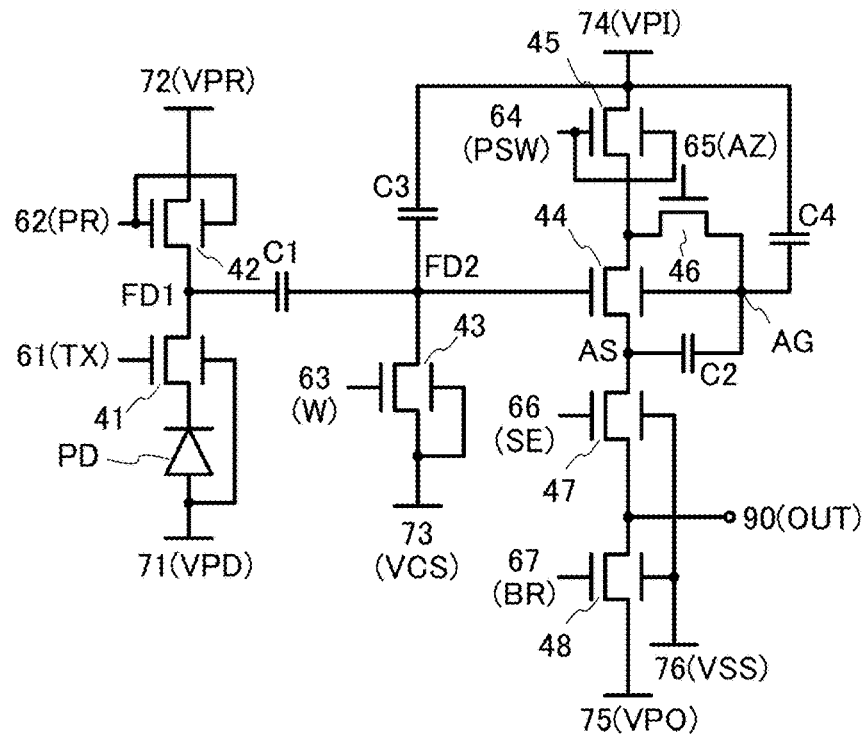
FIGS. 10A and 10B are circuit diagrams each illustrating a pixel.

The transistors 41 to 43 and 45 to 48 used in the circuits 20 and 22 may each include a back gate as illustrated in an example in FIG. 10A. The structure in which a constant potential is applied to the back gate enables control of the threshold voltage. The structure in which the same potential is applied to the front gate and the back gate enables an increase in on-state current and a decrease in off-state current. A mode of the back gate is preferably determined so that a transistor has desired electric characteristics. In other words, without limitation to the example in FIG. 10A, each transistor can have a structure in which a constant potential is applied to a back gate, a structure in which the same potential is applied to a front gate and a back gate, or a structure in which a back gate is not provided, as appropriate. Although each of the back gates of the transistors is connected to one of the wirings 71 (VPD), 73 (VCS), and 76 (VSS) for supplying low potentials in FIG. 10A, all the back gates may be connected to one of the wirings. Note that the structure in FIG. 10A can be combined with any of the structures in FIGS. 8A and 8B and FIGS. 9A and 9B as necessary.

Figure 10B:
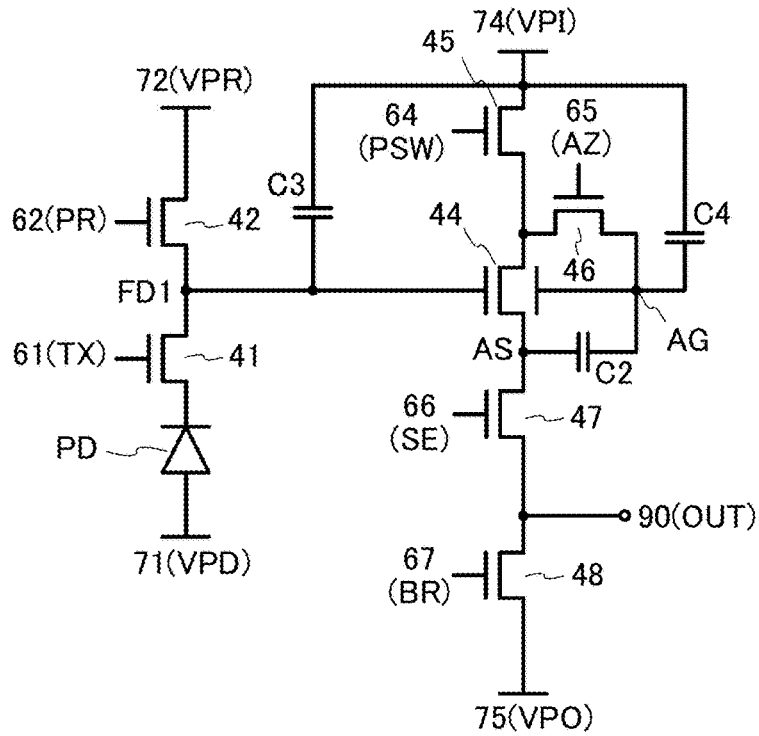

The structure in which variation in the threshold voltage of the transistors 44 is corrected, which is one embodiment of the present invention, can also be applied to a structure in FIG. 10B in which the transistor 43 and the capacitor C1 are omitted. The circuit 20 illustrated in FIG. 1 or the like has a difference detection function described later, and because of its operating method, it is difficult to remove noise of a video signal by a correlated double sampling (CDS) circuit or the like. Therefore, it is preferable to employ a structure of one embodiment of the present invention in which variation in the threshold voltage is corrected. In contrast, the circuit 20 illustrated in FIG. 10B does not have a difference detection function and noise of a video signal may be removed by a CDS circuit or the like. The transistor 43 may be additionally provided in the structure in FIG. 10B. Note that the structure in FIG. 10B can be combined with any of the structures in FIGS. 8A and 8B and FIGS. 9A and 9B as necessary.

Figure 11:
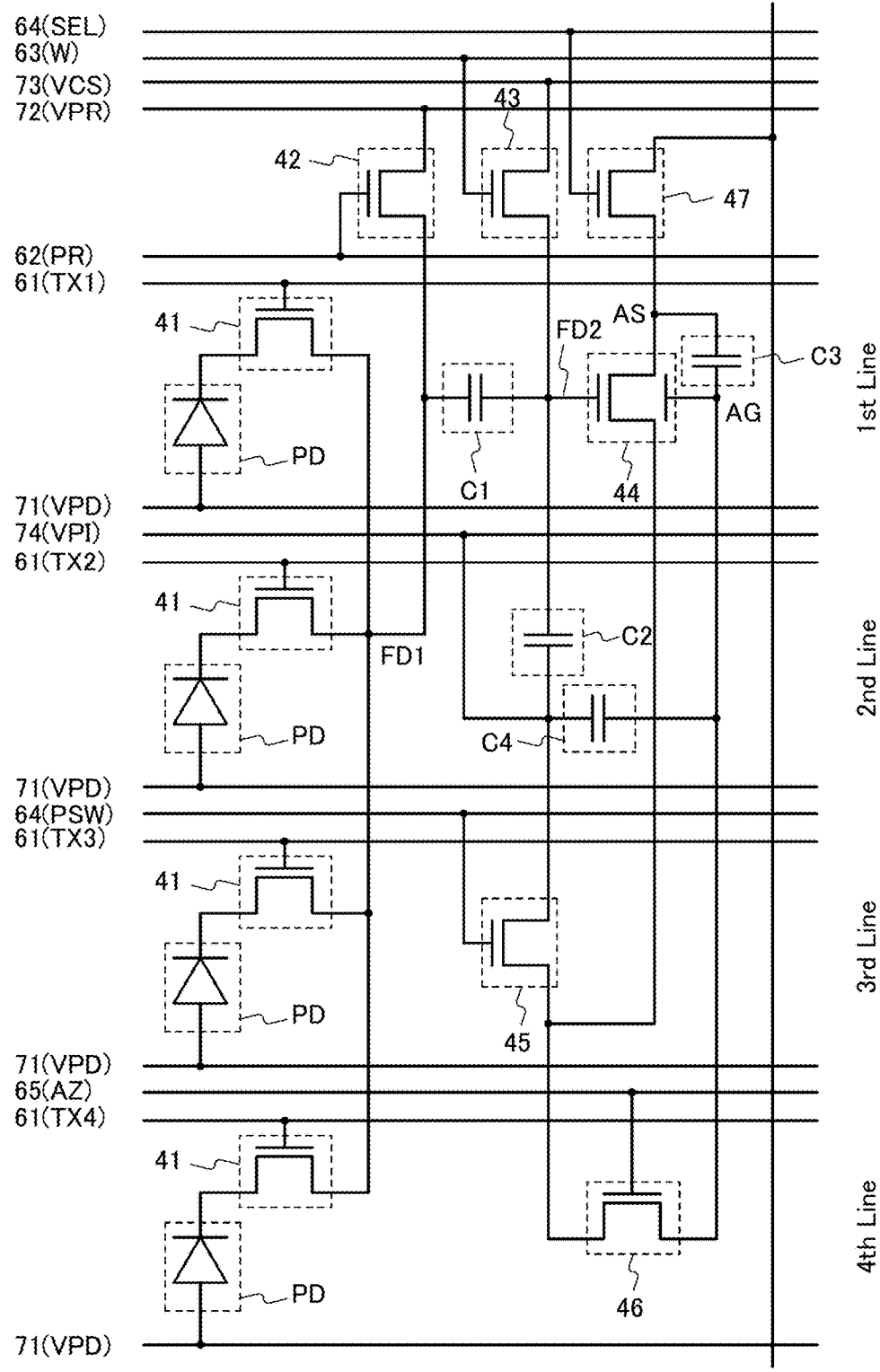
FIG. 11 is a circuit diagram illustrating pixels.

As illustrated in FIG. 11, the transistors 42 to 47 are shared among a plurality of pixels (circuits 20). FIG. 11 illustrates a structure in which the transistors 42 to 47 are shared among a plurality of pixels in the perpendicular direction; however, the transistors 42 to 47 may be shared among a plurality of pixels in the horizontal direction or in the horizontal and perpendicular directions. With such a structure, the number of transistors included in one pixel can be reduced.

Although FIG. 11 illustrates a structure in which the transistors 42 to 47 are shared among four pixels, the transistors 42 to 47 may be shared among two pixels, three pixels, or five or more pixels. Note that this structure can be optionally combined with any of the structures in FIGS. 8A and 8B, FIGS. 9A and 9B, and FIGS. 10A and 10B.

Figure 12A:
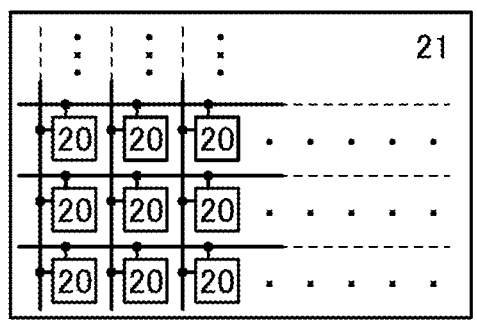
FIGS. 12A to 12C illustrate a structure of an imaging device.
Figure 12B:
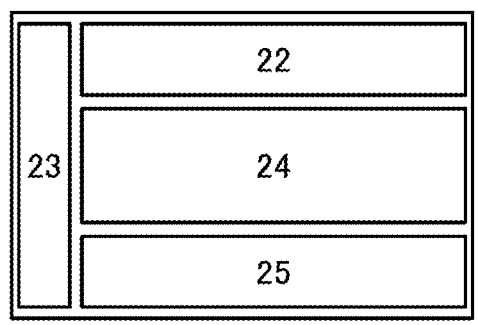
Figure 12C:
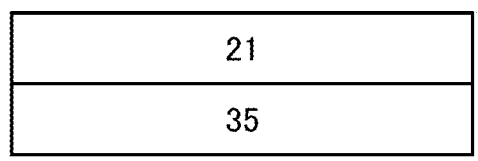

Furthermore, an imaging device of one embodiment of the present invention can have a stacked-layer structure including the pixel array 21 and a substrate 35 provided with the circuits 22 to 25. For example, it is possible to employ a stacked-layer structure as illustrated in a front view in FIG. 12C, which includes the pixel array 21 having a top view in FIG. 12A and the substrate 35 having a top view in FIG. 12B. With such a structure, transistors suitable for respective elements can be used, and the area of the imaging device can be small. A layout of the circuits in FIG. 12B is an example and another layout may be employed.

To achieve both high-speed operation and the structure of a CMOS circuit, the circuits 23 to 25 are preferably formed using transistors including silicon (hereinafter referred to as Si transistors). For example, a silicon substrate is used as the substrate 35, over which the above circuits are formed. The pixel array is preferably formed using transistors including an oxide semiconductor (hereinafter referred to as OS transistors). Note that some of the transistors included in the circuits 23 to 25 may be provided on the same surface as the pixel array 21. Although an example in which the circuit 22 is provided for the substrate 35 is illustrated in FIG. 12B, the circuit 22 may be formed using OS transistors. Although not illustrated, the circuits 26a to 26f and the like illustrated in FIGS. 3B and 3C may be provided for the substrate 35.

Figure 13:
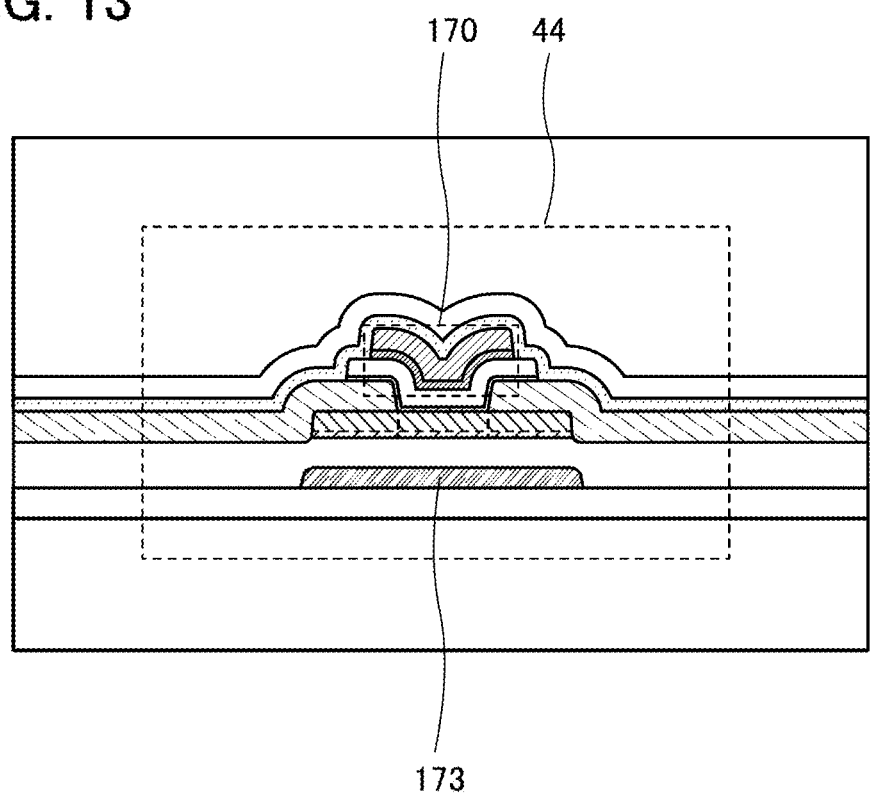
FIG. 13 is a cross-sectional view illustrating a transistor.

Specific structure examples of the imaging device of one embodiment of the present invention are described below with reference to drawings. FIG. 13 is a cross-sectional view of the transistor 44. A conductive layer 170 corresponds to the front gate and a conductive layer 173 corresponds to the back gate. The detail of the structure of the transistor will be described later; an insulating layer having a function of a gate insulating film on the front gate side, an oxide semiconductor layer, and an insulating layer having a function of a gate insulating film on the back gate side are provided between the conductive layer 170 and the conductive layer 173. Note that the structure of the transistor illustrated in FIG. 13 is merely an example, and another structure of a transistor to be described later can be employed.

Figure 14A:
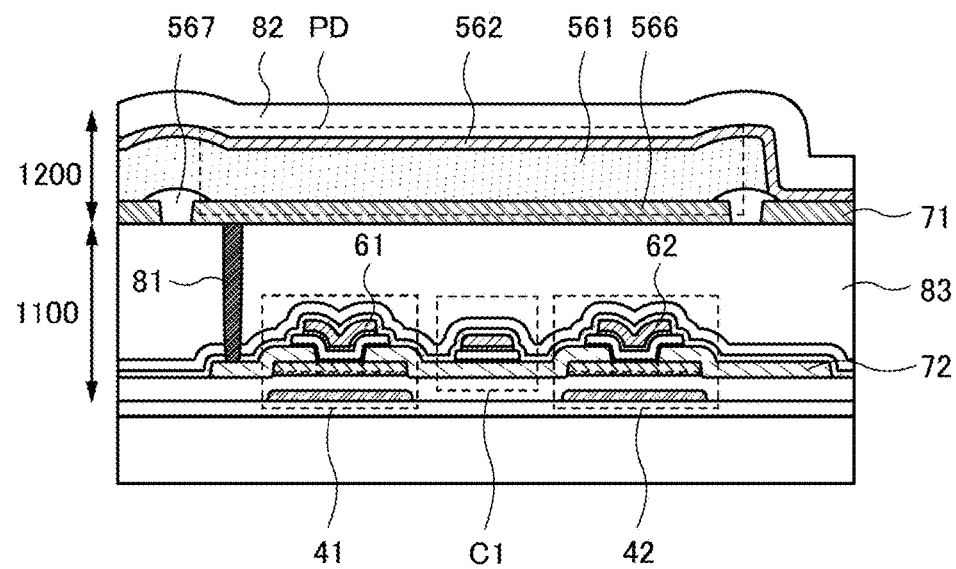
FIGS. 14A to 14C are cross-sectional views each illustrating a structure of an imaging device.

FIG. 14A illustrates an example of a specific connection between the photoelectric conversion element PD, the transistor 41, the transistor 42, and the capacitor C1 which are included in the circuit 20 in FIG. 1. Note that the transistors 43 to 47 are not illustrated in FIG. 14A. The circuit 20 includes a layer 1100 including the transistors 41 to 47 and the capacitors C1 to C4 and a layer 1200 including the photoelectric conversion element PD.

Although the wirings, the electrodes, and a contact plug (conductor 81) are illustrated as independent components in cross-sectional views in this embodiment, some of them are provided as one component in some cases when they are electrically connected to each other. A structure in which a wiring and an electrode are connected to each other through the conductor 81 is merely an example and an electrode and a wiring are directly connected to each other in some cases.

In addition, insulating layers 82 and 83 and the like that function as protective films, interlayer insulating films, or planarization films are provided over the components. For example, an inorganic insulating film such as a silicon oxide film or a silicon oxynitride film can be used as each of the insulating layers 82 and 83 and the like. Alternatively, an organic insulating film such as an acrylic resin film or a polyimide resin film may be used. Top surfaces of the insulating layers 82 and 83 and the like are preferably planarized by chemical mechanical polishing (CMP) or the like as necessary.

In some cases, one or more of the wirings and the like illustrated in the drawing are not provided, or a wiring, a transistor, or the like that is not illustrated in the drawing is included in each layer. In some cases, a layer that is not illustrated in the drawing is included in the stacked-layer structure. Furthermore, one or more of the layers illustrated in the drawing are not included in some cases.

It is preferable that OS transistors with a low off-state current be used for the transistors 41 to 47 which are components of the circuit 20. Extremely low off-state current characteristics of the OS transistor can widen the dynamic range of imaging. In the circuit structure of the circuit 20 illustrated in FIG. 1, an increase in the intensity of light entering the photoelectric conversion element PD reduces the potentials of the node FD1 and the node FD2. Since the transistor using an oxide semiconductor has an extremely low off-state current, a current corresponding to the gate potential can be accurately output even when the gate potential is extremely low. Thus, it is possible to widen the detection range of illuminance, i.e., the dynamic range.

A period during which charge can be held in the node FD1 or the node FD2 can be extremely long owing to the low off-state current characteristics of the transistors 41, 42, and 43. Therefore, a global shutter system in which charge accumulation operation is performed in all the pixels at the same time can be used without a complicated circuit structure and operation method. Note that the imaging device of one embodiment of the present invention can also be operated in a rolling shutter system.

The operation method of an imaging device is described with reference to FIGS. 15A and 15B. Note that in FIGS. 15A and 15B, "E" represents an exposure period and "R" represents a reading period. Furthermore, n represents an n-th frame (n is a given natural number of two or more). Moreover, n−1 represents a frame previous to the n-th frame, and n+1 represents a frame following the n-th frame. Line[1] represents a first row of the pixel array 21, and Line[M] represents an M-th row of the pixel array 21 (M is a natural number of four or more in FIGS. 15A and 15B).

Figure 15A:
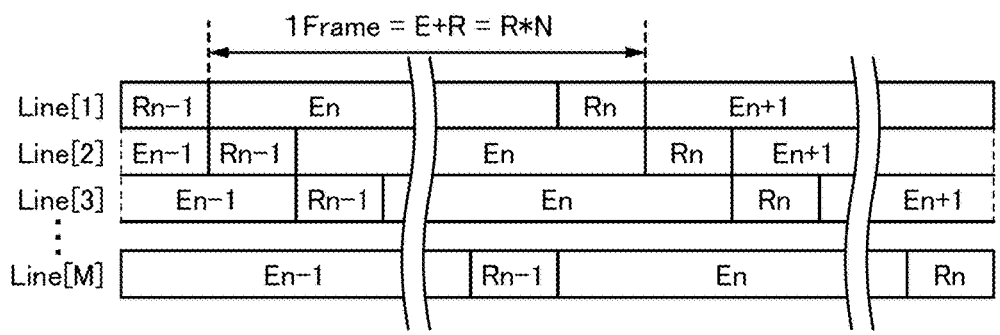
FIGS. 15A and 15B each illustrate operation of an imaging device.

FIG. 15A is a schematic view illustrating the operation method of a rolling shutter system. In the rolling shutter system, exposure and data reading are performed row by row. Since imaging cannot be simultaneously performed on all pixels, distortion is caused to an image when a moving object is imaged.

Figure 15B:
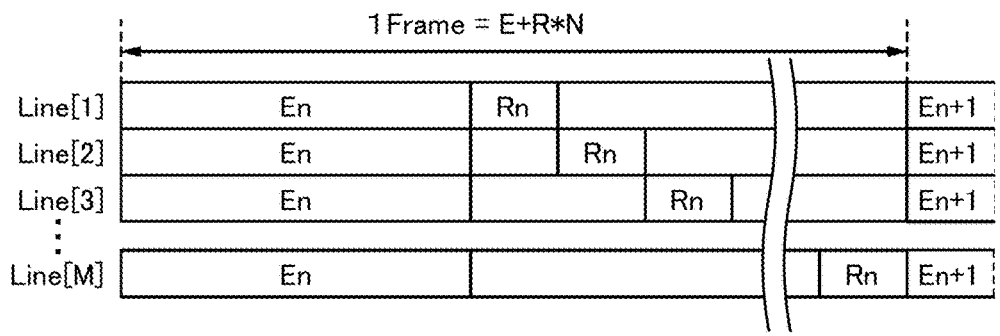

FIG. 15B is a schematic view illustrating the operation method of a global shutter system. In the global shutter system, exposure is simultaneously performed on all pixels, and then data reading is performed row by row. Thus, an image without distortion can be obtained even when a moving object is imaged.

The OS transistor has lower temperature dependence of change in electrical characteristics than a transistor including silicon in an active region or an active layer, and thus can be used in an extremely wide range of temperatures. Therefore, an imaging device and a semiconductor device that include OS transistors are suitable for use in automobiles, aircrafts, spacecrafts, and the like.

Figure 14B:
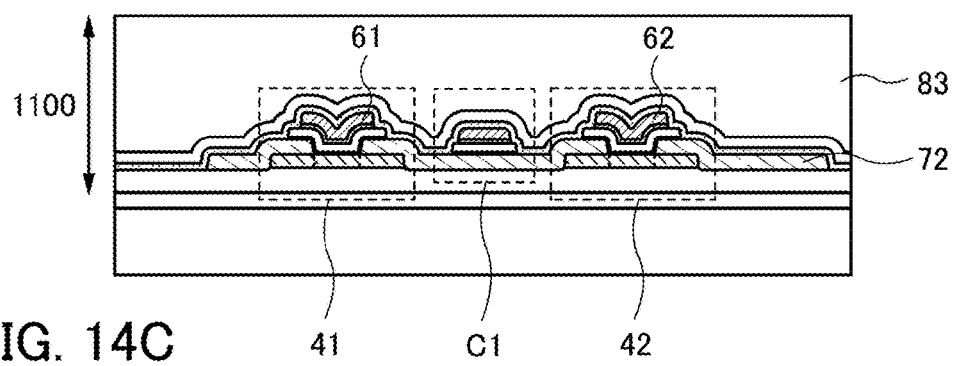
Figure 14C:
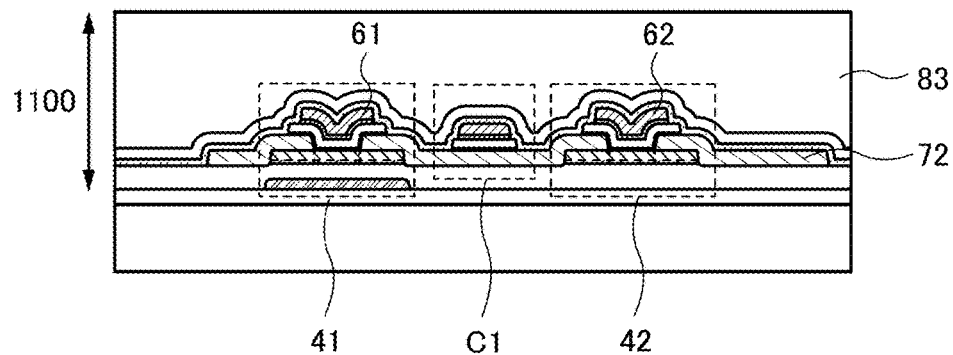

Note that although each transistor includes a back gate in FIG. 14A, each transistor does not necessarily include a back gate as illustrated in FIG. 14B. Alternatively, as illustrated in FIG. 14C, some of the transistors, for example, only the transistor 41 may include a back gate. The back gate might be electrically connected to a front gate of the transistor, which is provided to face the back gate. Alternatively, different fixed potentials might be supplied to the back gate and the front gate. Note that these descriptions on the presence or absence of the back gate can also be applied to other structures of a pixel described in this embodiment.

A variety of elements can be used as the photoelectric conversion element PD provided in the layer 1200. FIG. 14A illustrates the photoelectric conversion element PD including a selenium-based material for a photoelectric conversion layer 561. The photoelectric conversion element PD including a selenium-based material has high external quantum efficiency with respect to visible light. Furthermore, the selenium-based material has a high light-absorption coefficient, making the photoelectric conversion layer 561 thin easily. The photoelectric conversion element PD including a selenium-based material can be a highly sensitive sensor in which the amount of amplification of electrons with respect to the amount of incident light is large because of an avalanche multiplication. In other words, the use of a selenium-based material for the photoelectric conversion layer 561 allows a sufficient amount of photocurrent to be obtained even when the pixel area is reduced. Thus, the photoelectric conversion element PD including a selenium-based material is also suitable for imaging in a low-illuminance environment.

Amorphous selenium or crystalline selenium can be used as the selenium-based material. Crystalline selenium can be obtained by, for example, depositing amorphous selenium and then performing heat treatment. When the crystal grain size of crystalline selenium is smaller than a pixel pitch, variation in characteristics between pixels can be reduced. Moreover, crystalline selenium has higher spectral sensitivity to visible light and a higher absorption coefficient for visible light than amorphous selenium.

Figure 16A:
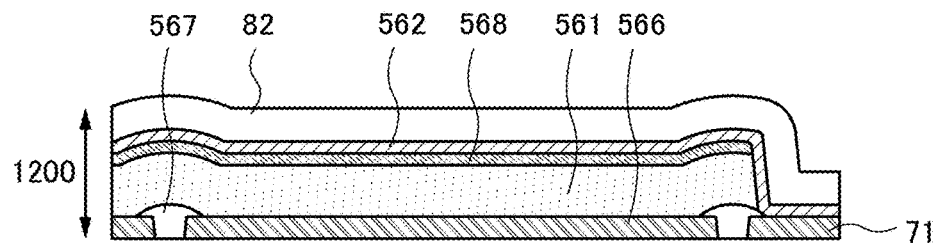
FIGS. 16A to 16C are cross-sectional views each illustrating a structure of a photoelectric conversion element.
Figure 16B:
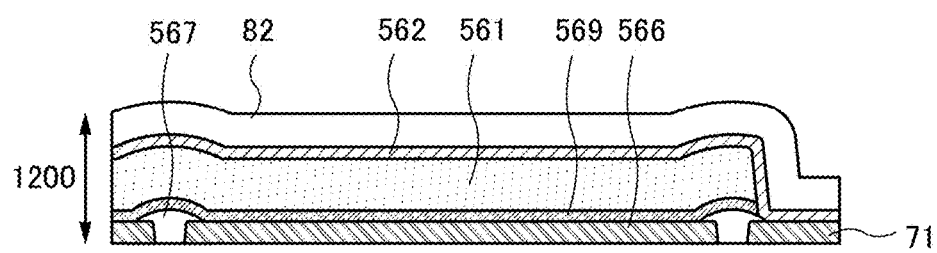
Figure 16C:
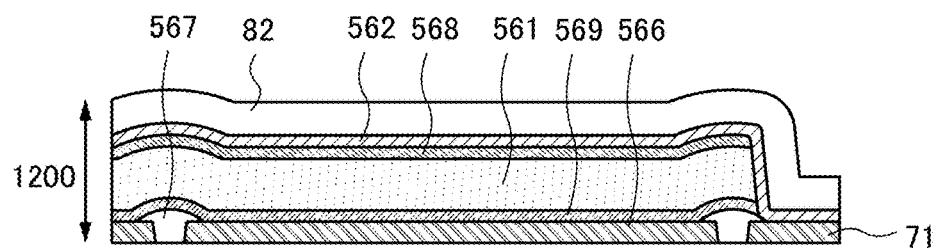

Although the photoelectric conversion layer 561 is a single layer in FIG. 14A, a layer of gallium oxide, cerium oxide, an In—Ga—Zn oxide, or the like may be provided as a hole injection blocking layer 568 on a light-receiving surface side as illustrated in FIG. 16A. Alternatively, as illustrated in FIG. 16B, a layer of nickel oxide, antimony sulfide, or the like may be provided as an electron injection blocking layer 569 on an electrode 566 side. Further alternatively, as illustrated in FIG. 16C, the hole injection blocking layer 568 and the electron injection blocking layer 569 may be provided. Note that as illustrated in FIG. 1 and FIG. 8A, structures that differ from each other in the direction of connection of the photoelectric conversion element PD can be used. Thus, the hole injection blocking layer 568 and the electron injection blocking layer 569 in FIGS. 16A to 16C may be replaced with each other.

The photoelectric conversion layer 561 may be a layer including a compound of copper, indium, and selenium (CIS). Alternatively, a layer including a compound of copper, indium, gallium, and selenium (CIGS) may be used. A photoelectric conversion element including the CIS layer or the CIGS layer can also utilize avalanche multiplication like the photoelectric conversion element including a layer of selenium alone.

In the photoelectric conversion element PD using the selenium-based material, for example, the photoelectric conversion layer 561 can be provided between a light-transmitting conductive layer 562 and the electrode 566 formed using a metal material or the like. Furthermore, CIS and CIGS are p-type semiconductors, and an n-type semiconductor such as cadmium sulfide or zinc sulfide may be provided in contact with the p-type semiconductor in order to form a junction.

It is preferable to apply a relatively high voltage (e.g., 10 V or higher) to the photoelectric conversion element in order to utilize the avalanche multiplication. Since the OS transistor has higher drain breakdown voltage than the Si transistor, the application of a relatively high voltage to the photoelectric conversion element is easy. Thus, by combination of the OS transistor having high drain breakdown voltage and the photoelectric conversion element including the selenium-based material in the photoelectric conversion layer, a highly sensitive and highly reliable imaging device can be obtained.

Figure 17A:
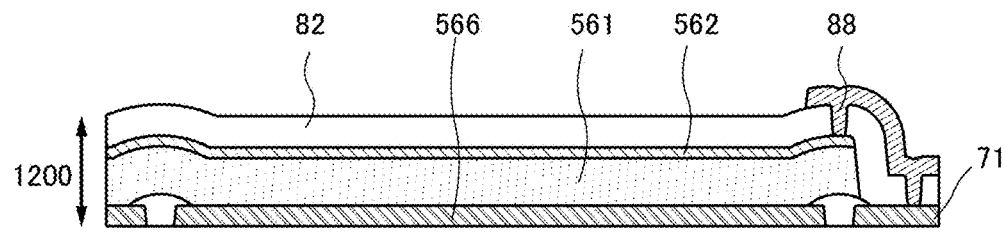
FIGS. 17A to 17D are cross-sectional views each illustrating connection of a photoelectric conversion element.
Figure 17B:
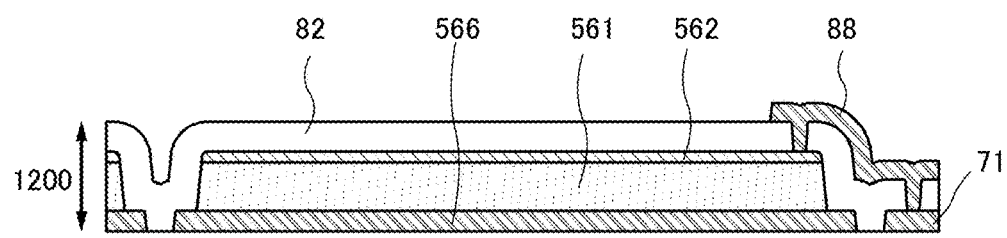
Figure 17C:
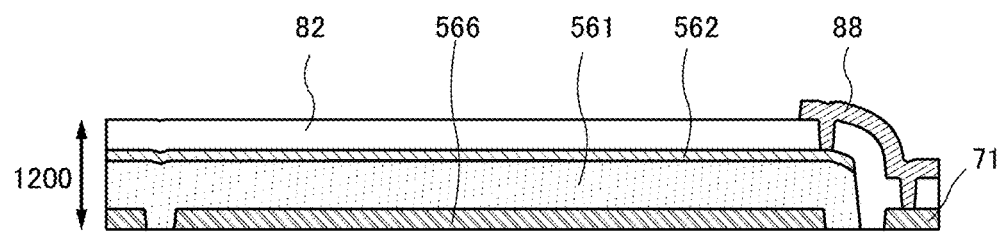
Figure 17D:
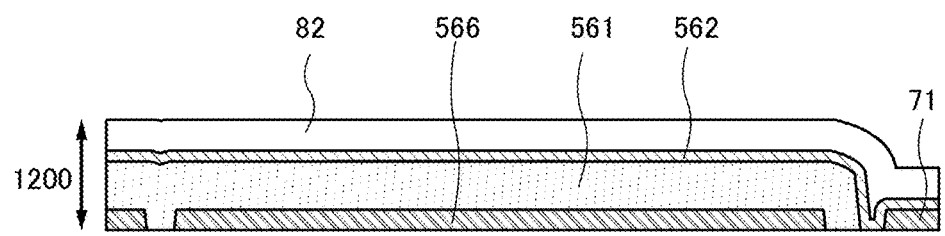

Although the light-transmitting conductive layer 562 is directly in contact with the wiring 71 in FIG. 14A, the light-transmitting conductive layer 562 may be electrically connected to the wiring 71 through a wiring 88 as illustrated in FIG. 17A. Although the photoelectric conversion layer 561 and the light-transmitting conductive layer 562 are not divided between pixel circuits in FIG. 14A, they may be divided between circuits as illustrated in FIG. 17B. In a region between pixels where the electrode 566 is not provided, a partition wall 567 formed of an insulator is preferably provided, thereby preventing generation of a crack in the photoelectric conversion layer 561 and the light-transmitting conductive layer 562. However, the partition wall 567 is not necessarily provided as illustrated in FIGS. 17C and 17D.

Figure 18A:
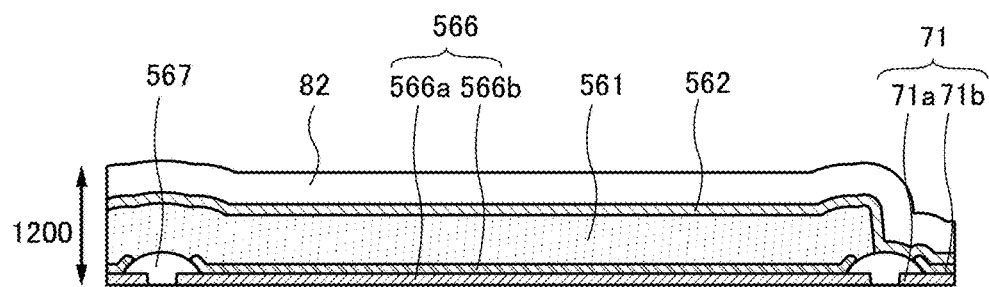
FIGS. 18A and 18B are cross-sectional views each illustrating connection of a photoelectric conversion element.

The electrode 566, the wiring 71, and the like may each be a multilayer. For example, as illustrated in FIG. 18A, the electrode 566 can include two conductive layers 566a and 566b and the wiring 71 can include two conductive layers 71a and 71b. In the structure in FIG. 18A, for example, the conductive layers 566a and 71a may be made of a low-resistance metal or the like, and the conductive layers 566b and 71b may be made of a metal or the like that exhibits an excellent contact property with the photoelectric conversion layer 561. Such a structure improves the electrical properties of the photoelectric conversion element PD. Furthermore, even when the conductive layer 71a contains a metal that causes electrolytic corrosion by being in contact with the light-transmitting conductive layer 562, the electrolytic corrosion can be prevented because the conductive layer 71b is between the conductive layer 71a and the light-transmitting conductive layer 562.

The conductive layers 566b and 71b can be formed using, for example, molybdenum, tungsten, or the like. The conductive layers 566a and 71a can be formed using, for example, aluminum, titanium, or a stack of titanium, aluminum, and titanium that are layered in that order.

Figure 18B:
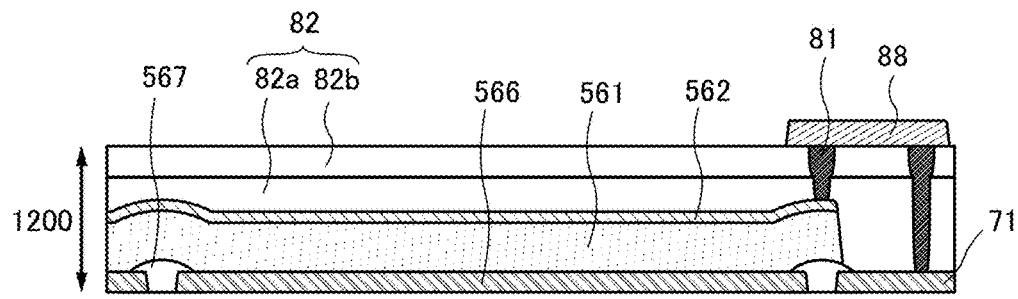

As illustrated in FIG. 18B, the light-transmitting conductive layer 562 may be connected to the wiring 71 through the conductor 81 and the wiring 88. The insulating layer 82 and the like may each be a multilayer. For example, as illustrated in FIG. 18B, the conductor 81 has a difference in level in the case where the insulating layer 82 includes insulating layers 82a and 82b that have different etching rates. In the case where another insulating layer used as an interlayer insulating film or a planarization film is a multilayer, the conductor 81 also has a difference in level. Although the insulating layer 82 is formed using two layers here, the insulating layer 82 and another insulating layer may each be formed using three or more layers.

The partition wall 567 can be formed using an inorganic insulator, an insulating organic resin, or the like. The partition wall 567 may be colored black or the like in order to shield the transistors and the like from light and/or to determine the area of a light-receiving portion in each pixel.

Alternatively, a pin diode element formed using an amorphous silicon film, a microcrystalline silicon film, or the like may be used as the photoelectric conversion element PD.

Figure 19:
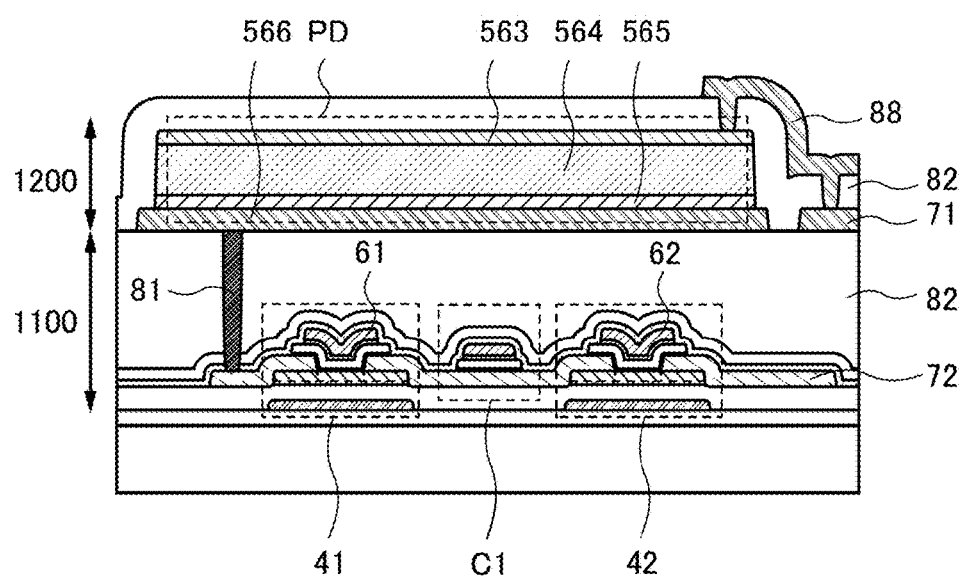
FIG. 19 is a cross-sectional view illustrating an imaging device.

FIG. 19 illustrates an example in which a thin film pin photodiode is used as the photoelectric conversion element PD. In the photodiode, an n-type semiconductor layer 565, an i-type semiconductor layer 564, and a p-type semiconductor layer 563 are stacked in that order. The i-type semiconductor layer 564 is preferably formed using amorphous silicon. The p-type semiconductor layer 563 and the n-type semiconductor layer 565 can each be formed using amorphous silicon, microcrystalline silicon, or the like that includes a dopant imparting the corresponding conductivity type. A photodiode in which a photoelectric conversion layer is formed using amorphous silicon has high sensitivity in a visible light wavelength region, and therefore can easily sense weak visible light.

In the photoelectric conversion element PD in FIG. 19, the n-type semiconductor layer 565 functioning as a cathode is in contact with the electrode 566 that is electrically connected to the transistor 41. Furthermore, the p-type semiconductor layer 563 functioning as an anode is electrically connected to the wiring 71 through the wiring 88.

Note that in accordance with a circuit structure, the anode and the cathode of the photoelectric conversion element PD may be connected to the electrode layer and the wiring in a manner opposite to that in FIG. 19.

In any case, the photoelectric conversion element PD is preferably formed so that the p-type semiconductor layer 563 serves as a light-receiving surface. When the p-type semiconductor layer 563 serves as a light-receiving surface, the output current of the photoelectric conversion element PD can be increased.

Figure 20A:
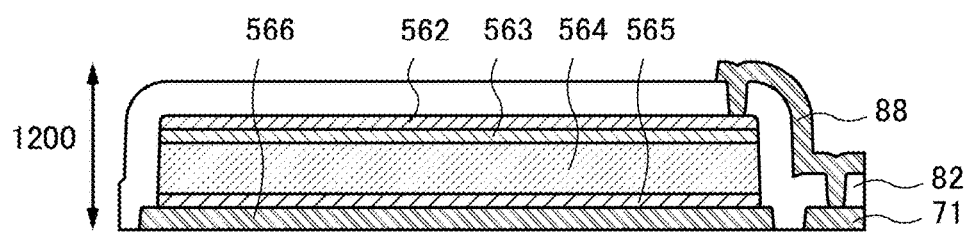
FIGS. 20A to 20C are cross-sectional views each illustrating connection of a photoelectric conversion element.
Figure 20B:
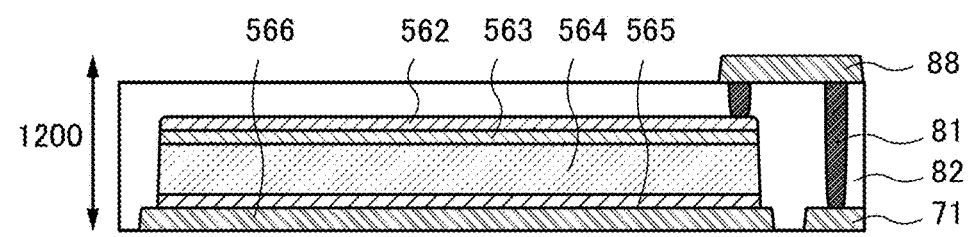
Figure 20C:
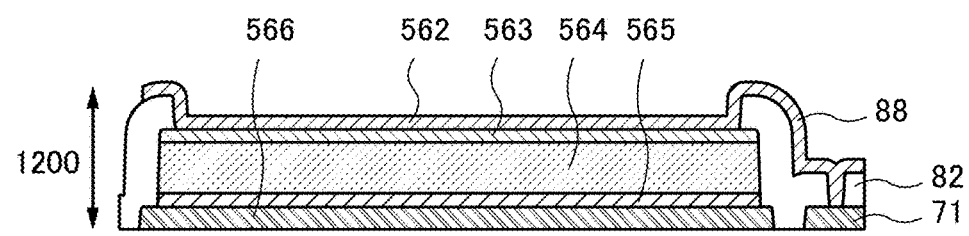

FIGS. 20A, 20B, and 20C show other examples of the structure of the photoelectric conversion element PD having a configuration of a pin thin film photodiode and the connection between the photoelectric conversion element PD and the wirings. Note that the structure of the photoelectric conversion element PD and the connection between the photoelectric conversion element PD and the wirings are not limited thereto, and other configurations may be applied.

FIG. 20A illustrates a structure of the photoelectric conversion element PD that includes the light-transmitting conductive layer 562 in contact with the p-type semiconductor layer 563. The light-transmitting conductive layer 562 serves as an electrode and can increase the output current of the photoelectric conversion element PD.

For the light-transmitting conductive layer 562, the following can be used: indium tin oxide; indium tin oxide containing silicon; indium oxide containing zinc; zinc oxide; zinc oxide containing gallium; zinc oxide containing aluminum; tin oxide; tin oxide containing fluorine; tin oxide containing antimony; graphene; graphene oxide; or the like. The light-transmitting conductive layer 562 is not limited to a single layer, and may be a stacked layer of different films.

In the structure of FIG. 20B, the light-transmitting conductive layer 562 and the wiring 71 are connected to each other through the conductor 81 and the wiring 88. Note that the p-type semiconductor layer 563 of the photoelectric conversion element PD and the wiring 71 may be connected to each other through the conductor 81 and the wiring 88. In the structure of FIG. 20B, the light-transmitting conductive layer 562 is not necessarily provided.

FIG. 20C illustrates a structure in which an opening exposing the p-type semiconductor layer 563 is provided in an insulating layer covering the photoelectric conversion element PD, and the light-transmitting conductive layer 562 that covers the opening is electrically connected to the wiring 88.

Figure 21:
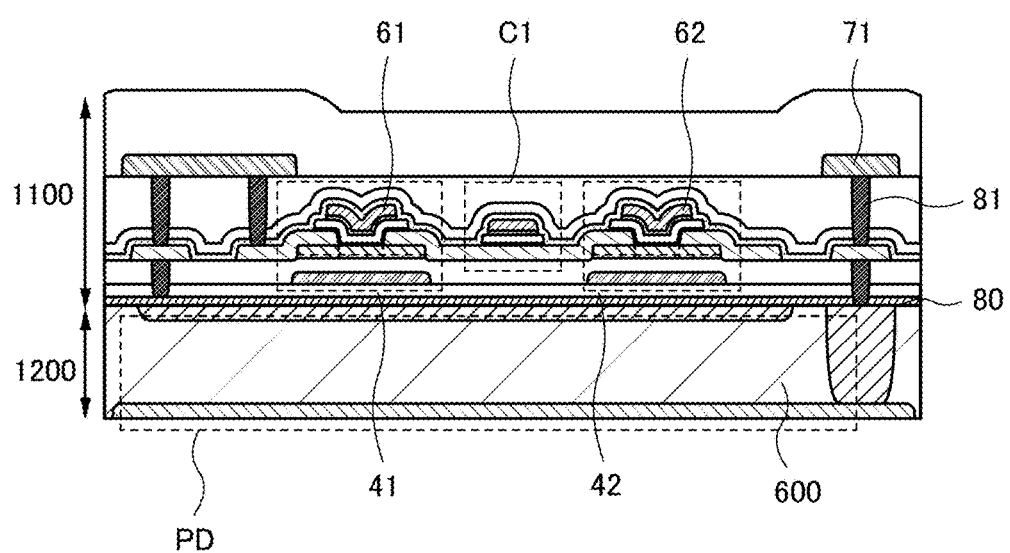
FIG. 21 is a cross-sectional view illustrating an imaging device.

Alternatively, as illustrated in FIG. 21, the photoelectric conversion element PD may be a photodiode including a silicon substrate 600 as a photoelectric conversion layer.

The photoelectric conversion element PD including the aforementioned selenium-based material, amorphous silicon, or the like can be formed through general semiconductor manufacturing processes such as a deposition process, a lithography process, and an etching process. In addition, because the resistance of the selenium-based material is high, the photoelectric conversion layer 561 does not need to be divided between circuits as illustrated in FIG. 14A. Therefore, the imaging device of one embodiment of the present invention can be manufactured with a high yield at low cost. In contrast, a photodiode including the silicon substrate 600 as the photoelectric conversion layer requires difficult processes such as a polishing process and a bonding process.

Figure 22A:
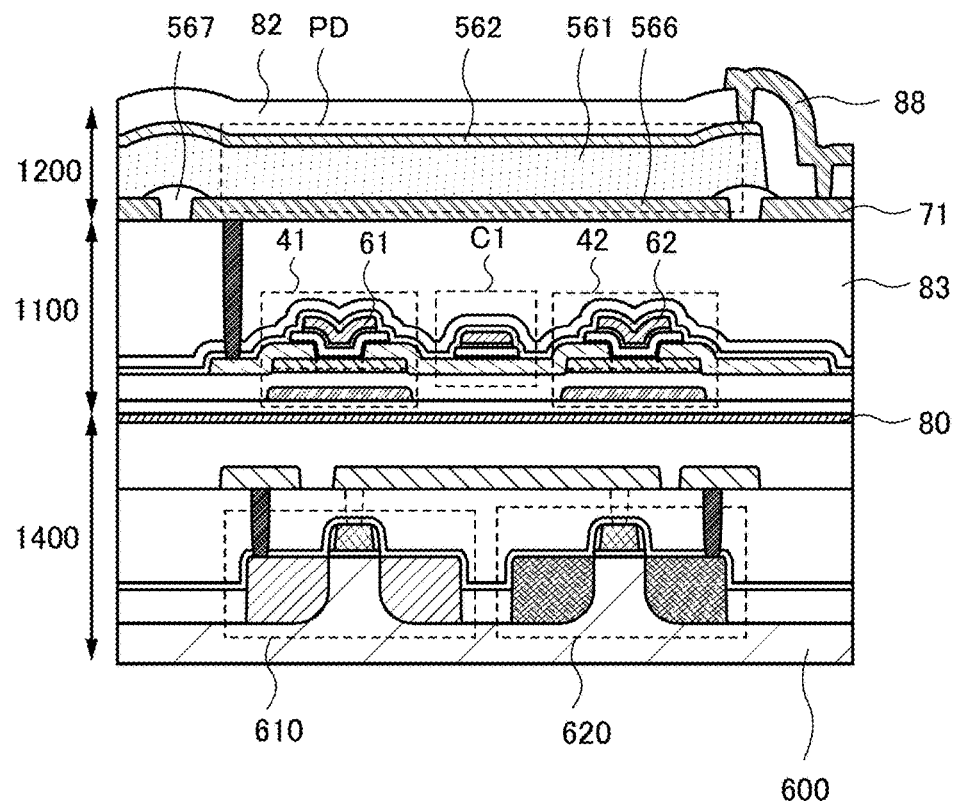
FIGS. 22A and 22B are cross-sectional views illustrating an imaging device.
Figure 22B:
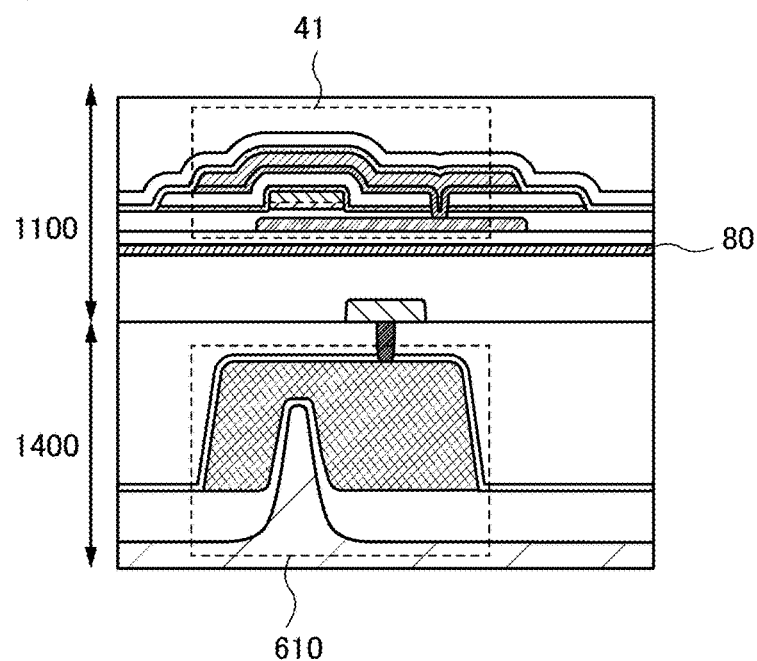

Furthermore, in the imaging device of one embodiment of the present invention, a stack including the silicon substrate 600 in which a circuit is formed may be used. For example, as illustrated in FIG. 22A, the pixel circuit may overlap with a layer 1400 that includes transistors 610 and 620 whose active regions are formed in the silicon substrate 600. FIG. 22B is a cross-sectional view illustrating the transistors in the channel width direction.

Figure 23A:
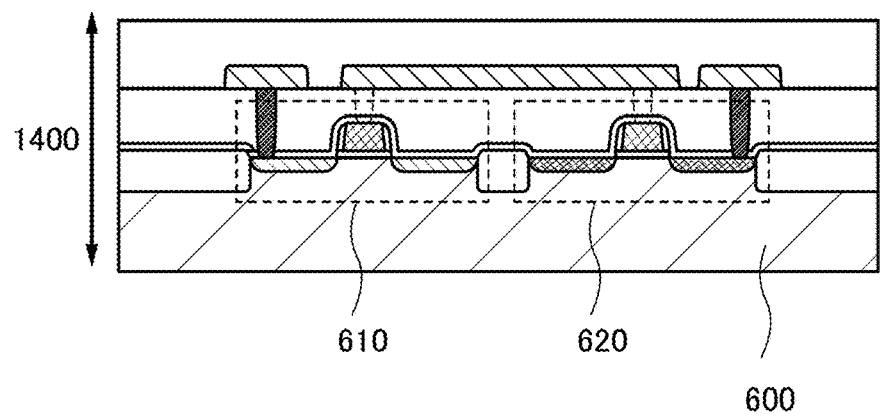
FIGS. 23A to 23C are cross-sectional views and a circuit diagram illustrating imaging devices.
Figure 23B:
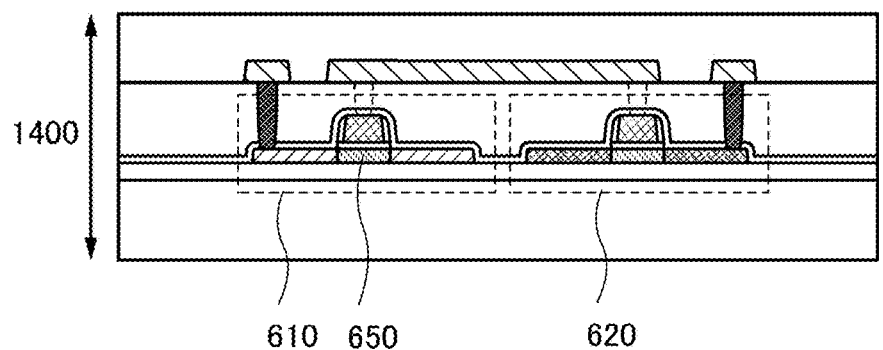

Although FIGS. 22A and 22B show the Si transistors of a fin type, the transistors may be of a planar type as illustrated in FIG. 23A. Alternatively, as illustrated in FIG. 23B, they may be transistors each including an active layer 650 formed using a silicon thin film. The active layer 650 can be formed using polycrystalline silicon or single crystal silicon of a silicon-on-insulator (SOI) structure.

Figure 23C:
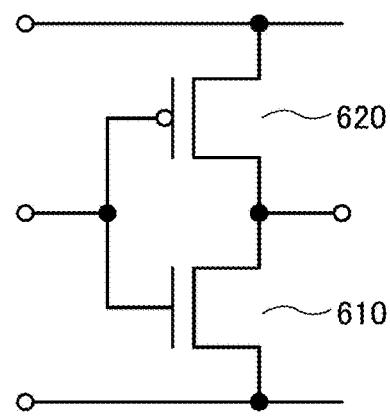

The circuit formed on the silicon substrate 600 is capable of reading a signal output from the pixel circuit and converting the signal; for example, the circuit may include a CMOS inverter as illustrated in a circuit diagram in FIG. 23C. A gate of the transistor 610 (n-channel transistor) is electrically connected to a gate of the transistor 620 (p-channel transistor). One of a source and a drain of one of the transistors 610 and 620 is electrically connected to one of a source and a drain of the other transistor. The other of the source and the drain of the one transistor is electrically connected to a wiring and the other of the source and the drain of the other transistor is electrically connected to another wiring.

The circuit formed on the silicon substrate 600 corresponds to each of the circuit 22, the circuit 23, the circuit 24, the circuit 25, and the like illustrated in FIGS. 3A to 3C and FIG. 12B, for example.

The silicon substrate 600 is not limited to a bulk silicon substrate and can be a substrate made of germanium, silicon germanium, silicon carbide, gallium arsenide, aluminum gallium arsenide, indium phosphide, gallium nitride, or an organic semiconductor.

Here, as illustrated in FIG. 21 and FIGS. 22A and 22B, an insulating layer 80 is provided between a region including an oxide semiconductor transistor and a region including a Si device (a Si transistor or a Si photodiode).

Dangling bonds of silicon are terminated with hydrogen in insulating layers provided in the vicinities of the active regions of the transistors 610 and 620. Therefore, hydrogen has an effect of improving the reliability of the transistors 610 and 620. Meanwhile, hydrogen in insulating layers provided in the vicinity of the oxide semiconductor layer that is the active layer of the transistor 41 or the like causes generation of carriers in the oxide semiconductor layer, and therefore might reduce the reliability of the transistor 41 or the like. Thus, the insulating layer 80 having a function of preventing diffusion of hydrogen is preferably provided between one layer including the transistor using a silicon-based semiconductor material and another layer stacked thereon that includes the transistor using an oxide semiconductor. Hydrogen is confined in the one layer by the insulating layer 80, so that the reliability of the transistors 610 and 620 can be improved. Furthermore, diffusion of hydrogen from the one layer to the other layer is inhibited, so that the reliability of the transistor 41 or the like can also be improved.

The insulating layer 80 can be formed using, for example, aluminum oxide, aluminum oxynitride, gallium oxide, gallium oxynitride, yttrium oxide, yttrium oxynitride, hafnium oxide, hafnium oxynitride, or yttria-stabilized zirconia (YSZ).

Note that as illustrated in FIGS. 22A and 22B, a circuit (e.g., a driver circuit) formed on the silicon substrate 600, the transistor 41 or the like, and the photoelectric conversion element PD can overlap with each other; thus, the integration degree of pixels can be increased. In other words, the resolution of the imaging device can be increased. Such a structure is suitable for an imaging device with, for example, 4K2K, 8K4K, or 16K8K pixels. Note that a structure is possible in which some of the transistors included in the circuit 20 are formed on the silicon substrate 600 to overlap with an OS transistor, the photoelectric conversion element PD, and the like.

Figure 24:
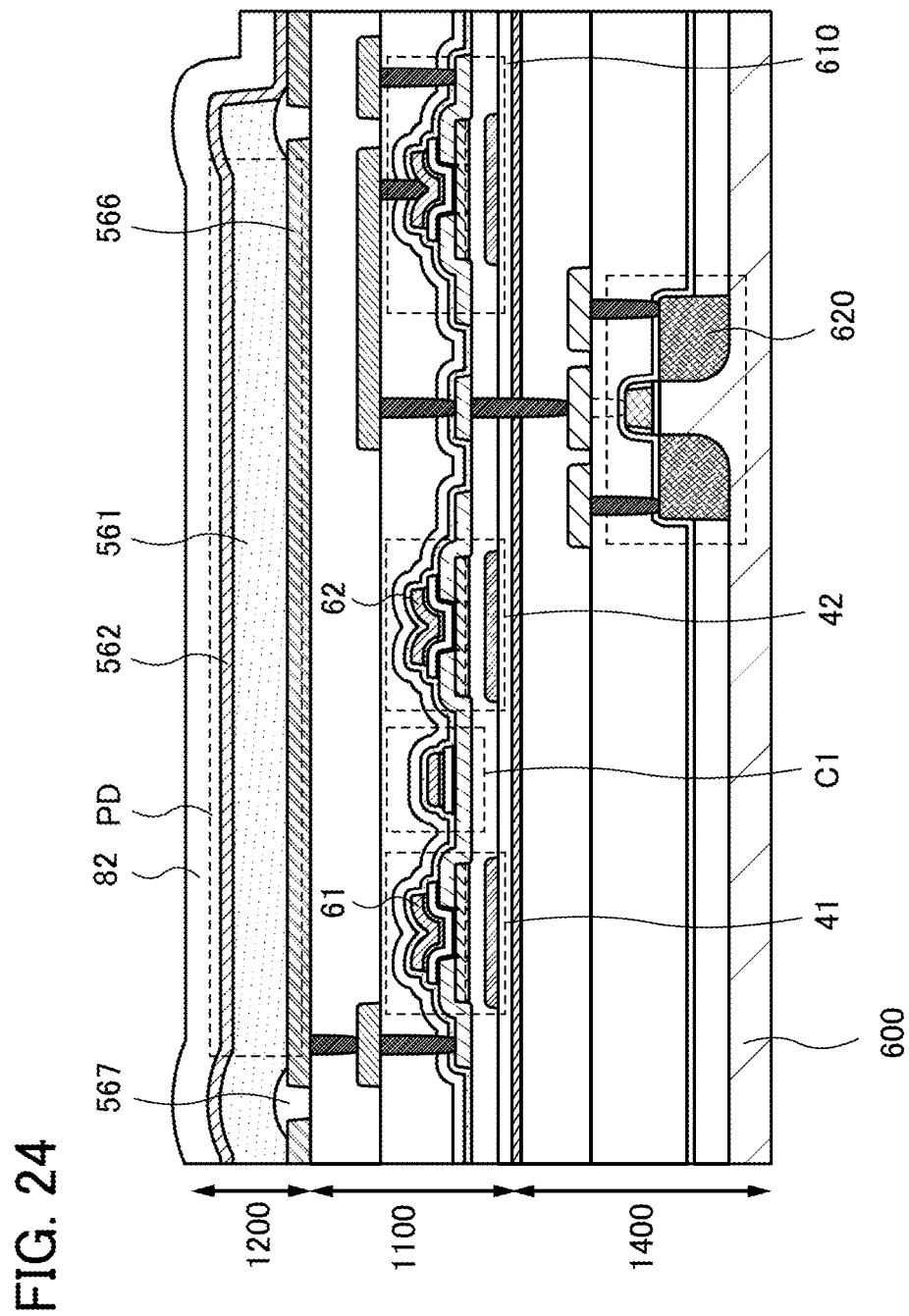
FIG. 24 is a cross-sectional view illustrating an imaging device.

An imaging device of one embodiment of the present invention can also have a structure in FIG. 24. The imaging device in FIG. 24 is a modification example of the imaging device in FIG. 22A. A CMOS inverter is formed using an OS transistor and a Si transistor.

Here, the transistor 620 is a p-channel Si transistor provided in the layer 1400, and the transistor 610 is an n-channel OS transistor provided in the layer 1100. When only the p-channel transistor is provided on the silicon substrate 600, a step of forming a well, an n-type impurity layer, or the like can be skipped.

Although selenium or the like is used for the photoelectric conversion element PD in the imaging device in FIG. 24, a pin thin film photodiode may be used as in FIG. 19.

In the imaging device in FIG. 24, the transistor 610 can be formed through the same process as the transistors 41 and 42 formed in the layer 1100. Thus, the manufacturing process of the imaging device can be simplified.

Figure 25:
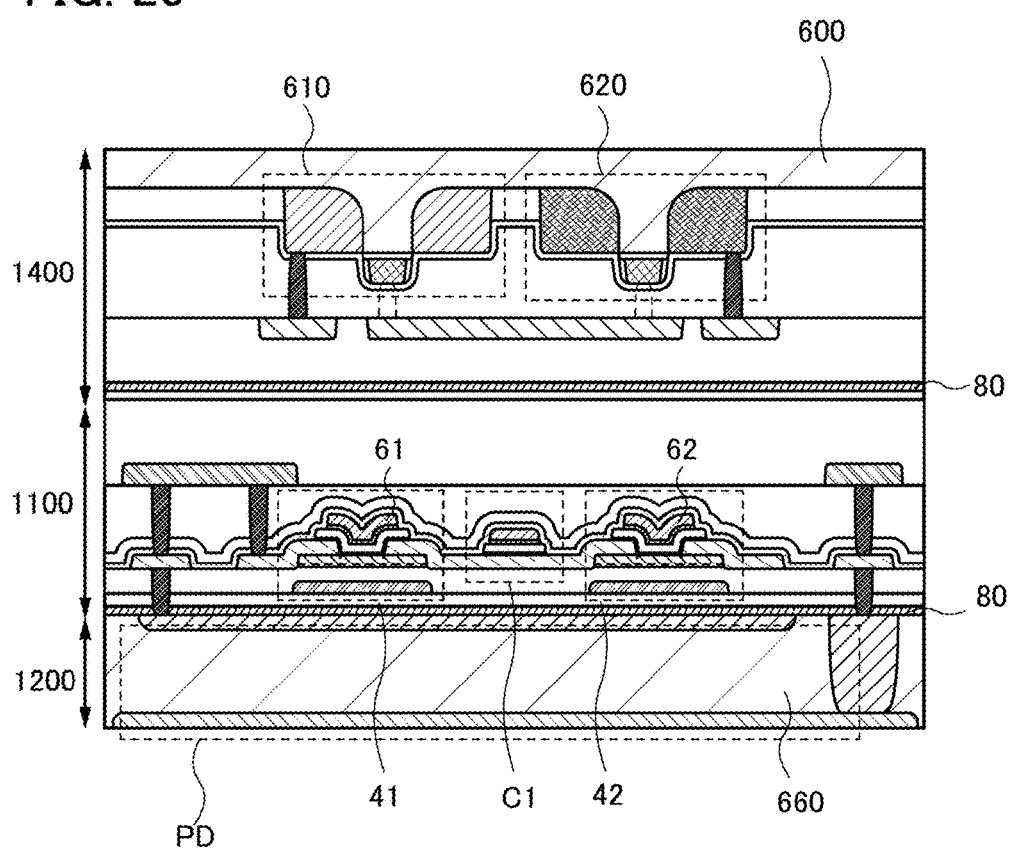
FIG. 25 is a cross-sectional view illustrating an imaging device.

As illustrated in FIG. 25, an imaging device of one embodiment of the present invention may have a structure where a pixel includes the photoelectric conversion element PD formed on a silicon substrate 660 and OS transistors formed over the photoelectric conversion element PD and the pixel and the silicon substrate 600 on which the circuit is formed are attached to each other. Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance semiconductor device can be provided.

Figure 26:
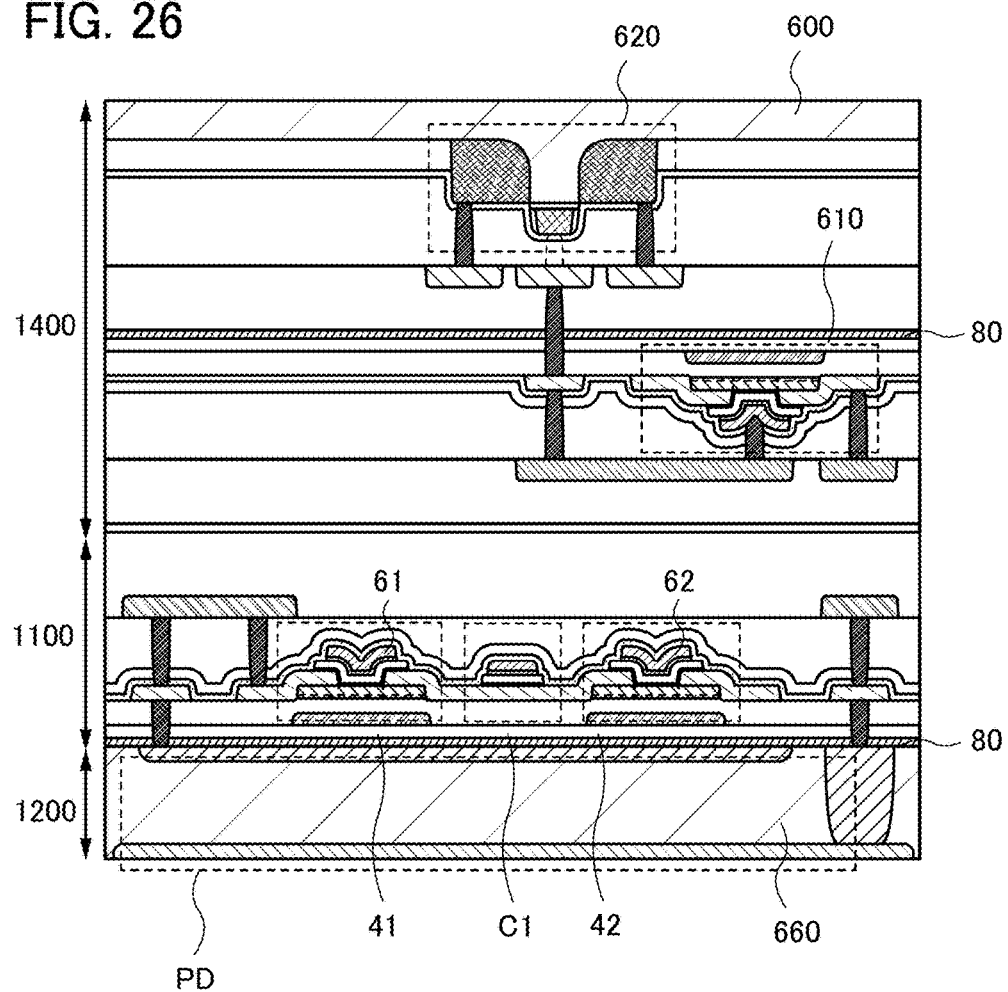
FIG. 26 is a cross-sectional view illustrating an imaging device.

FIG. 26 shows a modification example of FIG. 25, in which a circuit includes an OS transistor and a Si transistor. Such a structure is suitable for increasing the effective area of the photoelectric conversion element PD formed on the silicon substrate 660. Furthermore, the integration degree of the circuit formed on the silicon substrate 600 can be improved using miniaturized Si transistors; thus, a high-performance semiconductor device can be provided.

In the case of the structure illustrated in FIG. 26, a CMOS circuit can be formed using the Si transistor on the silicon substrate 600 and the OS transistor thereon. Since the off-state current of the OS transistor is extremely low, the static leakage current of the CMOS circuit can be extremely low.

Note that the structures of the transistor and the photoelectric conversion element included in each of the imaging devices described in this embodiment are only examples. Therefore, for example, one or more of the transistors 41 to 45 may include silicon or the like in an active region or an active layer. Furthermore, one of or both the transistors 610 and 620 may include an oxide semiconductor layer as an active layer.

Figure 27A:
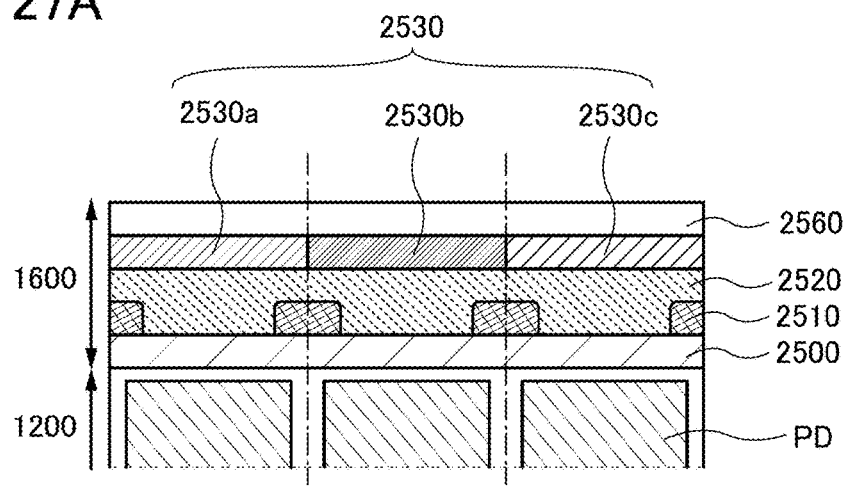
FIGS. 27A to 27C are cross-sectional views each illustrating a structure of an imaging device.

FIG. 27A is a cross-sectional view of an example of a mode in which a color filter and the like are added to the imaging device. The cross-sectional view illustrates part of a region including pixel circuits for three pixels. An insulating layer 2500 is formed over the layer 1200 where the photoelectric conversion element PD is formed. As the insulating layer 2500, a silicon oxide film or the like with a high visible-light transmitting property can be used. In addition, a silicon nitride film may be stacked as a passivation film. In addition, a dielectric film of hafnium oxide or the like may be stacked as an anti-reflection film.

A light-blocking layer 2510 may be formed over the insulating layer 2500. The light-blocking layer 2510 has a function of inhibiting color mixing of light passing through the upper color filter. The light-blocking layer 2510 can be formed of a metal layer of aluminum, tungsten, or the like, or a stack including the metal layer and a dielectric film functioning as an anti-reflection film.

An organic resin layer 2520 can be formed as a planarization film over the insulating layer 2500 and the light-blocking layer 2510. A color filter 2530 (a color filter 2530a, a color filter 2530b, and a color filter 2530c) is formed in each pixel. For example, the color filter 2530a, the color filter 2530b, and the color filter 2530c each have a color of red (R), green (G), blue (B), yellow (Y), cyan (C), magenta (M), or the like, so that a color image can be obtained.

A light-transmitting insulating layer 2560 or the like can be provided over the color filter 2530.

Figure 27B:
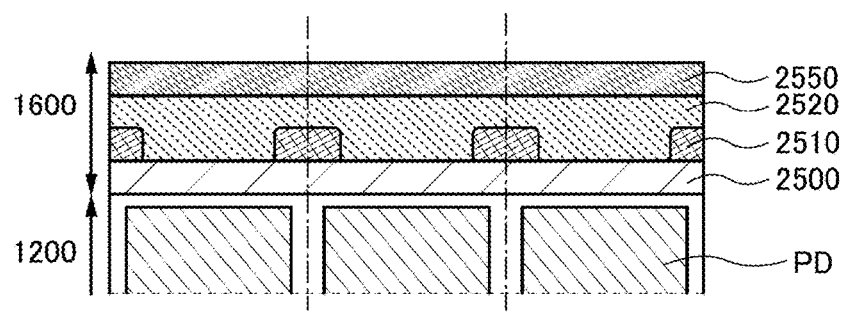

As illustrated in FIG. 27B, an optical conversion layer 2550 may be used instead of the color filter 2530. Such a structure enables the imaging device to take images in various wavelength regions.

For example, when a filter that blocks light having a wavelength shorter than or equal to that of visible light is used as the optical conversion layer 2550, an infrared imaging device can be obtained. When a filter that blocks light having a wavelength shorter than or equal to that of near infrared light is used as the optical conversion layer 2550, a far-infrared imaging device can be obtained. When a filter that blocks light having a wavelength longer than or equal to that of visible light is used as the optical conversion layer 2550, an ultraviolet imaging device can be obtained.

Furthermore, when a scintillator is used as the optical conversion layer 2550, an imaging device that takes an image visualizing the intensity of radiations and is used for an X-ray imaging device or the like can be obtained. Radiations such as X-rays pass through a subject to enter a scintillator, and then are converted into light (fluorescence) such as visible light or ultraviolet light owing to a phenomenon known as photoluminescence. Then, the photoelectric conversion element PD detects the light to obtain image data. Furthermore, the imaging device having the structure may be used in a radiation detector or the like.

A scintillator includes a substance that, when irradiated with radiations such as X-rays or gamma rays, absorbs energy of the radiations to emit visible light or ultraviolet light. For example, a resin or ceramics in which any of $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, and $ZnO$ is dispersed can be used.

In the photoelectric conversion element PD using a selenium-based material, radiations such as X-rays can be directly converted into charge; thus, the scintillator is not necessarily used.

Figure 27C:
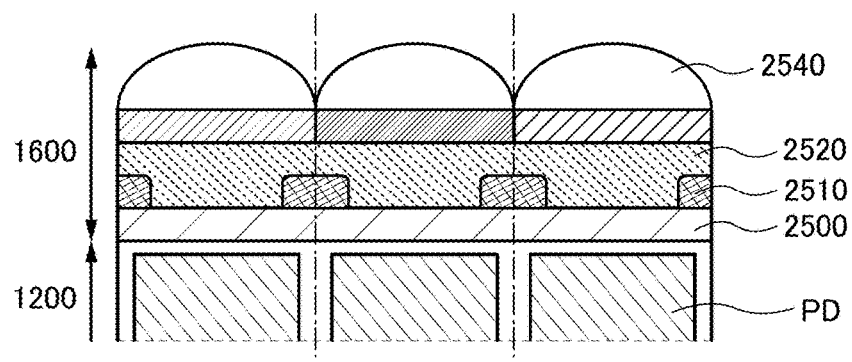

Alternatively, as illustrated in FIG. 27C, a microlens array 2540 may be provided over the color filters 2530a, 2530b, and 2530c. Light penetrating lenses included in the microlens array 2540 goes through the color filters positioned thereunder to reach the photoelectric conversion element PD. Note that a region other than the layer 1200 in FIGS. 27A to 27C is referred to as a layer 1600.

Figure 28:
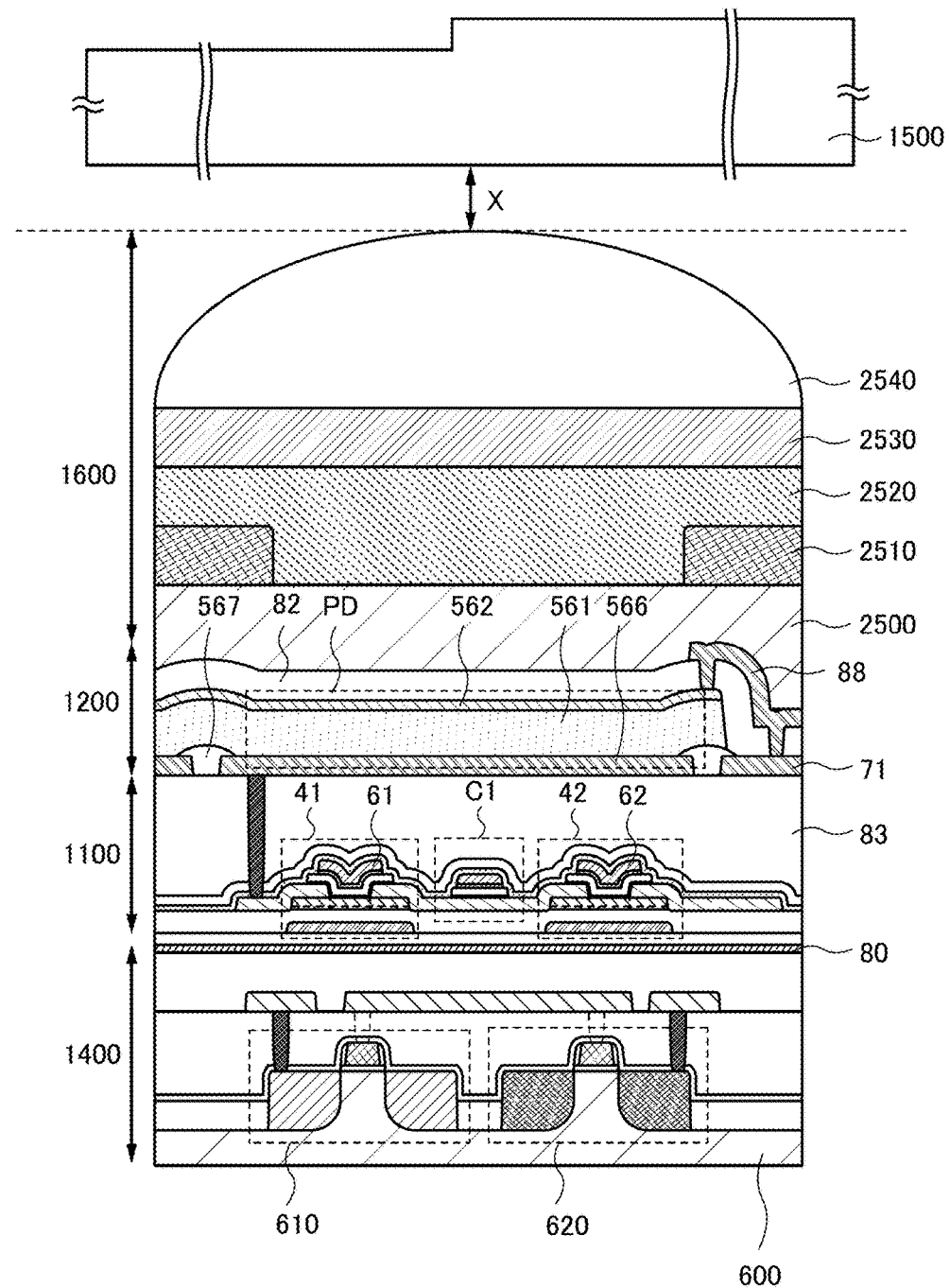
FIG. 28 is a cross-sectional view illustrating a structure of an imaging device.

FIG. 28 illustrates a specific example of a stacked-layer structure including the circuit 20 of one embodiment of the present invention, the microlens array 2540 illustrated in FIG. 27C, and the like. In the example illustrated in FIG. 28, the structure of the pixel illustrated in FIG. 22A is used. In the case of using the pixel illustrated in FIG. 26, a structure illustrated in FIG. 29 is employed.

The photoelectric conversion element PD, the circuit of the circuit 20, and the driver circuit can be positioned so as to overlap with each other in this manner, leading to a reduction in the size of the imaging device.

As illustrated in FIG. 28 and FIG. 29, a diffraction grating 1500 may be provided above the microlens array 2540. An image of an object through the diffraction grating 1500 (i.e., a diffraction pattern) can be scanned into a pixel, and an input image (an object image) can be formed from a captured image in the pixel by arithmetic processing. In addition, the use of the diffraction grating 1500 instead of a lens can reduce the cost of the imaging device.

The diffraction grating 1500 can be formed using a light-transmitting material. An inorganic insulating film such as a silicon oxide film or a silicon oxynitride film can be used, for example. Alternatively, an organic insulating film such as an acrylic resin film or a polyimide resin film may be used. Alternatively, a stack of the inorganic insulating film and the organic insulating film may be used.

In addition, the diffraction grating 1500 can be formed by a lithography process using a photosensitive resin or the like. Alternatively, the diffraction grating 1500 can be formed by a lithography process and an etching process. Alternatively, the diffraction grating 1500 can be formed by nanoimprint lithography, laser scribing, or the like.

A space X may be provided between the diffraction grating 1500 and the microlens array 2540. The space X can be less than or equal to 1 mm, preferably less than or equal to 100 µm. The space may be an empty space or may be a sealing layer or an adhesion layer formed using a light-transmitting material. For example, an inert gas such as nitrogen or a rare gas can be sealed in the space. Alternatively, an acrylic resin, an epoxy resin, a polyimide resin, or the like may be provided in the space. Alternatively, a liquid such as silicone oil may be provided. Even in the case where the microlens array 2540 is not provided, the space X may be provided between the color filter 2530 and the diffraction grating 1500.

As illustrated in FIGS. 30A1 and 30B1, the imaging device may be bent. FIG. 30A1 illustrates a state in which the imaging device is bent in the direction of dashed-two dotted line X1-X2. FIG. 30A2 is a cross-sectional view illustrating a portion indicated by dashed-two dotted line X1-X2 in FIG. 30A1. FIG. 30A3 is a cross-sectional view illustrating a portion indicated by dashed-two dotted line Y1-Y2 in FIG. 30A1.

FIG. 30B1 illustrates a state where the imaging device is bent in the direction of dashed-two dotted line X3-X4 and the direction of dashed-two dotted line Y3-Y4. FIG. 30B2 is a cross-sectional view illustrating a portion indicated by dashed-two dotted line X3-X4 in FIG. 30B1. FIG. 30B3 is a cross-sectional view illustrating a portion indicated by dashed-two dotted line Y3-Y4 in FIG. 30B1.

Bending the imaging device can reduce field curvature and astigmatism. Thus, the optical design of lens and the like, which is used in combination of the imaging device, can be facilitated. For example, the number of lenses used for aberration correction can be reduced; accordingly, the size or weight of semiconductor devices including the imaging device can be easily reduced. In addition, the quality of a captured image can be improved.

In Embodiment 1, one embodiment of the present invention has been described. Other embodiments of the present invention are described in Embodiment 2 to 9. Note that one embodiment of the present invention is not limited thereto. In other words, various embodiments of the invention are described in this embodiment and the other embodiments, and one embodiment of the present invention is not limited to a particular embodiment. Although an example in which one embodiment of the present invention is applied to an imaging device is described, one embodiment of the present invention is not limited thereto. Depending on circumstances or conditions, one embodiment of the present invention is not necessarily applied to an imaging device. One embodiment of the present invention may be applied to a semiconductor device with another function, for example. Although an example in which a channel formation region, a source region, a drain region, or the like of a transistor includes an oxide semiconductor is described as one embodiment of the present invention, one embodiment of the present invention is not limited thereto. Depending on circumstances or conditions, various transistors or a channel formation region, a source region, a drain region, or the like of a transistor in one embodiment of the present invention may include various semiconductors. Depending on circumstances or conditions, various transistors or a channel formation region, a source region, a drain region, or the like of a transistor in one embodiment of the present invention may include, for example, at least one of silicon, germanium, silicon germanium, silicon carbide, gallium arsenide, aluminum gallium arsenide, indium phosphide, gallium nitride, and an organic semiconductor. Alternatively, for example, depending on circumstances or conditions, various transistors or a channel formation region, a source region, a drain region, or the like of a transistor in one embodiment of the present invention does not necessarily include an oxide semiconductor.

This embodiment can be implemented in appropriate combination with any of the structures described in the other embodiments.

Embodiment 2

In this embodiment, an example of a driving method of a pixel circuit is described. The pixel circuit described in Embodiment 1 can perform first operation in which normal imaging is performed and second operation in which difference data between imaging data of an initial frame and imaging data of a current frame can be retained and a signal based on the difference data can be output. In the second operation, the difference data can be output without a comparison process or the like in an external circuit; thus, the power consumption of a security camera or the like can be reduced.

The first operation of the circuit in FIG. 1 is described with reference to a timing chart in FIG. 31. Note that a potential for correcting variation in the threshold voltage of the transistor 44 is held on the back gate side of the transistor 44 by the operation method described in Embodiment 1.

In a period from time T1 to time T2, the potential of the wiring 61 (TX) is set to "H", the potential of the wiring 62 (PR) is set to "H", and the potential of the wiring 63 (W) is set to "H". At this time, the potential of the node FD1 is set to the potential of the wiring 72 (VPR) and the potential of the node FD2 is set to the potential of the wiring 73 (VCS) (reset operation).

In a period from time T2 to time T3, the potential of the wiring 61 (TX) is kept at "H", the potential of the wiring 62 (PR) is set to "L", and the potential of the wiring 63 (W) is set to "L". As the potential of the node FD1 decreases in response to light entering the photoelectric conversion element PD, the potential of the node FD2 also decreases due to capacitive coupling. When the amount of decrease in the potential of the node FD1 at time T3 is denoted by VA, the potential of the node FD1 is VPR−VA. The potential of the node FD2 decreases by VB; i.e., the potential of the node FD2 is VCS−VB (accumulation operation). Note that in the circuit structure in FIG. 1, as the intensity of light entering the photoelectric conversion element PD becomes higher, the potentials of the node FD1 and the node FD2 decrease.

In a period from time T3 to time T4, the potential of the wiring 61 (TX) is set to "L", the potential of the wiring 62 (PR) is kept at "L", and the potential of the wiring 63 (W) is kept at "L"; thus, the potentials of the node FD1 and the node FD2 are held.

When the potential of the wiring 66 (SE) is set to "H" in a period from time T4 to time T5, a signal that corresponds to imaging data is output to the wiring 90 (OUT) in accordance with the potential of the node FD2 (selection operation). Through the operation from time T1 to time T5, the first operation can be performed.

Next, the second operation of the circuit in FIG. 1 is described. In the second operation, difference in data between a first frame (reference frame) and a second frame (difference target frame) is output. Data obtaining operation in the first frame is described with reference to a timing chart in FIG. 32.

In a period from time T1 to time T2, the potential of the wiring 61 (TX) is set to "H", the potential of the wiring 62 (PR) is set to "H", and the potential of the wiring 63 (W) is set to "H". At this time, the potential of the node FD1 is set to the potential of the wiring 72 (VPR) and the potential of the node FD2 is set to the potential of the wiring 73 (VCS).

In a period from time T2 to time T3, the potential of the wiring 61 (TX) is kept at "H", the potential of the wiring 62 (PR) is set to "L", and the potential of the wiring 63 (W) is kept at "H". The potential of the node FD1 decreases in response to light entering the photoelectric conversion element PD. When the amount of decrease in the potential of the node FD1 at time T3 is denoted by VA, the potential of the node FD1 is VPR−VA. Note that in the circuit structure in FIG. 1, as the intensity of light entering the photoelectric conversion element PD becomes higher, the potential of the node FD1 decreases.

In a period from time T3 to time T4, the potential of the wiring 61 (TX) is set to "L", the potential of the wiring 62 (PR) is kept at "L", and the potential of the wiring 63 (W) is kept at "H"; thus, the potential of the node FD1 is held.

In a period from time T4 to time T5, the potential of the wiring 61 (TX) is kept at "L", the potential of the wiring 62 (PR) is kept at "L", and the potential of the wiring 63 (W) is set to "L"; thus, the potentials of the node FD1 and the node FD2 are held.

Next, data obtaining operation in the second frame is described with reference to a timing chart in FIG. 33. The case where there is no difference in data between the first frame and the second frame, i.e., the case where the same image is taken in the first frame and the second frame is assumed in FIG. 33.

In a period from time T1 to time T2, the potential of the wiring 61 (TX) is set to "H", the potential of the wiring 62 (PR) is set to "H", and the potential of the wiring 63 (W) is set to "L". The potential of the node FD1 increases by VA and the potential of the node FD2 increases by VB due to capacitive coupling. Here, VA and VB are potentials that reflect illuminance in the first frame.

In a period from time T2 to time T3, the potential of the wiring 61 (TX) is kept at "H", the potential of the wiring 62 (PR) is set to "L", and the potential of the wiring 63 (W) is kept at "L", so that the potentials of the node FD1 and the node FD2 decrease in response to light entering the photoelectric conversion element PD. When the amount of decrease in the potential of the node FD1 at time T3 is denoted by VA', the potential of the node FD1 is VPR−VA'. Since VA'=VA, the potential of the node FD1 is VPR−VA. The potential of the node FD2 decreases by VB' due to capacitive coupling; i.e., the potential of the node FD2 is VCS+VB−VB'. Since VB'=VB, the potential of the node FD2 is VCS.

In a period from time T3 to time T4, the potential of the wiring 61 (TX) is set to "L", the potential of the wiring 62 (PR) is kept at "L", and the potential of the wiring 63 (W) is kept at "L"; thus, the potentials of the node FD1 and the node FD2 are held.

When the potential of the wiring 66 (SE) is set to "H" in a period from time T4 to time T5, a signal that corresponds to imaging data is output to the wiring 90 (OUT) in accordance with the potential of the node FD2. At this time, the potential of the node FD2 is "VCS", the reset potential, and a judgment is made on the basis of the output signal in that there is no significant difference in comparison of data between the first frame and the second frame.

Figure 34:
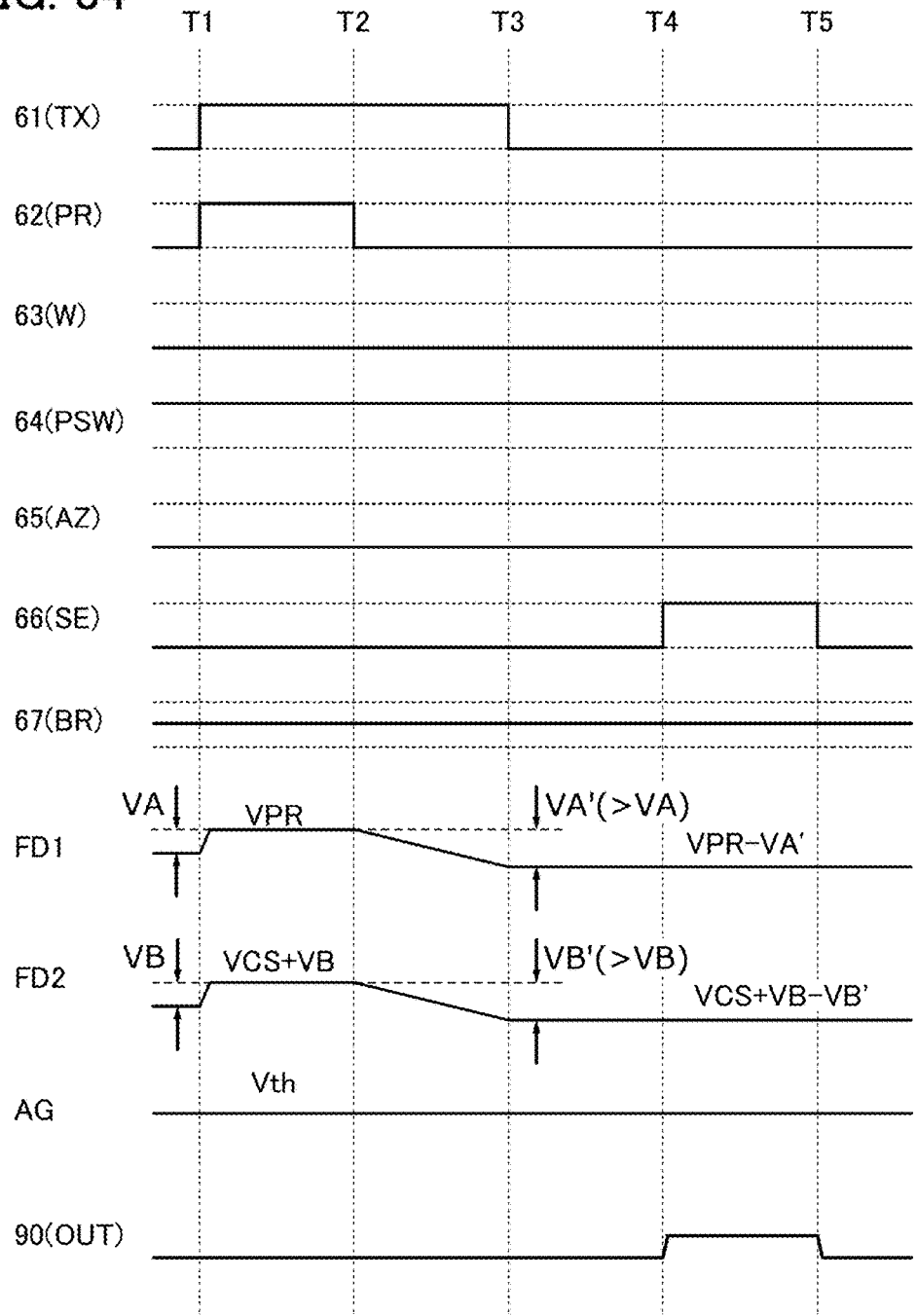
FIG. 34 is a timing chart illustrating operation of an imaging device.

Next, with reference to a timing chart in FIG. 34, operation in the case where there is a difference in data between the first frame and the second frame, i.e., operation in the case where different images are taken in the first frame and the second frame is described. Note that the illuminance of light entering a target pixel in the first frame is lower than that in the second frame.

In a period from time T1 to time T2, the potential of the wiring 61 (TX) is set to "H", the potential of the wiring 62 (PR) is set to "H", and the potential of the wiring 63 (W) is set to "L". The potential of the node FD1 increases by VA and the potential of the node FD2 increases by VB due to capacitive coupling. Here, VA and VB are potentials that reflect illuminance in the first frame.

In a period from time T2 to time T3, the potential of the wiring 61 (TX) is kept at "H", the potential of the wiring 62 (PR) is set to "L", and the potential of the wiring 63 (W) is kept at "L", so that the potentials of the node FD1 and the node FD2 decrease in response to light entering the photoelectric conversion element PD. When the amount of decrease in the potential of the node FD1 at time T3 is denoted by VA', the potential of the node FD1 is VPR−VA'. The potential of the node FD2 decreases by VB' due to capacitive coupling; i.e., the potential of the node FD2 is VCS+VB−VB'.

In a period from time T3 to time T4, the potential of the wiring 61 (TX) is set to "L", the potential of the wiring 62 (PR) is kept at "L", and the potential of the wiring 63 (W) is kept at "L"; thus, the potentials of the node FD1 and the node FD2 are held.

When the potential of the wiring 66 (SE) is set to "H" in a period from time T4 to time T5, a signal that corresponds to imaging data is output to the wiring 90 (OUT) in accordance with the potential of the node FD2. At this time, the potential of the node FD2 is VCS+VB−VB'. Here, VB is a potential that reflects illuminance in the first frame and VB' is a potential that reflects illuminance in the second frame. In other words, the second operation in which a difference in data between the first frame and the second frame is output can be performed.

This embodiment can be implemented in an appropriate combination with any of the structures described in the other embodiments.

Embodiment 3

In this embodiment, a transistor including an oxide semiconductor that can be used in one embodiment of the present invention is described with reference to drawings. In the drawings in this embodiment, some components are enlarged, reduced in size, or omitted for easy understanding.

Figure 35A:
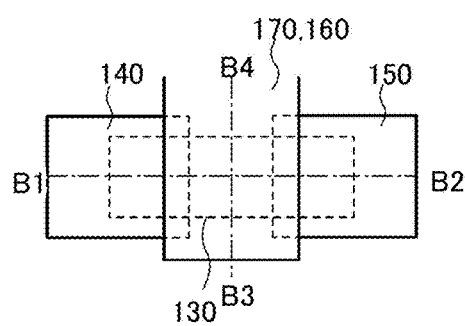
FIGS. 35A to 35F are top views and cross-sectional views illustrating transistors.
Figure 35B:
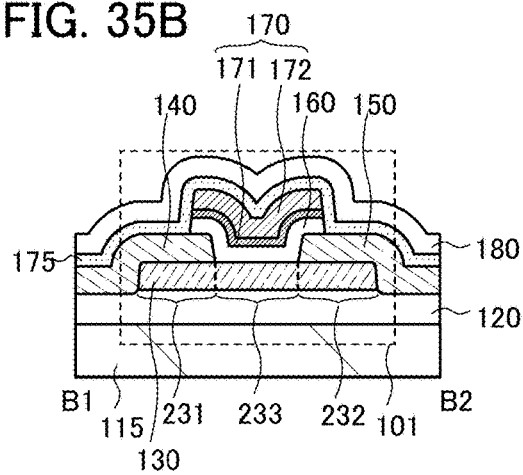
Figure 37A:
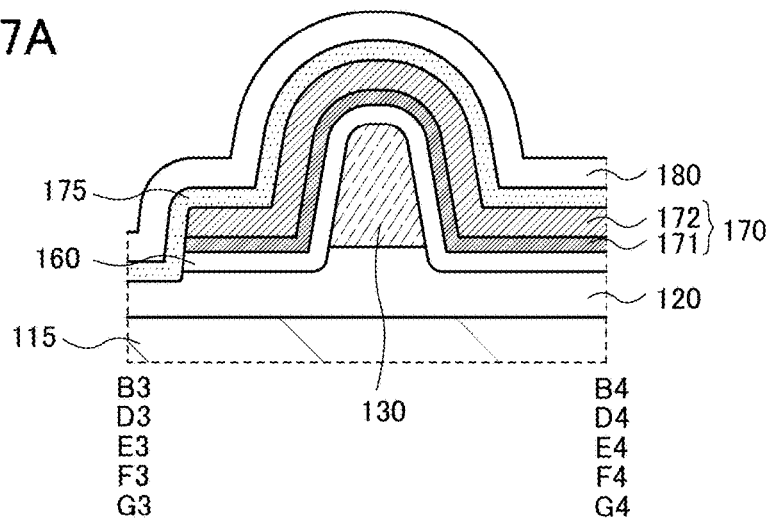
FIGS. 37A to 37D each illustrate a cross section of a transistor in the channel width direction.

FIGS. 35A and 35B are a top view and a cross-sectional view illustrating a transistor 101 of one embodiment of the present invention. FIG. 35A is the top view, and FIG. 35B illustrates a cross section in the direction of dashed-dotted line B1-B2 in FIG. 35A. A cross section in the direction of dashed-dotted line B3-B4 in FIG. 35A is illustrated in FIG. 37A. The direction of dashed-dotted line B1-B2 is referred to as a channel length direction, and the direction of dashed-dotted line B3-B4 is referred to as a channel width direction.

The transistor 101 includes an insulating layer 120 in contact with a substrate 115; an oxide semiconductor layer 130 in contact with the insulating layer 120; conductive layers 140 and 150 electrically connected to the oxide semiconductor layer 130; an insulating layer 160 in contact with the oxide semiconductor layer 130 and the conductive layers 140 and 150; a conductive layer 170 in contact with the insulating layer 160; an insulating layer 175 in contact with the conductive layers 140 and 150, the insulating layer 160, and the conductive layer 170; and an insulating layer 180 in contact with the insulating layer 175. The insulating layer 180 may function as a planarization film as necessary.

Here, the conductive layer 140, the conductive layer 150, the insulating layer 160, and the conductive layer 170 can function as a source electrode layer, a drain electrode layer, a gate insulating film, and a gate electrode layer, respectively.

A region 231, a region 232, and a region 233 in FIG. 35B can function as a source region, a drain region, and a channel formation region, respectively. The region 231 and the region 232 are in contact with the conductive layer 140 and the conductive layer 150, respectively. When a conductive material that is easily bonded to oxygen is used for the conductive layers 140 and 150, the resistance of the regions 231 and 232 can be reduced.

Specifically, since the oxide semiconductor layer 130 is in contact with the conductive layers 140 and 150, an oxygen vacancy is generated in the oxide semiconductor layer 130, and interaction between the oxygen vacancy and hydrogen that remains in the oxide semiconductor layer 130 or diffuses into the oxide semiconductor layer 130 from the outside changes the regions 231 and 232 to n-type regions with low resistance.

Note that functions of a "source" and a "drain" of a transistor are sometimes interchanged with each other when a transistor of opposite polarity is used or when the direction of current flow is changed in a circuit operation, for example. Therefore, the terms "source" and "drain" can be interchanged with each other in this specification. In addition, the term "electrode layer" can be replaced with the term "wiring".

The conductive layer 170 includes two layers, a conductive layer 171 and a conductive layer 172, in the drawing, but also may be a single layer or a stack of three or more layers. The same applies to other transistors described in this embodiment.

Each of the conductive layers 140 and 150 is a single layer in the drawing, but also may be a stack of two or more layers. The same applies to other transistors described in this embodiment.

Figure 35C:
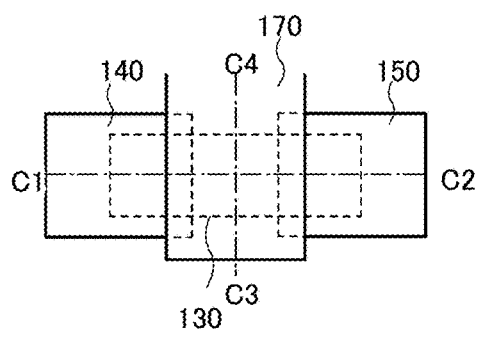
Figure 35D:
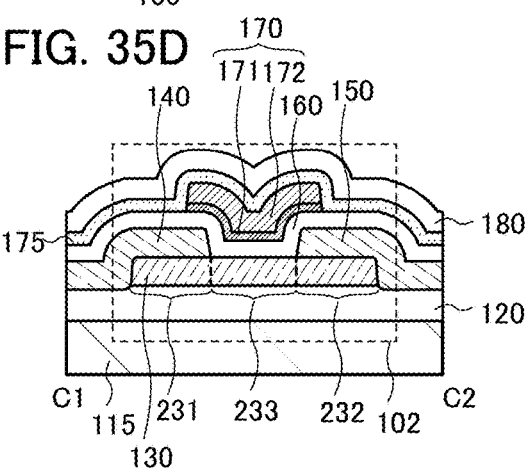
Figure 37B:
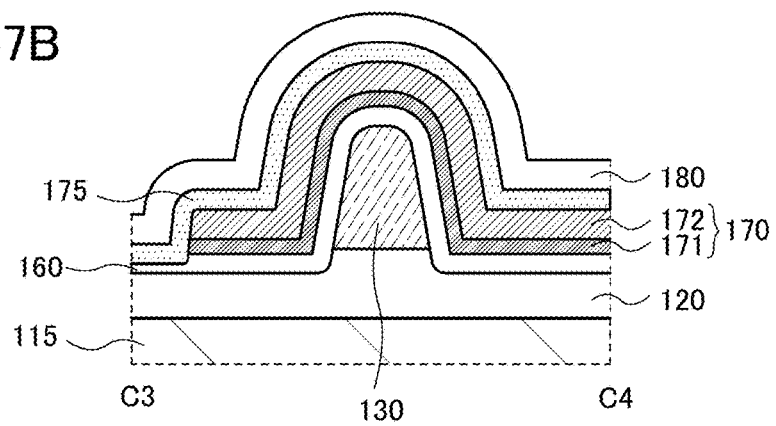

The transistor in one embodiment of the present invention may have a structure illustrated in FIGS. 35C and 35D. FIG. 35C is a top view of a transistor 102. A cross section in the direction of dashed-dotted line C1-C2 in FIG. 35C is illustrated in FIG. 35D. A cross section in the direction of dashed-dotted line C3-C4 in FIG. 35C is illustrated in FIG. 37B. The direction of dashed-dotted line C1-C2 is referred to as a channel length direction, and the direction of dashed-dotted line C3-C4 is referred to as a channel width direction.

The transistor 102 has the same structure as the transistor 101 except that an end portion of the insulating layer 160 functioning as a gate insulating film is not aligned with an end portion of the conductive layer 170 functioning as a gate electrode layer. In the transistor 102, wide areas of the conductive layers 140 and 150 are covered with the insulating layer 160 and accordingly the resistance between the conductive layer 170 and the conductive layers 140 and 150 is high; therefore, the transistor 102 has a feature of a low gate leakage current.

The transistors 101 and 102 each have a top-gate structure including a region where the conductive layer 170 overlaps with the conductive layers 140 and 150. To reduce parasitic capacitance, the width of the region in the channel length direction is preferably greater than or equal to 3 nm and less than 300 nm. Since an offset region is not formed in the oxide semiconductor layer 130 in this structure, a transistor with a high on-state current can be easily formed.

Figure 35E:
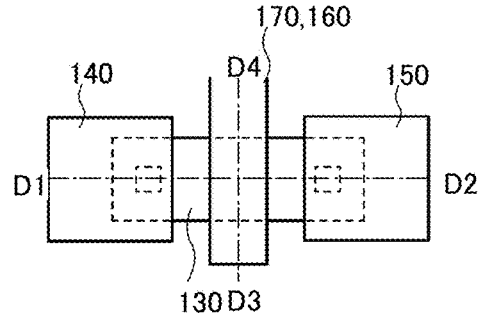
Figure 35F:
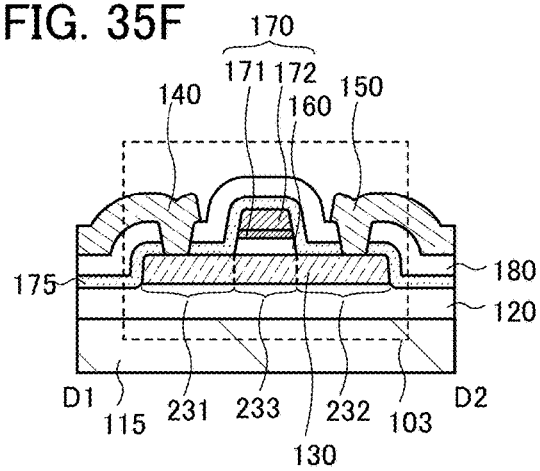

The transistor in one embodiment of the present invention may have a structure illustrated in FIGS. 35E and 35F. FIG. 35E is a top view of a transistor 103. A cross section in the direction of dashed-dotted line D1-D2 in FIG. 35E is illustrated in FIG. 35F. A cross section in the direction of dashed-dotted line D3-D4 in FIG. 35E is illustrated in FIG. 37A. The direction of dashed-dotted line D1-D2 is referred to as a channel length direction, and the direction of dashed-dotted line D3-D4 is referred to as a channel width direction.

The transistor 103 includes the insulating layer 120 in contact with the substrate 115; the oxide semiconductor layer 130 in contact with the insulating layer 120; the insulating layer 160 in contact with the oxide semiconductor layer 130; the conductive layer 170 in contact with the insulating layer 160; the insulating layer 175 covering the oxide semiconductor layer 130, the insulating layer 160, and the conductive layer 170; the insulating layer 180 in contact with the insulating layer 175; and the conductive layers 140 and 150 electrically connected to the oxide semiconductor layer 130 through openings provided in the insulating layers 175 and 180. The transistor 103 may further include, for example, an insulating layer (planarization film) in contact with the insulating layer 180 and the conductive layers 140 and 150 as necessary.

Here, the conductive layer 140, the conductive layer 150, the insulating layer 160, and the conductive layer 170 can function as a source electrode layer, a drain electrode layer, a gate insulating film, and a gate electrode layer, respectively.

The region 231, the region 232, and the region 233 in FIG. 35F can function as a source region, a drain region, and a channel formation region, respectively. The regions 231 and 232 are in contact with the insulating layer 175. When an insulating material containing hydrogen is used for the insulating layer 175, for example, the resistance of the regions 231 and 232 can be reduced.

Specifically, interaction between an oxygen vacancy generated in the regions 231 and 232 by the steps up to formation of the insulating layer 175 and hydrogen that diffuses into the regions 231 and 232 from the insulating layer 175 changes the regions 231 and 232 to n-type regions with low resistance. As the insulating material containing hydrogen, for example, silicon nitride, aluminum nitride, or the like can be used.

Figure 36A:
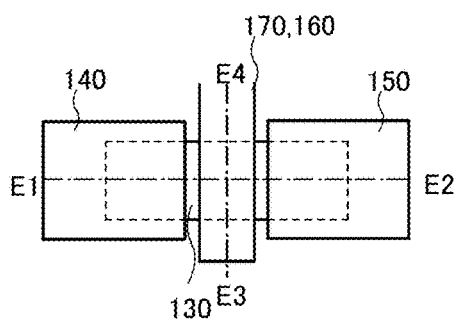
FIGS. 36A to 36F are top views and cross-sectional views illustrating transistors.
Figure 36B:
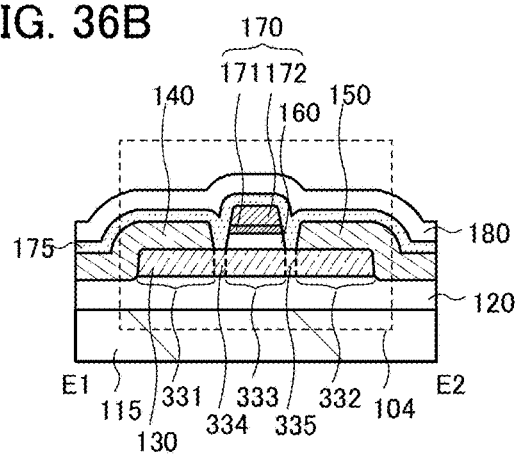

The transistor in one embodiment of the present invention may have a structure illustrated in FIGS. 36A and 36B. FIG. 36A is a top view of a transistor 104. A cross section in the direction of dashed-dotted line E1-E2 in FIG. 36A is illustrated in FIG. 36B. A cross section in the direction of dashed-dotted line E3-E4 in FIG. 36A is illustrated in FIG. 37A. The direction of dashed-dotted line E1-E2 is referred to as a channel length direction, and the direction of dashed-dotted line E3-E4 is referred to as a channel width direction.

The transistor 104 has the same structure as the transistor 103 except that the conductive layers 140 and 150 in contact with the oxide semiconductor layer 130 cover end portions of the oxide semiconductor layer 130.

In FIG. 36B, regions 331 and 334 can function as a source region, regions 332 and 335 can function as a drain region, and a region 333 can function as a channel formation region.

The resistance of the regions 331 and 332 can be reduced in a manner similar to that of the regions 231 and 232 in the transistor 101.

The resistance of the regions 334 and 335 can be reduced in a manner similar to that of the regions 231 and 232 in the transistor 103. In the case where the length of the regions 334 and 335 in the channel length direction is less than or equal to 100 nm, preferably less than or equal to 50 nm, a gate electric field prevents a significant decrease in on-state current. Therefore, a reduction in resistance of the regions 334 and 335 is not performed in some cases.

The transistors 103 and 104 each have a self-aligned structure that does not include a region where the conductive layer 170 overlaps with the conductive layers 140 and 150. A transistor with a self-aligned structure, which has extremely low parasitic capacitance between a gate electrode layer and source and drain electrode layers, is suitable for applications that require high-speed operation.

Figure 36C:
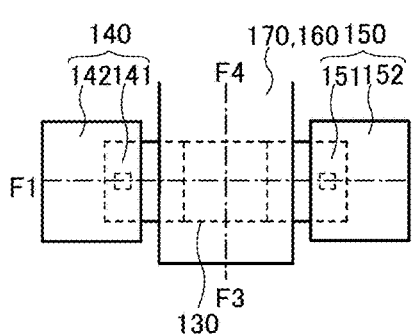
Figure 36D:
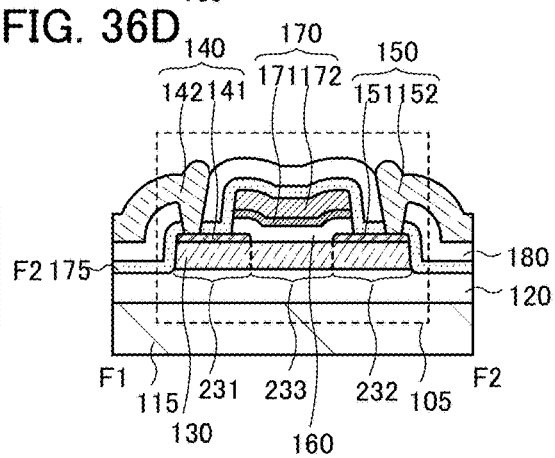

The transistor in one embodiment of the present invention may have a structure illustrated in FIGS. 36C and 36D. FIG. 36C is atop view of a transistor 105. Across section in the direction of dashed-dotted line F1-F2 in FIG. 36C is illustrated in FIG. 36D. A cross section in the direction of dashed-dotted line F3-F4 in FIG. 36C is illustrated in FIG. 37A. The direction of dashed-dotted line F1-F2 is referred to as a channel length direction, and the direction of dashed-dotted line F3-F4 is referred to as a channel width direction.

The transistor 105 includes the insulating layer 120 in contact with the substrate 115; the oxide semiconductor layer 130 in contact with the insulating layer 120; conductive layers 141 and 151 electrically connected to the oxide semiconductor layer 130; the insulating layer 160 in contact with the oxide semiconductor layer 130 and the conductive layers 141 and 151; the conductive layer 170 in contact with the insulating layer 160; the insulating layer 175 in contact with the oxide semiconductor layer 130, the conductive layers 141 and 151, the insulating layer 160, and the conductive layer 170; the insulating layer 180 in contact with the insulating layer 175; and conductive layers 142 and 152 electrically connected to the conductive layers 141 and 151, respectively, through openings provided in the insulating layers 175 and 180. The transistor 105 may further include, for example, an insulating layer in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 105 has the same structure as the transistor 101 except that the conductive layers 141 and 151 are provided, that the openings are provided in the insulating layers 175 and 180, and that the conductive layers 142 and 152 electrically connected to the conductive layers 141 and 151, respectively, through the openings are provided. The conductive layer 140 (the conductive layers 141 and 142) can function as a source electrode layer, and the conductive layer 150 (the conductive layers 151 and 152) can function as a drain electrode layer.

Figure 36E:
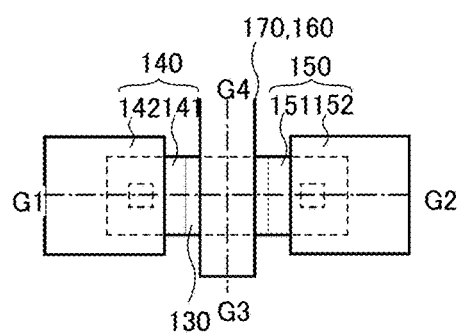
Figure 36F:
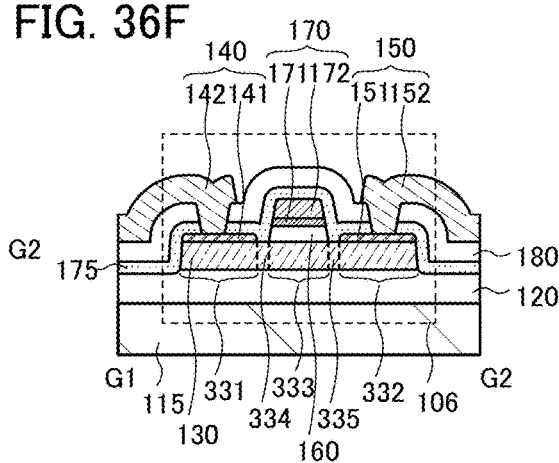

The transistor in one embodiment of the present invention may have a structure illustrated in FIGS. 36E and 36F. FIG. 36E is a top view of a transistor 106. A cross section in the direction of dashed-dotted line G1-G2 in FIG. 36E is illustrated in FIG. 36F. A cross section in the direction of dashed-dotted line G3-G4 in FIG. 36E is illustrated in FIG. 37A. The direction of dashed-dotted line G1-G2 is referred to as a channel length direction, and the direction of dashed-dotted line G3-G4 is referred to as a channel width direction.

The transistor 106 includes the insulating layer 120 in contact with the substrate 115; the oxide semiconductor layer 130 in contact with the insulating layer 120; the conductive layers 141 and 151 electrically connected to the oxide semiconductor layer 130; the insulating layer 160 in contact with the oxide semiconductor layer 130; the conductive layer 170 in contact with the insulating layer 160; the insulating layer 175 in contact with the insulating layer 120, the oxide semiconductor layer 130, the conductive layers 141 and 151, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 106 may further include, for example, an insulating layer (planarization film) in contact with the insulating layer 180 and the conductive layers 142 and 152 as necessary.

Here, the conductive layers 141 and 151 are in contact with the top surface of the oxide semiconductor layer 130 and are not in contact with side surfaces of the oxide semiconductor layer 130.

The transistor 106 has the same structure as the transistor 103 except that the conductive layers 141 and 151 are provided. The conductive layer 140 (the conductive layers 141 and 142) can function as a source electrode layer, and the conductive layer 150 (the conductive layers 151 and 152) can function as a drain electrode layer.

In the structures of the transistors 105 and 106, the conductive layers 140 and 150 are not in contact with the insulating layer 120. These structures make the insulating layer 120 less likely to be deprived of oxygen by the conductive layers 140 and 150 and facilitate oxygen supply from the insulating layer 120 to the oxide semiconductor layer 130.

An impurity for forming an oxygen vacancy to increase conductivity may be added to the regions 231 and 232 in the transistor 103 and the regions 334 and 335 in the transistors 104 and 106. As an impurity for forming an oxygen vacancy in an oxide semiconductor layer, for example, one or more of the following can be used: phosphorus, arsenic, antimony, boron, aluminum, silicon, nitrogen, helium, neon, argon, krypton, xenon, indium, fluorine, chlorine, titanium, zinc, and carbon. As a method for adding the impurity, plasma treatment, ion implantation, ion doping, plasma immersion ion implantation, or the like can be used.

When the above element is added as an impurity element to the oxide semiconductor layer, a bond between a metal element and oxygen in the oxide semiconductor layer is cut, so that an oxygen vacancy is formed. Interaction between an oxygen vacancy in the oxide semiconductor layer and hydrogen that remains in the oxide semiconductor layer or is added to the oxide semiconductor layer later can increase the conductivity of the oxide semiconductor layer.

When hydrogen is added to an oxide semiconductor in which an oxygen vacancy is formed by addition of an impurity element, hydrogen enters an oxygen vacant site and forms a donor level in the vicinity of the conduction band. Consequently, an oxide conductor can be formed. Here, an oxide conductor refers to an oxide semiconductor having become a conductor. Note that the oxide conductor has a light-transmitting property like the oxide semiconductor.

The oxide conductor is a degenerated semiconductor and it is suggested that the conduction band edge equals or substantially equals the Fermi level. For that reason, an ohmic contact is made between an oxide conductor layer and conductive layers functioning as a source electrode layer and a drain electrode layer; thus, contact resistance between the oxide conductor layer and the conductive layers functioning as a source electrode layer and a drain electrode layer can be reduced.

Figure 37C:
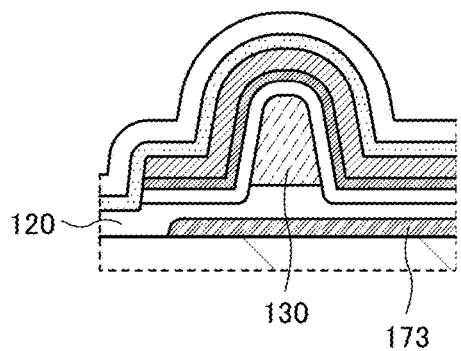
Figure 37D:
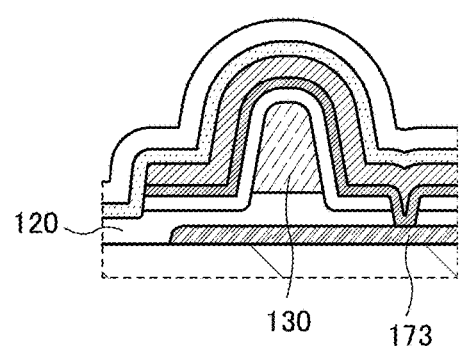
Figure 38A:
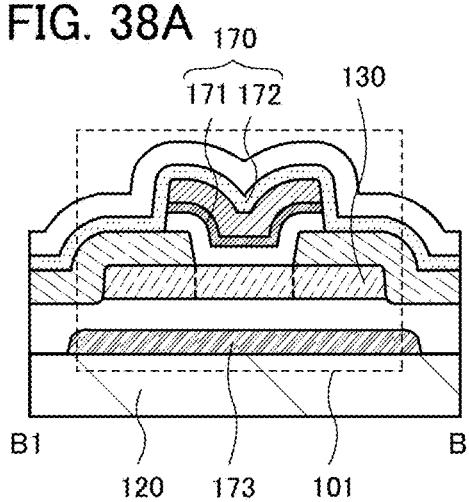
FIGS. 38A to 38F each illustrate a cross section of a transistor in the channel length direction.
Figure 38B:
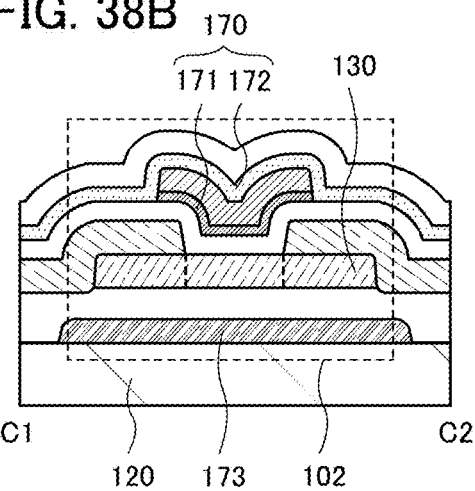
Figure 38C:
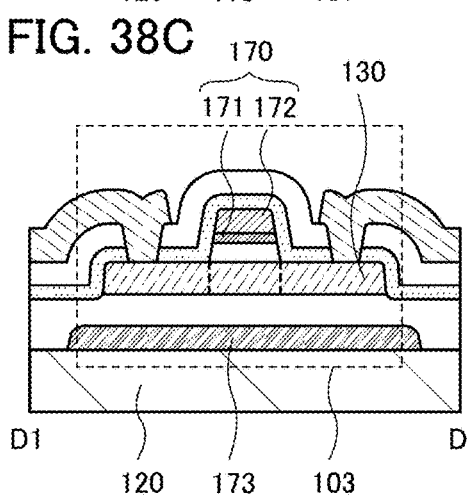
Figure 38D:
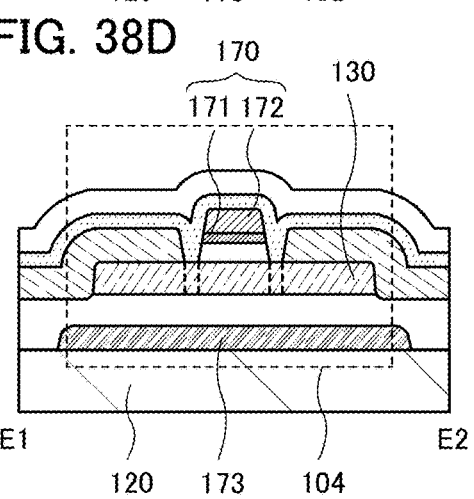
Figure 38E:
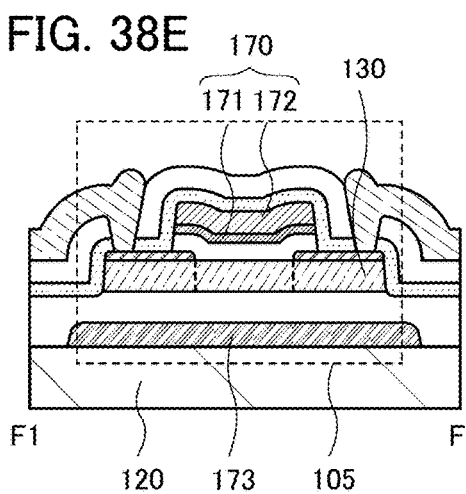
Figure 38F:
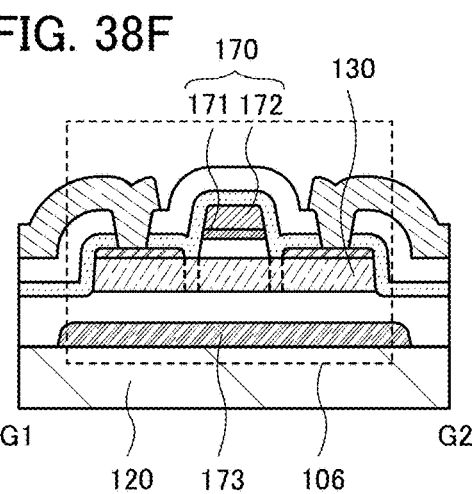

The transistor in one embodiment of the present invention may include the conductive layer 173 between the oxide semiconductor layer 130 and the substrate 115 as illustrated in cross-sectional views in the channel length direction in FIGS. 38A to 38F and cross-sectional views in the channel width direction in FIGS. 37C and 37D. When the conductive layer is used as a second gate electrode layer (back gate), the on-state current can be increased or the threshold voltage can be controlled. In the cross-sectional views in FIGS. 38A to 38F, the width of the conductive layer 173 may be shorter than that of the oxide semiconductor layer 130. Moreover, the width of the conductive layer 173 may be shorter than that of the conductive layer 170.

In order to increase the on-state current, for example, the conductive layers 170 and 173 are made to have the same potential, and the transistor is driven as a double-gate transistor. Furthermore, in order to control the threshold voltage, a fixed potential that is different from the potential of the conductive layer 170 is applied to the conductive layer 173. To set the conductive layers 170 and 173 at the same potential, for example, as illustrated in FIG. 37D, the conductive layers 170 and 173 may be electrically connected to each other through a contact hole.

Although the transistors 101 to 106 in FIGS. 35A to 35F and FIGS. 36A to 36F are examples in which the oxide semiconductor layer 130 is a single layer, the oxide semiconductor layer 130 may be a stacked layer. The oxide semiconductor layer 130 in the transistors 101 to 106 can be replaced with the oxide semiconductor layer 130 in FIGS. 39B and 39C or FIGS. 39D and 39E.

Figure 39A:
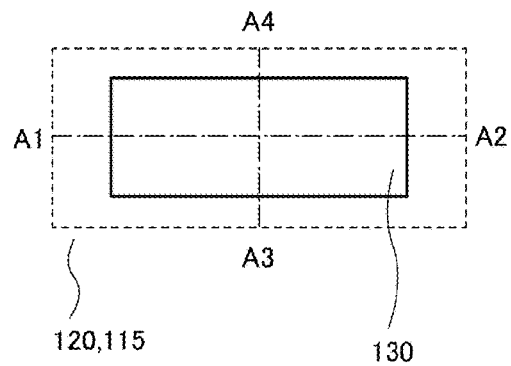
FIGS. 39A to 39E are a top view and cross-sectional views illustrating a semiconductor layer.
Figure 39B:
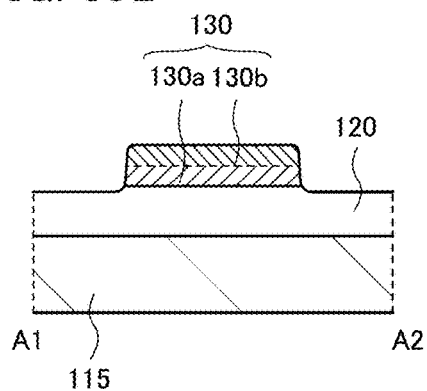
Figure 39D:
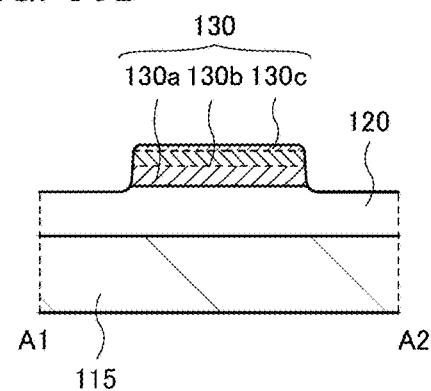
Figure 39C:
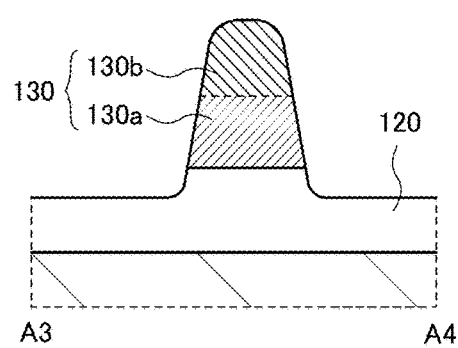
Figure 39E:
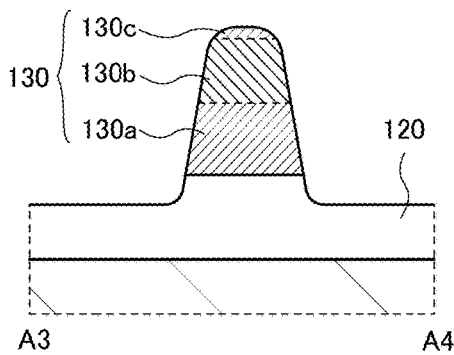

FIG. 39A is a top view of the oxide semiconductor layer 130, and FIGS. 39B and 39C are cross-sectional views of the oxide semiconductor layer 130 with a two-layer structure. FIGS. 39D and 39E are cross-sectional views of the oxide semiconductor layer 130 with a three-layer structure.

Oxide semiconductor layers with different compositions, for example, can be used as an oxide semiconductor layer 130a, an oxide semiconductor layer 130b, and an oxide semiconductor layer 130c.

Figure 40A:
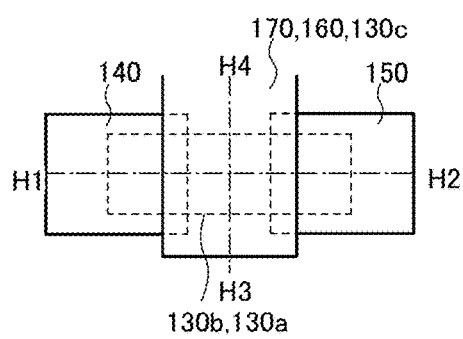
FIGS. 40A to 40F are top views and cross-sectional views illustrating transistors.
Figure 40B:
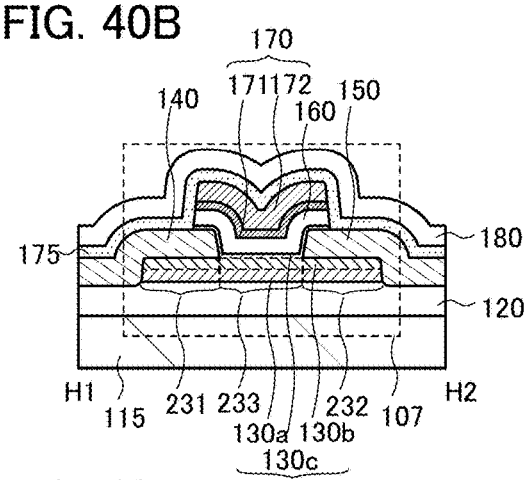
Figure 42A:
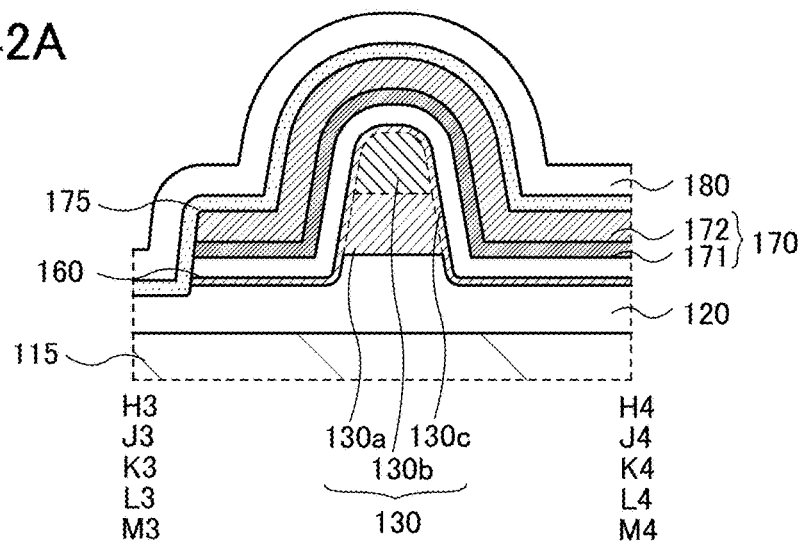
FIGS. 42A to 42D each illustrate a cross section of a transistor in the channel width direction.

The transistor in one embodiment of the present invention may have a structure illustrated in FIGS. 40A and 40B. FIG. 40A is a top view of a transistor 107. A cross section in the direction of dashed-dotted line H1-H2 in FIG. 40A is illustrated in FIG. 40B. A cross section in the direction of dashed-dotted line H3-H4 in FIG. 40A is illustrated in FIG. 42A. The direction of dashed-dotted line H1-H2 is referred to as a channel length direction, and the direction of dashed-dotted line H3-H4 is referred to as a channel width direction.

The transistor 107 includes the insulating layer 120 in contact with the substrate 115; a stack of the oxide semiconductor layers 130a and 130b in contact with the insulating layer 120; the conductive layers 140 and 150 electrically connected to the stack; the oxide semiconductor layer 130c in contact with the stack and the conductive layers 140 and 150; the insulating layer 160 in contact with the oxide semiconductor layer 130c; the conductive layer 170 in contact with the insulating layer 160; the insulating layer 175 in contact with the conductive layers 140 and 150, the oxide semiconductor layer 130c, the insulating layer 160, and the conductive layer 170; and the insulating layer 180 in contact with the insulating layer 175. The insulating layer 180 may function as a planarization film as necessary.

The transistor 107 has the same structure as the transistor 101 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 140 and 150.

Figure 40C:
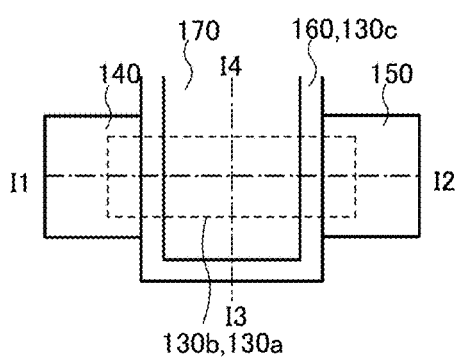
Figure 40D:
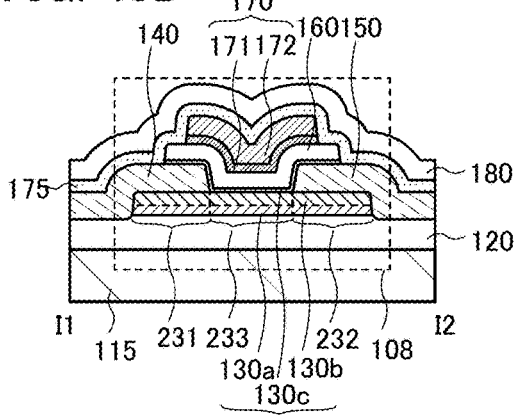
Figure 42B:
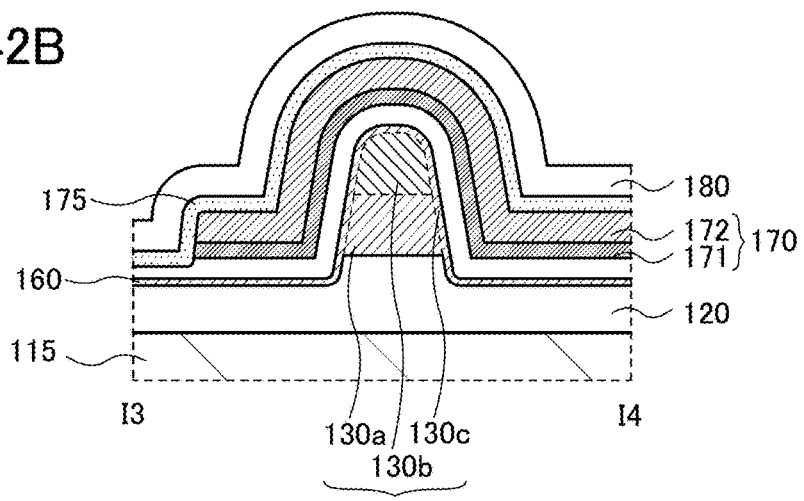

The transistor in one embodiment of the present invention may have a structure illustrated in FIGS. 40C and 40D. FIG. 40C is a top view of a transistor 108. A cross section in the direction of dashed-dotted line I1-I2 in FIG. 40C is illustrated in FIG. 40D. A cross section in the direction of dashed-dotted line I3-I4 in FIG. 40C is illustrated in FIG. 42B. The direction of dashed-dotted line I1-I2 is referred to as a channel length direction, and the direction of dashed-dotted line I3-I4 is referred to as a channel width direction.

The transistor 108 differs from the transistor 107 in that end portions of the insulating layer 160 and the oxide semiconductor layer 130c are not aligned with the end portion of the conductive layer 170.

Figure 40E:
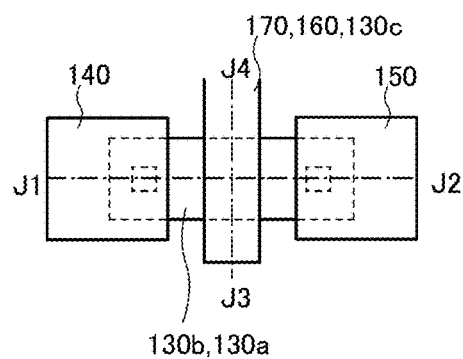
Figure 40F:
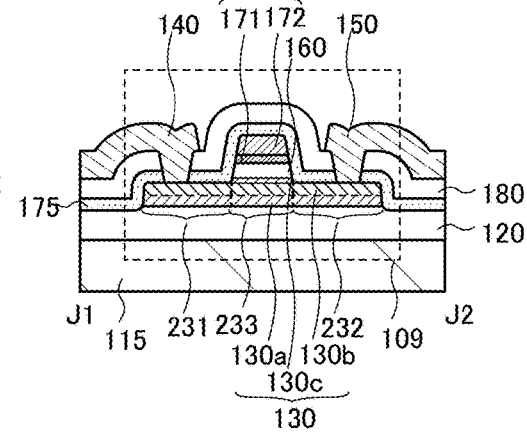

The transistor in one embodiment of the present invention may have a structure illustrated in FIGS. 40E and 40F. FIG. 40E is a top view of a transistor 109. A cross section in the direction of dashed-dotted line J1-J2 in FIG. 40E is illustrated in FIG. 40F. A cross section in the direction of dashed-dotted line J3-J4 in FIG. 40E is illustrated in FIG. 42A. The direction of dashed-dotted line J1-J2 is referred to as a channel length direction, and the direction of dashed-dotted line J3-J4 is referred to as a channel width direction.

The transistor 109 includes the insulating layer 120 in contact with the substrate 115; a stack of the oxide semiconductor layers 130a and 130b in contact with the insulating layer 120; the oxide semiconductor layer 130c in contact with the stack; the insulating layer 160 in contact with the oxide semiconductor layer 130c; the conductive layer 170 in contact with the insulating layer 160; the insulating layer 175 covering the stack, the oxide semiconductor layer 130c, the insulating layer 160, and the conductive layer 170; the insulating layer 180 in contact with the insulating layer 175; and the conductive layers 140 and 150 electrically connected to the stack through openings provided in the insulating layers 175 and 180. The transistor 109 may further include, for example, an insulating layer (planarization film) in contact with the insulating layer 180 and the conductive layers 140 and 150 as necessary.

The transistor 109 has the same structure as the transistor 103 except that the oxide semiconductor layer 130 includes two layers (the oxide semiconductor layers 130a and 130b) in the regions 231 and 232 and that the oxide semiconductor layer 130 includes three layers (the oxide semiconductor layers 130a to 130c) in the region 233.

Figure 41A:
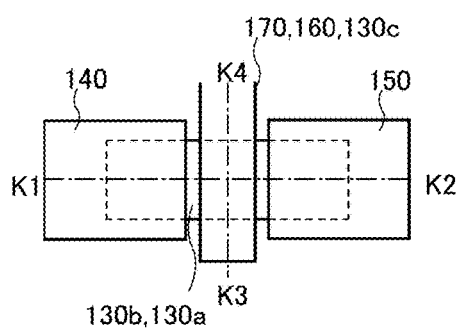
FIGS. 41A to 41F are top views and cross-sectional views illustrating transistors.
Figure 41B:
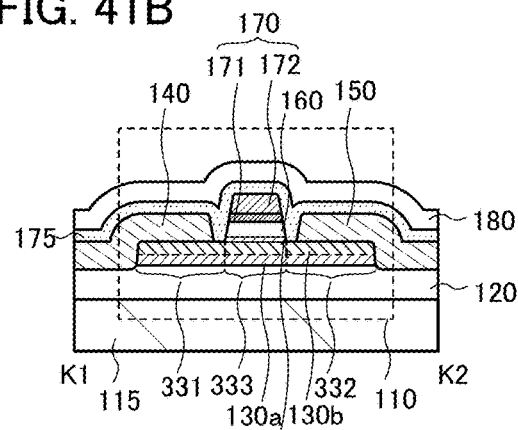

The transistor in one embodiment of the present invention may have a structure illustrated in FIGS. 41A and 41B. FIG. 41A is a top view of a transistor 110. A cross section in the direction of dashed-dotted line K1-K2 in FIG. 41A is illustrated in FIG. 41B. A cross section in the direction of dashed-dotted line K3-K4 in FIG. 41A is illustrated in FIG. 42A. The direction of dashed-dotted line K1-K2 is referred to as a channel length direction, and the direction of dashed-dotted line K3-K4 is referred to as a channel width direction.

The transistor 110 has the same structure as the transistor 104 except that the oxide semiconductor layer 130 includes two layers (the oxide semiconductor layers 130a and 130b) in the regions 331 and 332 and that the oxide semiconductor layer 130 includes three layers (the oxide semiconductor layers 130a to 130c) in the region 333.

Figure 41C:
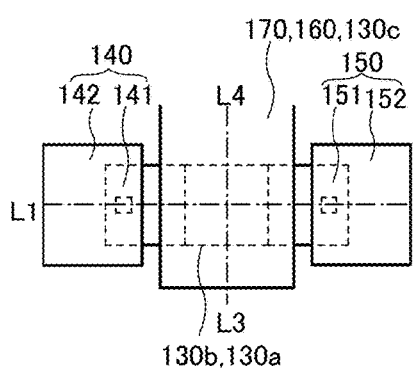
Figure 41D:
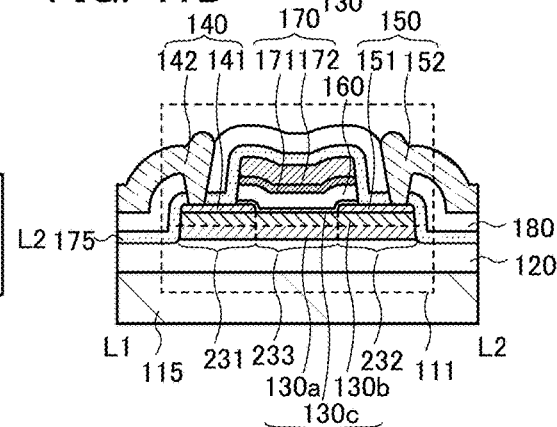

The transistor in one embodiment of the present invention may have a structure illustrated in FIGS. 41C and 41D. FIG. 41C is a top view of a transistor 111. A cross section in the direction of dashed-dotted line L1-L2 in FIG. 41C is illustrated in FIG. 41D. A cross section in the direction of dashed-dotted line L3-L4 in FIG. 41C is illustrated in FIG. 42A. The direction of dashed-dotted line L1-L2 is referred to as a channel length direction, and the direction of dashed-dotted line L3-L4 is referred to as a channel width direction.

The transistor 111 includes the insulating layer 120 in contact with the substrate 115; a stack of the oxide semiconductor layers 130a and 130b in contact with the insulating layer 120; the conductive layers 141 and 151 electrically connected to the stack; the oxide semiconductor layer 130c in contact with the stack and the conductive layers 141 and 151; the insulating layer 160 in contact with the oxide semiconductor layer 130c; the conductive layer 170 in contact with the insulating layer 160; the insulating layer 175 in contact with the stack, the conductive layers 141 and 151, the oxide semiconductor layer 130c, the insulating layer 160, and the conductive layer 170; the insulating layer 180 in contact with the insulating layer 175; and the conductive layers 142 and 152 electrically connected to the conductive layers 141 and 151, respectively, through openings provided in the insulating layers 175 and 180. The transistor 111 may further include, for example, an insulating layer (planarization film) in contact with the insulating layer 180 and the conductive layers 142 and 152 as necessary.

The transistor 111 has the same structure as the transistor 105 except that the oxide semiconductor layer 130 includes two layers (the oxide semiconductor layers 130a and 130b) in the regions 231 and 232, that the oxide semiconductor layer 130 includes three layers (the oxide semiconductor layers 130a to 130c) in the region 233, and that part of the oxide semiconductor layer (the oxide semiconductor layer 130c) exists between the insulating layer 160 and the conductive layers 141 and 151.

Figure 41E:
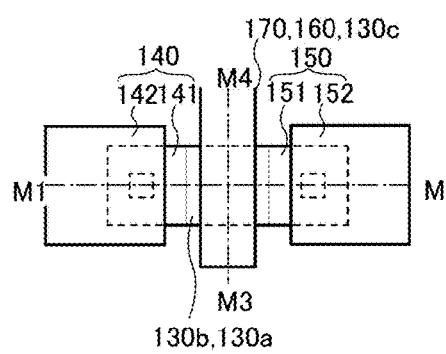
Figure 41F:
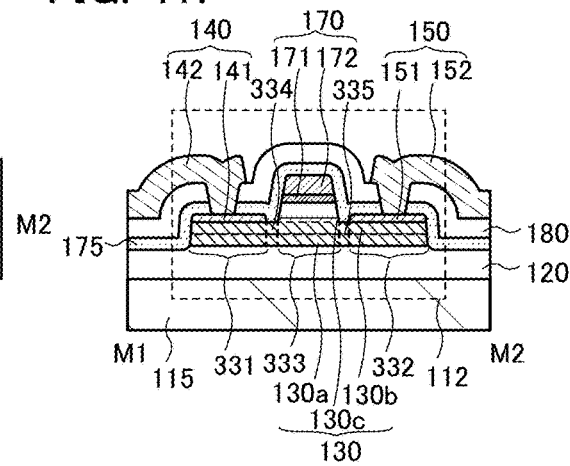

The transistor in one embodiment of the present invention may have a structure illustrated in FIGS. 41E and 41F. FIG. 41E is a top view of a transistor 112. A cross section in the direction of dashed-dotted line M1-M2 in FIG. 41E is illustrated in FIG. 41F. A cross section in the direction of dashed-dotted line M3-M4 in FIG. 41E is illustrated in FIG. 42A. The direction of dashed-dotted line M1-M2 is referred to as a channel length direction, and the direction of dashed-dotted line M3-M4 is referred to as a channel width direction.

The transistor 112 has the same structure as the transistor 106 except that the oxide semiconductor layer 130 includes two layers (the oxide semiconductor layers 130a and 130b) in the regions 331, 332, 334, and 335 and that the oxide semiconductor layer 130 includes three layers (the oxide semiconductor layers 130a to 130c) in the region 333.

Figure 42C:
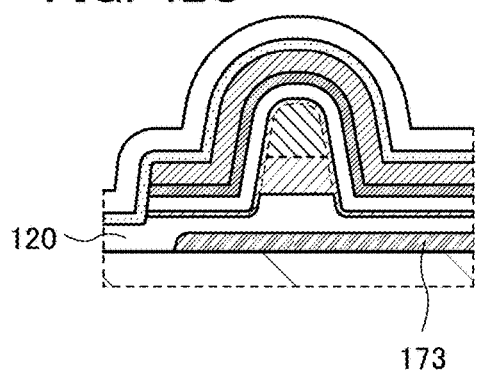
Figure 42D:
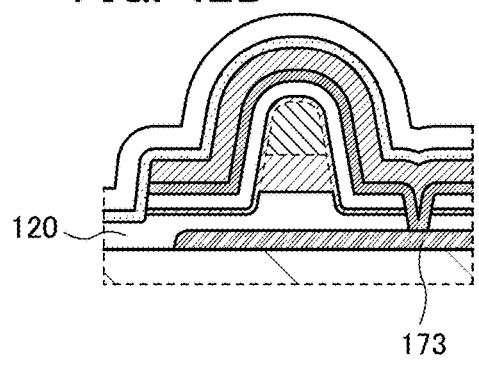
Figure 43A:
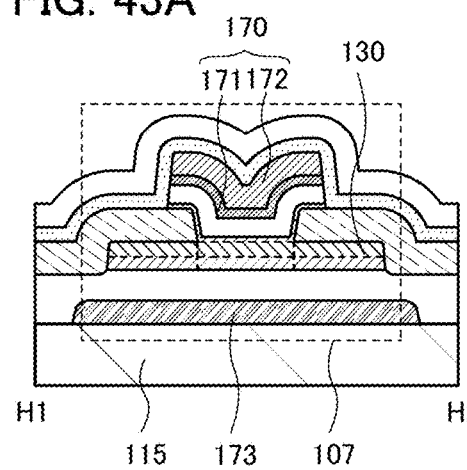
FIGS. 43A to 43F each illustrate a cross section of a transistor in the channel length direction.
Figure 43B:
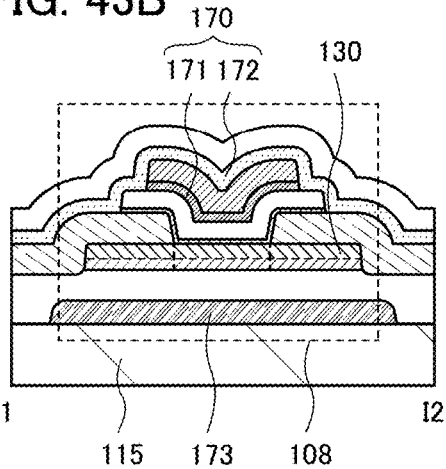
Figure 43C:
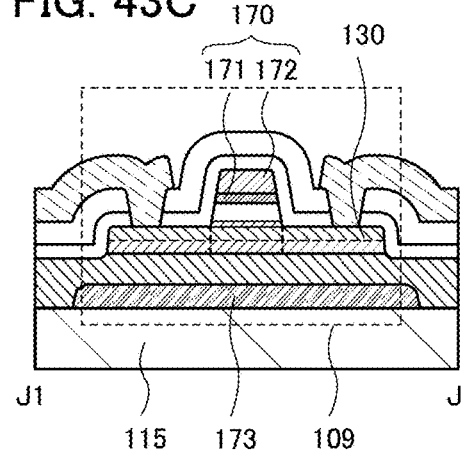
Figure 43D:
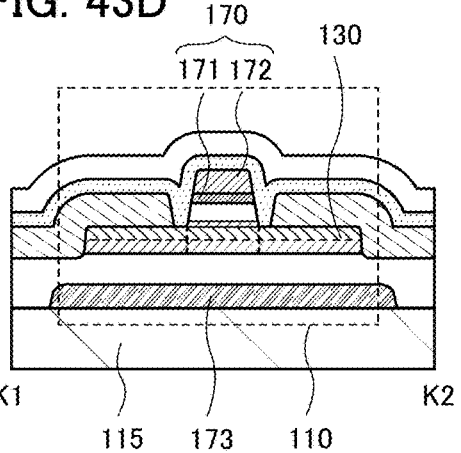
Figure 43E:
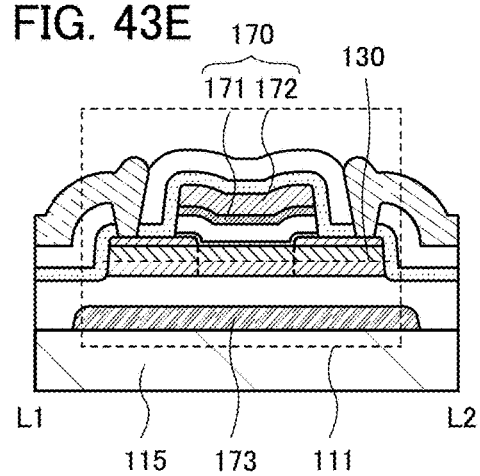
Figure 43F:
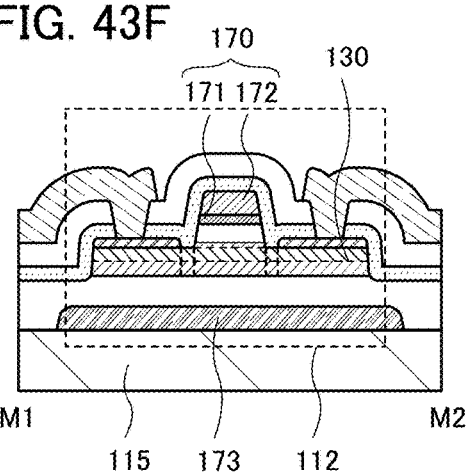

The transistor in one embodiment of the present invention may include the conductive layer 173 between the oxide semiconductor layer 130 and the substrate 115 as illustrated in cross-sectional views in the channel length direction in FIGS. 43A to 43F and cross-sectional views in the channel width direction in FIGS. 42C and 42D. When the conductive layer is used as a second gate electrode layer (back gate), the on-state current can be increased or the threshold voltage can be controlled. In the cross-sectional views in FIGS. 43A to 43F, the width of the conductive layer 173 may be shorter than that of the oxide semiconductor layer 130. Moreover, the width of the conductive layer 173 may be shorter than that of the conductive layer 170.

Figure 44A:
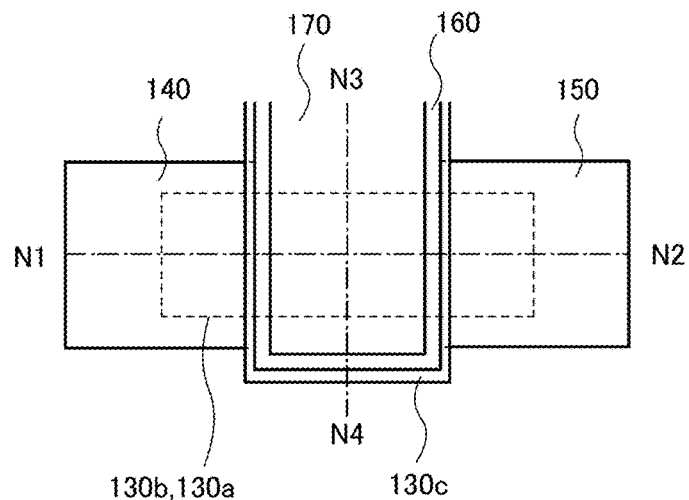
FIGS. 44A and 44B are a top view and cross-sectional views illustrating a transistor.
Figure 44B:
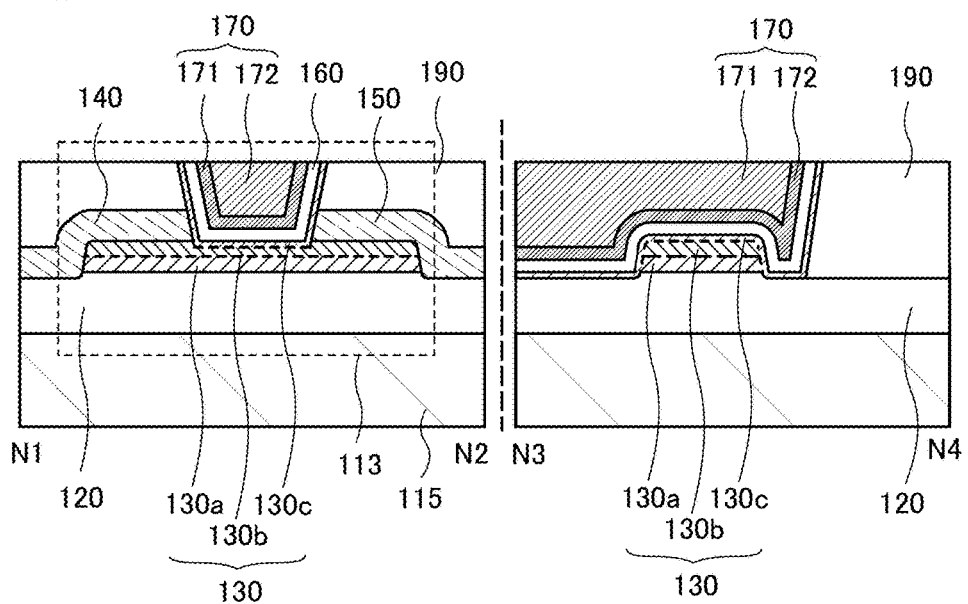

The transistor in one embodiment of the present invention may have a structure illustrated in FIGS. 44A and 44B. FIG. 44A is a top view and FIG. 44B is a cross-sectional view taken along dashed-dotted line N1-N2 and dashed-dotted line N3-N4 in FIG. 44A. Note that for simplification of the drawing, some components are not illustrated in the top view in FIG. 44A.

A transistor 113 illustrated in FIGS. 44A and 44B includes the substrate 115, the insulating layer 120 over the substrate 115, the oxide semiconductor layer 130 (the oxide semiconductor layer 130a, the oxide semiconductor layer 130b, and the oxide semiconductor layer 130c) over the insulating layer 120, the conductive layers 140 and 150 that are in contact with the oxide semiconductor layer 130 and are apart from each other, the insulating layer 160 in contact with the oxide semiconductor layer 130c, and the conductive layer 170 in contact with the insulating layer 160. Note that the oxide semiconductor layer 130c, the insulating layer 160, and the conductive layer 170 are provided in an opening that is provided in an insulating layer 190 over the transistor 113 and reaches the oxide semiconductor layers 130a and 130b and the insulating layer 120.

The transistor 113 has a smaller region in which a conductor serving as a source electrode or a drain electrode overlaps with a conductor serving as a gate electrode than the other transistors described above; thus, the parasitic capacitance in the transistor 113 can be reduced. Therefore, the transistor 113 is preferable as a component of a circuit for which high-speed operation is needed. As illustrated in FIG. 44B, a top surface of the transistor 113 is preferably planarized by a chemical mechanical polishing (CMP) method or the like, but is not necessarily planarized.

Figure 45A:
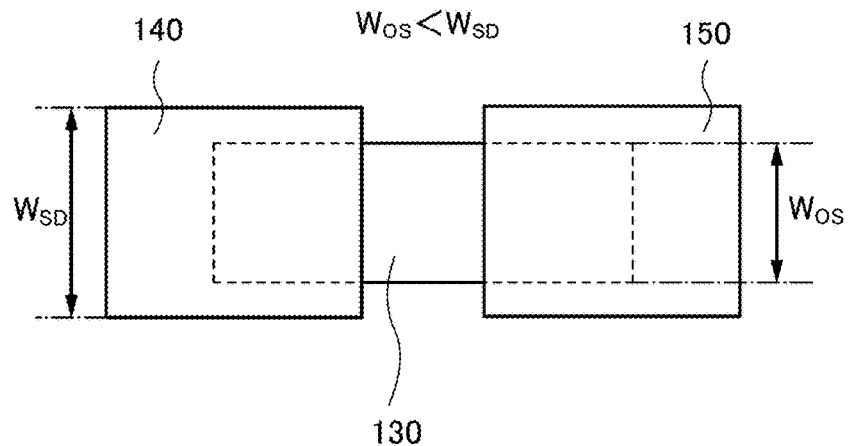
FIGS. 45A to 45C are top views illustrating transistors.
Figure 45B:
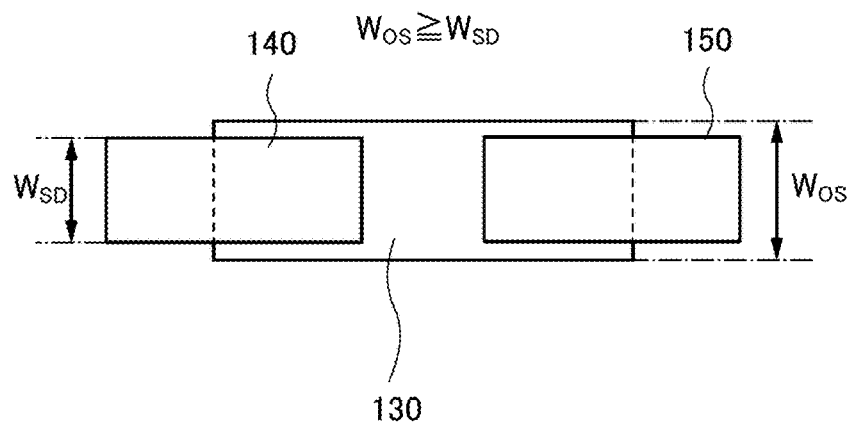
Figure 45C:
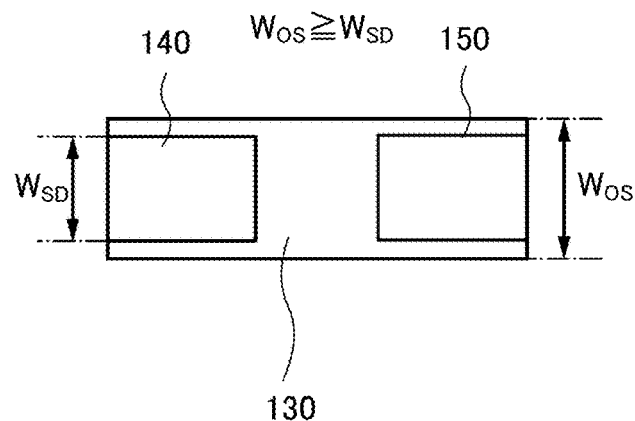

As shown in the top views in FIGS. 45A and 45B (showing only the oxide semiconductor layer 130, the conductive layer 140, and the conductive layer 150), the widths ($W_{SD}$) of the conductive layer 140 (source electrode layer) and the conductive layer 150 (drain electrode layer) in the transistor of one embodiment of the present invention may be either longer than or shorter than the width ($W_{OS}$) of the oxide semiconductor layer 130. When $W_{OS} \geq W_{SD}$ ($W_{SD}$ is less than or equal to $W_{OS}$) is satisfied, a gate electric field is easily applied to the entire oxide semiconductor layer 130, so that electrical characteristics of the transistor can be improved. As illustrated in FIG. 45C, the conductive layers 140 and 150 may be formed only in a region that overlaps with the oxide semiconductor layer 130.

In the transistor in one embodiment of the present invention (any of the transistors 101 to 113), the conductive layer 170 functioning as a gate electrode layer electrically surrounds the oxide semiconductor layer 130 in the channel width direction with the insulating layer 160 functioning as a gate insulating film positioned therebetween. This structure increases the on-state current. Such a transistor structure is referred to as a surrounded channel (s-channel) structure.

In the transistor including the oxide semiconductor layers 130a and 130b and the transistor including the oxide semiconductor layers 130a to 130c, selecting appropriate materials for the two or three layers forming the oxide semiconductor layer 130 allows current to flow in the oxide semiconductor layer 130b. Since current flows in the oxide semiconductor layer 130b, the current is hardly influenced by interface scattering, leading to a high on-state current. Thus, increasing the thickness of the oxide semiconductor layer 130b improves the on-state current in some cases.

With the above structure, the electrical characteristics of the transistor can be improved.

The structures described in this embodiment can be used in appropriate combination with any of the structures described in the other embodiments.

Embodiment 4

In this embodiment, components of the transistors described in Embodiment 3 are described in detail.

As the substrate 115, a glass substrate, a quartz substrate, a semiconductor substrate, a ceramic substrate, a metal substrate with an insulated surface, or the like can be used. Alternatively, a silicon substrate provided with a transistor, a photodiode, or the like can be used, and an insulating layer, a wiring, a conductor functioning as a contact plug, and the like may be provided over the silicon substrate. Note that when p-channel transistors are formed using the silicon substrate, a silicon substrate with n⁻-type conductivity is preferably used. Alternatively, an SOI substrate including an n⁻-type or i-type silicon layer may be used. In the case where a p-channel transistor is formed on the silicon substrate, it is preferable to use a silicon substrate in which a plane where the transistor is formed is a (110) plane orientation. Forming a p-channel transistor with the (110) plane can increase mobility.

The insulating layer 120 can have a function of supplying oxygen to the oxide semiconductor layer 130 as well as a function of preventing diffusion of impurities from a component included in the substrate 115. For this reason, the insulating layer 120 is preferably an insulating film containing oxygen and further preferably, the insulating layer 120 is an insulating film containing oxygen in which the oxygen content is higher than that in the stoichiometric composition. The insulating layer 120 is a film in which the amount of released oxygen when converted into oxygen atoms is preferably greater than or equal to $1.0 \times 10^{19}$ atoms/cm³ in TDS analysis. In the TDS analysis, the film surface temperature is higher than or equal to 100° C. and lower than or equal to 700° C., or higher than or equal to 100° C. and lower than or equal to 500° C. In the case where the substrate 115 is provided with another device, the insulating layer 120 also has a function of an interlayer insulating film. In that case, the insulating layer 120 is preferably subjected to planarization treatment such as CMP treatment so as to have a flat surface.

For example, the insulating layer 120 can be formed using an oxide insulating film including aluminum oxide, magnesium oxide, silicon oxide, silicon oxynitride, gallium oxide, germanium oxide, yttrium oxide, zirconium oxide, lanthanum oxide, neodymium oxide, hafnium oxide, tantalum oxide, or the like; a nitride insulating film including silicon nitride, silicon nitride oxide, aluminum nitride, aluminum nitride oxide, or the like; or a mixed material of any of these. The insulating layer 120 may be a stack of any of the above materials.

In this embodiment, detailed description is given mainly on the case where the oxide semiconductor layer 130 of the transistor has a three-layer structure in which the oxide semiconductor layers 130a to 130c are sequentially stacked from the insulating layer 120 side.

Note that in the case where the oxide semiconductor layer 130 is a single layer, a layer corresponding to the oxide semiconductor layer 130b described in this embodiment is used.

In the case where the oxide semiconductor layer 130 has a two-layer structure, a stack in which layers corresponding to the oxide semiconductor layer 130a and the oxide semiconductor layer 130b described in this embodiment are sequentially stacked from the insulating layer 120 side is used. In such a case, the oxide semiconductor layers 130a and 130b can be replaced with each other.

In the case where the oxide semiconductor layer 130 has a stacked-layer structure of four or more layers, for example, a structure in which another oxide semiconductor layer is added to the three-layer stack of the oxide semiconductor layer 130 described in this embodiment can be employed.

For the oxide semiconductor layer 130b, for example, an oxide semiconductor whose electron affinity (an energy difference between a vacuum level and the conduction band minimum) is higher than those of the oxide semiconductor layers 130a and 130c is used. The electron affinity can be obtained by subtracting an energy difference between the conduction band minimum and the valence band maximum (what is called an energy gap) from an energy difference between the vacuum level and the valence band maximum (what is called an ionization potential).

The oxide semiconductor layers 130a and 130c each contain one or more kinds of metal elements contained in the oxide semiconductor layer 130b. For example, the oxide semiconductor layers 130a and 130c are preferably formed using an oxide semiconductor whose conduction band minimum is closer to a vacuum level than that of the oxide semiconductor layer 130b by 0.05 eV or more, 0.07 eV or more, 0.1 eV or more, or 0.15 eV or more and 2 eV or less, 1 eV or less, 0.5 eV or less, or 0.4 eV or less.

In such a structure, when an electric field is applied to the conductive layer 170, a channel is formed in the oxide semiconductor layer 130b whose conduction band minimum is the lowest in the oxide semiconductor layer 130. Therefore, the oxide semiconductor layer 130b can be regarded as having a region serving as a semiconductor, while the oxide semiconductor layer 130a and the oxide semiconductor layer 130c can be regarded as having a region serving as an insulator or a semi-insulator.

Furthermore, since the oxide semiconductor layer 130a contains one or more kinds of metal elements contained in the oxide semiconductor layer 130b, an interface state is unlikely to be formed at the interface between the oxide semiconductor layers 130a and 130b, compared with the interface between the oxide semiconductor layer 130b and the insulating layer 120 on the assumption that the oxide semiconductor layer 130b is in contact with the insulating layer 120. The interface state sometimes forms a channel; therefore, the threshold voltage of the transistor is changed in some cases. Thus, with the oxide semiconductor layer 130a, variations in electrical characteristics of the transistor, such as a threshold voltage, can be reduced. Moreover, the reliability of the transistor can be improved.

Since the oxide semiconductor layer 130c contains one or more kinds of metal elements contained in the oxide semiconductor layer 130b, scattering of carriers is unlikely to occur at the interface between the oxide semiconductor layers 130b and 130c, compared with the interface between the oxide semiconductor layer 130b and the gate insulating film (the insulating layer 160) on the assumption that the oxide semiconductor layer 130b is in contact with the gate insulating film. Thus, with the oxide semiconductor layer 130c, the field-effect mobility of the transistor can be increased.

For the oxide semiconductor layers 130a and 130c, for example, a material containing Al, Ti, Ga, Ge, Y, Zr, Sn, La, Ce, or Hf with a higher atomic ratio than that used for the oxide semiconductor layer 130b can be used. Specifically, the atomic ratio of any of the above metal elements in the oxide semiconductor layers 130a and 130c is 1.5 or more times, preferably 2 or more times, further preferably 3 or more times as large as that in the oxide semiconductor layer 130b. Any of the above metal elements is strongly bonded to oxygen and thus has a function of suppressing generation of an oxygen vacancy in the oxide semiconductor layers. That is, an oxygen vacancy is less likely to be generated in the oxide semiconductor layers 130a and 130c than in the oxide semiconductor layer 130b.

An oxide semiconductor that can be used for each of the oxide semiconductor layers 130a to 130c preferably contains at least In or Zn. Both In and Zn are preferably contained. In order to reduce variations in electrical characteristics of the transistor including the oxide semiconductor, the oxide semiconductor preferably contains a stabilizer in addition to In and Zn.

Examples of a stabilizer include Ga, Sn, Hf, Al, and Zr. Other examples of the stabilizer include lanthanoids such as La, Ce, Pr, Nd, Sm, Eu, Gd, Tb, Dy, Ho, Er, Tm, Yb, and Lu.

As the oxide semiconductor, for example, any of the following can be used: indium oxide, tin oxide, gallium oxide, zinc oxide, an In—Zn oxide, a Sn—Zn oxide, an Al—Zn oxide, a Zn—Mg oxide, a Sn—Mg oxide, an In—Mg oxide, an In—Ga oxide, an In—Ga—Zn oxide, an In—Al—Zn oxide, an In—Sn—Zn oxide, a Sn—Ga—Zn oxide, an Al—Ga—Zn oxide, a Sn—Al—Zn oxide, an In—Hf—Zn oxide, an In—La—Zn oxide, an In—Ce—Zn oxide, an In—Pr—Zn oxide, an In—Nd—Zn oxide, an In—Sm—Zn oxide, an In—Eu—Zn oxide, an In—Gd—Zn oxide, an In—Tb—Zn oxide, an In—Dy—Zn oxide, an In—Ho—Zn oxide, an In—Er—Zn oxide, an In—Tm—Zn oxide, an In—Yb—Zn oxide, an In—Lu—Zn oxide, an In—Sn—Ga—Zn oxide, an In—Hf—Ga—Zn oxide, an In—Al—Ga—Zn oxide, an In—Sn—Al—Zn oxide, an In—Sn—Hf—Zn oxide, and an In—Hf—Al—Zn oxide.

For example, an In—Ga—Zn oxide means an oxide containing In, Ga, and Zn as its main components. The In—Ga—Zn oxide may contain another metal element in addition to In, Ga, and Zn. In this specification, a film containing the In—Ga—Zn oxide is also referred to as an IGZO film.

A material represented by $InMO_3(ZnO)_m$ (m>0, where m is not an integer) may be used. Note that M represents one or more metal elements selected from Ga, Y, Zr, La, Ce, and Nd. Alternatively, a material represented by $In_2SnO_5(ZnO)_n$ (n>0, where n is an integer) may be used.

When each of the oxide semiconductor layers 130a to 130c is an In-M-Zn oxide containing at least indium, zinc, and M (M is a metal such as Al, Ti, Ga, Ge, Y, Zr, Sn, La, Ce, or Hf), in the case where the oxide semiconductor layer 130a has an atomic ratio of In to M to Zn that is $x_1:y_1:z_1$, the oxide semiconductor layer 130b has an atomic ratio of In to M to Zn that is $x_2:y_2:z_2$, and the oxide semiconductor layer 130c has an atomic ratio of In to M to Zn that is $x_3:y_3:z_3$, each of $y_1/x_1$ and $y_3/x_3$ is preferably larger than $y_2/x_2$. Each of $y_1/x_1$ and $y_3/x_3$ is 1.5 or more times, preferably 2 or more times, more preferably 3 or more times as large as $y_2/x_2$. At this time, when $y_2$ is greater than or equal to $x_2$ in the oxide semiconductor layer 130b, the transistor can have stable electrical characteristics. However, when $y_2$ is 3 or more times as large as $x_2$, the field-effect mobility of the transistor is reduced; accordingly, $y_2$ is preferably smaller than 3 times $x_2$.

In the case where Zn and O are not taken into consideration, the proportion of In and the proportion of M in each of the oxide semiconductor layers 130a and 130c are preferably less than 50 atomic % and greater than or equal to 50 atomic %, respectively, more preferably less than 25 atomic % and greater than or equal to 75 atomic %, respectively. Furthermore, in the case where Zn and O are not taken into consideration, the proportion of In and the proportion of M in the oxide semiconductor layer 130b are preferably greater than or equal to 25 atomic % and less than 75 atomic %, respectively, more preferably greater than or equal to 34 atomic % and less than 66 atomic %, respectively.

The indium content in the oxide semiconductor layer 130b is preferably higher than those in the oxide semiconductor layers 130a and 130c. In an oxide semiconductor, the s orbital of heavy metal mainly contributes to carrier transfer, and when the proportion of In in the oxide semiconductor is increased, overlap of the s orbitals is likely to be increased. Therefore, an oxide in which the proportion of In is higher than that of M has higher mobility than an oxide in which the proportion of In is equal to or lower than that of M Thus, with the use of an oxide having a high content of indium for the oxide semiconductor layer 130b, a transistor having high field-effect mobility can be obtained.

The thickness of the oxide semiconductor layer 130a is greater than or equal to 3 nm and less than or equal to 100 nm, preferably greater than or equal to 5 nm and less than or equal to 50 nm, more preferably greater than or equal to 5 nm and less than or equal to 25 nm. The thickness of the oxide semiconductor layer 130b is greater than or equal to 3 nm and less than or equal to 200 nm, preferably greater than or equal to 5 nm and less than or equal to 150 nm, more preferably greater than or equal to 10 nm and less than or equal to 100 nm. The thickness of the oxide semiconductor layer 130c is greater than or equal to 1 nm and less than or equal to 50 nm, preferably greater than or equal to 2 nm and less than or equal to 30 nm, more preferably greater than or equal to 3 nm and less than or equal to 15 nm. In addition, the oxide semiconductor layer 130b is preferably thicker than the oxide semiconductor layer 130c.

In order that a transistor in which a channel is formed in an oxide semiconductor layer have stable electrical characteristics, it is effective to make the oxide semiconductor layer intrinsic (i-type) or substantially intrinsic by reducing the concentration of impurities in the oxide semiconductor layer. The term "substantially intrinsic" refers to a state where an oxide semiconductor layer has a carrier density lower than $1\times10^{19}$ cm$^{-3}$, lower than $1\times10^{15}$ cm$^{-3}$, lower than $1\times10^{13}$ cm$^{-3}$, or lower than $1\times10^{8}$ cm$^{3}$, and higher than or equal to $1\times10^{9}$ cm$^{3}$.

In the oxide semiconductor layer, hydrogen, nitrogen, carbon, silicon, and a metal element other than main components of the oxide semiconductor layer are impurities. For example, hydrogen and nitrogen form donor levels to increase the carrier density, and silicon forms impurity levels in the oxide semiconductor layer. The impurity levels serve as traps and might cause deterioration of electrical characteristics of the transistor. Therefore, it is preferable to reduce the concentration of the impurities in the oxide semiconductor layers 130a to 130c and at interfaces between the oxide semiconductor layers.

In order to make the oxide semiconductor layer intrinsic or substantially intrinsic, the oxide semiconductor layer is controlled to have a region in which the concentration of hydrogen estimated by secondary ion mass spectrometry (SIMS) is lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, still more preferably lower than or equal to $5\times10^{18}$ atoms/cm$^3$ and is higher than or equal to $1\times10^{17}$ atoms/cm$^3$. In addition, the oxide semiconductor layer is controlled to have a region in which the concentration of nitrogen is lower than $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$ and is higher than or equal to $5\times10^{16}$ atoms/cm$^3$.

The high concentration of silicon or carbon might reduce the crystallinity of the oxide semiconductor layer. In order not to lower the crystallinity of the oxide semiconductor layer, the oxide semiconductor layer is controlled to have a region in which the concentration of silicon is lower than $1\times10^{19}$ atoms/cm$^3$, preferably lower than $5\times10^{18}$ atoms/cm$^3$ and is higher than or equal to $1\times10^{18}$ atoms/cm$^3$. Furthermore, the oxide semiconductor layer is controlled to have a region in which the concentration of carbon is lower than $1\times10^{19}$ atoms/cm$^3$, preferably lower than $5\times10^{18}$ atoms/cm$^3$, more preferably lower than $1\times10^{18}$ atoms/cm$^3$ and is higher than or equal to $6\times10^{17}$ atoms/cm$^3$.

As described above, a transistor in which a highly purified oxide semiconductor film is used for a channel formation region exhibits an extremely low off-state current. When voltage between a source and a drain is set at about 0.1 V, 5 V, or 10 V, for example, the off-state current per channel width of the transistor can be as low as several yoctoamperes per micrometer to several zeptoamperes per micrometer.

As the gate insulating film of the transistor, an insulating film containing silicon is used in many cases; thus, it is preferable that, as in the transistor of one embodiment of the present invention, a region of the oxide semiconductor layer that serves as a channel not be in contact with the gate insulating film for the above reason. In the case where a channel is formed at the interface between the gate insulating film and the oxide semiconductor layer, scattering of carriers occurs at the interface, so that the field-effect mobility of the transistor is reduced in some cases. Also from the view of the above, it is preferable that the region of the oxide semiconductor layer that serves as a channel be separated from the gate insulating film.

Accordingly, with the oxide semiconductor layer 130 having a stacked-layer structure including the oxide semiconductor layers 130a to 130c, a channel can be formed in the oxide semiconductor layer 130b; thus, the transistor can have high field-effect mobility and stable electrical characteristics.

In a band structure, the conduction band minimum changes continuously within the oxide semiconductor layers 130a to 130c. This can be understood also from the fact that the compositions of the oxide semiconductor layers 130a to 130c are close to one another and oxygen is easily diffused among the oxide semiconductor layers 130a to 130c. Thus, the oxide semiconductor layers 130a to 130c have a continuous physical property though they have different compositions and form a stack. In the drawings, interfaces between the oxide semiconductor layers of the stack are indicated by dotted lines.

The oxide semiconductor layer 130 in which layers containing the same main components are stacked is formed to have not only a simple stacked-layer structure of the layers but also continuous junction (here, in particular, a well structure having a U shape in which the conduction band minimum is continuously changed between the layers (U-shape well)). In other words, the stacked-layer structure is formed such that there exists no impurity that forms a defect level such as a trap center or a recombination center at each interface. If impurities exist between the stacked oxide semiconductor layers, the continuity of the energy band is lost and carriers disappear by a trap or recombination at the interface.

For example, an In—Ga—Zn oxide whose atomic ratio of In to Ga to Zn is 1:3:2, 1:3:3, 1:3:4, 1:3:6, 1:4:5, 1:6:4, or 1:9:6 can be used for the oxide semiconductor layers 130a and 130c, and an In—Ga—Zn oxide whose atomic ratio of In to Ga to Zn is 1:1:1, 2:1:3, 5:5:6, 3:1:2, 4:2:3, or 4:2:4.1 can be used for the oxide semiconductor layer 130b. In the case where the oxide semiconductor layers 130a, 130b, and 130c are formed using the above-described oxides as sputtering targets, the atomic ratios of the oxide semiconductor layers are not necessarily consistent with those of their respective sputtering targets and may vary from those of the sputtering targets within a range of ±40%.

The oxide semiconductor layer 130b of the oxide semiconductor layer 130 serves as a well, so that a channel is formed in the oxide semiconductor layer 130b. Since the conduction band minimum is continuously changed, the oxide semiconductor layer 130 can also be referred to as a U-shaped well. Furthermore, a channel formed to have such a structure can also be referred to as a buried channel.

Note that trap levels due to impurities or defects might be formed in the vicinity of the interface between an insulating layer such as a silicon oxide film and each of the oxide semiconductor layers 130a and 130c. The oxide semiconductor layer 130b can be distanced away from the trap levels owing to the existence of the oxide semiconductor layers 130a and 130c.

However, when the energy differences between the conduction band minimum of the oxide semiconductor layer 130b and the conduction band minimum of each of the oxide semiconductor layers 130a and 130c are small, an electron in the oxide semiconductor layer 130b might reach the trap level by passing over the energy differences. When the electron is trapped in the trap level, negative charge is generated at the interface with the insulating layer, so that the threshold voltage of the transistor is shifted in the positive direction.

The oxide semiconductor layers 130a to 130c preferably include crystal parts. In particular, when crystals with c-axis alignment are used, the transistor can have stable electrical characteristics. Moreover, crystals with c-axis alignment are resistant to bending; therefore, using such crystals can improve the reliability of a semiconductor device using a flexible substrate.

As the conductive layer 140 functioning as a source electrode layer and the conductive layer 150 functioning as a drain electrode layer, for example, a single layer or a stacked layer formed using a material selected from Al, Cr, Cu, Ta, Ti, Mo, W, Ni, Mn, Nd, and Sc and alloys of any of these metal materials can be used. Typically, it is preferable to use Ti, which is particularly easily bonded to oxygen, or W, which has a high melting point and thus allows subsequent processes to be performed at relatively high temperatures. It is also possible to use a stack of any of the above materials and Cu or an alloy such as Cu—Mn, which has low resistance. In the transistors 105, 106, 111, and 112, for example, it is possible to use W for the conductive layers 141 and 151 and use a stack of Ti and Al for the conductive layers 142 and 152.

The above materials are capable of extracting oxygen from an oxide semiconductor film. Therefore, in a region of the oxide semiconductor layer that is in contact with any of the above materials, oxygen is released from the oxide semiconductor layer and an oxygen vacancy is formed. Hydrogen slightly contained in the layer and the oxygen vacancy are bonded to each other, so that the region is markedly changed to an n-type region. Accordingly, the n-type region can serve as a source or a drain of the transistor.

In the case where W is used for the conductive layers 140 and 150, the conductive layers 140 and 150 may be doped with nitrogen. Doping with nitrogen can appropriately lower the capability of extracting oxygen and prevent the n-type region from spreading to a channel region. It is possible to prevent the n-type region from spreading to a channel region also by using a stack of W and an n-type semiconductor layer as the conductive layers 140 and 150 and putting the n-type semiconductor layer in contact with the oxide semiconductor layer. As the n-type semiconductor layer, an In—Ga—Zn oxide, zinc oxide, indium oxide, tin oxide, indium tin oxide, or the like to which nitrogen is added can be used.

The insulating layer 160 functioning as a gate insulating film can be formed using an insulating film containing one or more of aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 160 may be a stack including any of the above materials. The insulating layer 160 may contain La, N, Zr, or the like as an impurity.

An example of a stacked-layer structure of the insulating layer 160 is described. The insulating layer 160 includes, for example, oxygen, nitrogen, silicon, or hafnium. Specifically, the insulating layer 160 preferably includes hafnium oxide and silicon oxide or silicon oxynitride.

Hafnium oxide and aluminum oxide have higher dielectric constants than silicon oxide and silicon oxynitride. Therefore, the insulating layer 160 using hafnium oxide or aluminum oxide can have larger thickness than the insulating layer 160 using silicon oxide, so that leakage current due to tunnel current can be reduced. That is, a transistor with a low off-state current can be provided. Moreover, hafnium oxide with a crystalline structure has a higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited to these examples.

For the insulating layers 120 and 160 in contact with the oxide semiconductor layer 130, a film that releases less nitrogen oxide is preferably used. In the case where the oxide semiconductor is in contact with an insulating layer that releases a large amount of nitrogen oxide, the density of states due to nitrogen oxide increases in some cases. For the insulating layers 120 and 160, for example, an oxide insulating layer such as a silicon oxynitride film or an aluminum oxynitride film that releases less nitrogen oxide can be used.

A silicon oxynitride film that releases less nitrogen oxide is a film that releases ammonia more than nitrogen oxide in TDS; the amount of released ammonia is typically greater than or equal to $1 \times 10^{18}/cm^3$ and less than or equal to $5 \times 10^{19}/cm^3$. Note that the amount of released ammonia is the amount of ammonia released by heat treatment with which the surface temperature of the film becomes higher than or equal to 50° C. and lower than or equal to 650° C., preferably higher than or equal to 50° C. and lower than or equal to 550° C.

By using the above oxide insulating layer for the insulating layers 120 and 160, a shift in the threshold voltage of the transistor can be reduced, which leads to reduced fluctuations in the electrical characteristics of the transistor.

For the conductive layer 170 functioning as a gate electrode layer, for example, a conductive film formed using Al, Ti, Cr, Co, Ni, Cu, Y, Zr, Mo, Ru, Ag, Mn, Nd, Sc, Ta, or W can be used. Alternatively, an alloy or a conductive nitride of any of these materials may be used. Alternatively, a stack of a plurality of materials selected from these materials, alloys of these materials, and conductive nitrides of these materials may be used. Typically, tungsten, a stack of tungsten and titanium nitride, a stack of tungsten and tantalum nitride, or the like can be used. Alternatively, Cu or an alloy such as Cu—Mn, which has low resistance, or a stack of any of the above materials and Cu or an alloy such as Cu—Mn may be used. In this embodiment, tantalum nitride is used for the conductive layer 171 and tungsten is used for the conductive layer 172 to form the conductive layer 170.

As the insulating layer 175, a silicon nitride film, an aluminum nitride film, or the like containing hydrogen can be used. In the transistors 103, 104, 106, 109, 110, and 112 described in Embodiment 3, when an insulating film containing hydrogen is used as the insulating layer 175, part of the oxide semiconductor layer can have n-type conductivity. In addition, a nitride insulating film functions as a blocking film against moisture and the like and can improve the reliability of the transistor.

An aluminum oxide film can also be used as the insulating layer 175. It is particularly preferable to use an aluminum oxide film as the insulating layer 175 in the transistors 101, 102, 105, 107, 108, and 111 described in Embodiment 3. The aluminum oxide film has a significant effect of blocking both oxygen and impurities such as hydrogen and moisture. Accordingly, during and after the manufacturing process of the transistor, the aluminum oxide film can suitably function as a protective film that has effects of preventing entry of impurities such as hydrogen and moisture into the oxide semiconductor layer 130, preventing release of oxygen from the oxide semiconductor layer, and preventing unnecessary release of oxygen from the insulating layer 120. Furthermore, oxygen contained in the aluminum oxide film can be diffused into the oxide semiconductor layer.

Furthermore, the insulating layer 180 is preferably formed over the insulating layer 175. The insulating layer 180 can be formed using an insulating film containing one or more of magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. The insulating layer 180 may be a stack of any of the above materials.

Here, like the insulating layer 120, the insulating layer 180 preferably contains oxygen more than that in the stoichiometric composition. Oxygen released from the insulating layer 180 can be diffused into the channel formation region in the oxide semiconductor layer 130 through the insulating layer 160, so that oxygen vacancies formed in the channel formation region can be filled with oxygen. In this manner, stable electrical characteristics of the transistor can be achieved.

High integration of a semiconductor device requires miniaturization of a transistor. However, it is known that miniaturization of a transistor causes deterioration of electrical characteristics of the transistor. In particular, a decrease in channel width causes a reduction in on-state current.

In the transistors 107 to 112 in one embodiment of the present invention, the oxide semiconductor layer 130c is formed to cover the oxide semiconductor layer 130b where a channel is formed; thus, a channel formation layer is not in contact with the gate insulating film. Accordingly, scattering of carriers at the interface between the channel formation layer and the gate insulating film can be reduced and the on-state current of the transistor can be increased.

In the transistor in one embodiment of the present invention, as described above, the gate electrode layer (the conductive layer 170) is formed to electrically surround the oxide semiconductor layer 130 in the channel width direction; accordingly, a gate electric field is applied to the oxide semiconductor layer 130 in a direction perpendicular to its side surface in addition to a direction perpendicular to its top surface. In other words, a gate electric field is applied to the entire channel formation layer and an effective channel width is increased, leading to a further increase in on-state current.

Furthermore, in the transistor in one embodiment of the present invention in which the oxide semiconductor layer 130 has a two-layer structure or a three-layer structure, since the oxide semiconductor layer 130b where a channel is formed is provided over the oxide semiconductor layer 130a, an interface state is less likely to be formed. In the transistor in one embodiment of the present invention in which the oxide semiconductor layer 130 has a three-layer structure, since the oxide semiconductor layer 130b is positioned at the middle of the three-layer structure, the influence of an impurity that enters from upper and lower layers on the oxide semiconductor layer 130b can also be eliminated. Therefore, the transistor can achieve not only the increase in on-state current but also stabilization of the threshold voltage and a reduction in S value (subthreshold value). Thus, current at a gate voltage VG of 0 V can be reduced and power consumption can be reduced. In addition, since the threshold voltage of the transistor becomes stable, long-term reliability of the semiconductor device can be improved. Furthermore, the transistor in one embodiment of the present invention is suitable for a highly integrated semiconductor device because deterioration of electrical characteristics due to miniaturization is reduced.

Although the variety of films such as the metal films, the semiconductor films, and the inorganic insulating films that are described in this embodiment typically can be formed by sputtering or plasma-enhanced CVD, such films may be formed by another method such as thermal CVD. Examples of the thermal CVD include metal organic chemical vapor deposition (MOCVD) and atomic layer deposition (ALD).

Since plasma is not used for deposition, thermal CVD has an advantage that no defect due to plasma damage is generated.

Deposition by thermal CVD may be performed in such a manner that a source gas and an oxidizer are supplied to the chamber at the same time, the pressure in the chamber is set to an atmospheric pressure or a reduced pressure, and reaction is caused in the vicinity of the substrate or over the substrate.

Deposition by ALD is performed in such a manner that the pressure in a chamber is set to an atmospheric pressure or a reduced pressure, source gases for reaction are introduced into the chamber and reacted, and then the sequence of gas introduction is repeated. An inert gas (e.g., argon or nitrogen) may be introduced as a carrier gas with the source gases. For example, two or more kinds of source gases may be sequentially supplied to the chamber. In that case, after reaction of a first source gas, an inert gas is introduced, and then a second source gas is introduced so that the source gases are not mixed. Alternatively, the first source gas may be exhausted by vacuum evacuation instead of introduction of the inert gas, and then the second source gas may be introduced. The first source gas is adsorbed on the surface of the substrate and reacted to form a first layer, and then, the second source gas introduced is adsorbed and reacted. As a result, a second layer is stacked over the first layer, so that a thin film is formed. The sequence of gas introduction is controlled and repeated more than once until desired thickness is obtained, so that a thin film with excellent step coverage can be formed. The thickness of the thin film can be adjusted by the number of repetition times of the sequence of gas introduction; therefore, ALD makes it possible to accurately adjust thickness and thus is suitable for manufacturing a minute FET.

The variety of films such as the metal film, the semiconductor film, and the inorganic insulating film that have been disclosed in the above embodiments can be formed by thermal CVD such as MOCVD or ALD. For example, in the case where an In—Ga—Zn—O film is formed, trimethylindium ($In(CH_3)_3$), trimethylgallium ($Ga(CH_3)_3$), and dimethylzinc ($Zn(CH_3)_2$) can be used. Without limitation to the above combination, triethylgallium ($Ga(C_2H_5)_3$) can be used instead of trimethylgallium and diethylzinc ($Zn(C_2H_5)_2$) can be used instead of dimethylzinc.

For example, in the case where a hafnium oxide film is formed by a deposition apparatus using ALD, two kinds of gases, i.e., ozone ($O_3$) as an oxidizer and a source gas that is obtained by vaporizing liquid containing a solvent and a hafnium precursor (hafnium alkoxide and a hafnium amide such as tetrakis(dimethylamide)hafnium (TDMAH, Hf[N$(CH_3)_2]_4$) and tetrakis(ethylmethylamide)hafnium) are used.

For example, in the case where an aluminum oxide film is formed by a deposition apparatus using ALD, two kinds of gases, i.e., $H_2O$ as an oxidizer and a source gas that is obtained by vaporizing liquid containing a solvent and an aluminum precursor (e.g., trimethylaluminum (TMA, $Al(CH_3)_3$)) are used. Examples of another material include tris(dimethylamide)aluminum, triisobutylaluminum, and aluminum tris(2,2,6,6-tetramethyl-3,5-heptanedionate).

For example, in the case where a silicon oxide film is formed by a deposition apparatus using ALD, hexachlorodisilane is adsorbed on a surface where a film is to be formed, and radicals of an oxidizing gas (e.g., $O_2$ or dinitrogen monoxide) are supplied to react with the adsorbate.

For example, in the case where a tungsten film is formed by a deposition apparatus using ALD, a $WF_6$ gas and a $B_2H_6$ gas are sequentially introduced to form an initial tungsten film, and then a $WF_6$ gas and an $H_2$ gas are sequentially introduced to form a tungsten film. Note that an $SiH_4$ gas may be used instead of a $B_2H_6$ gas.

For example, in the case where an oxide semiconductor film, e.g., an In—Ga—Zn—O layer is formed by a deposition apparatus using ALD, an $In(CH_3)_3$ gas and an $O_3$ gas are sequentially introduced to form an In—O layer, a $Ga(CH_3)_3$ gas and an $O_3$ gas are sequentially introduced to form a Ga—O layer, and then a $Zn(CH_3)_2$ gas and an $O_3$ gas are sequentially introduced to form a Zn—O layer. Note that the order of these layers is not limited to this example. A mixed compound layer such as an In—Ga—O layer, an In—Zn—O layer, or a Ga—Zn—O layer may be formed by using these gases. Although an $H_2O$ gas that is obtained by bubbling with an inert gas such as Ar may be used instead of an $O_3$ gas, it is preferable to use an $O_3$ gas, which does not contain H.

A facing-target-type sputtering apparatus can be used for deposition of an oxide semiconductor layer. Deposition using the facing-target-type sputtering apparatus can also be referred to as vapor deposition SP (VDSP).

When an oxide semiconductor layer is deposited using a facing-target-type sputtering apparatus, plasma damage to the oxide semiconductor layer at the time of deposition can be reduced. Thus, oxygen vacancies in the film can be reduced. In addition, the use of the facing-target-type sputtering apparatus enables low-pressure deposition. Accordingly, the concentration of impurities (e.g., hydrogen, a rare gas (e.g., argon), and water) in a deposited oxide semiconductor layer can be lowered.

The structures described in this embodiment can be used in appropriate combination with any of the structures described in the other embodiments.

Embodiment 5

A structure of an oxide semiconductor film that can be used in one embodiment of the present invention is described below.

In this specification, the term "parallel" indicates that the angle formed between two straight lines is greater than or equal to −10° and less than or equal to 10°, and accordingly also includes the case where the angle is greater than or equal to −5° and less than or equal to 5°. Furthermore, the term "perpendicular" indicates that the angle formed between two straight lines is greater than or equal to 80° and less than or equal to 100°, and accordingly also includes the case where the angle is greater than or equal to 85° and less than or equal to 95°.

In this specification, trigonal and rhombohedral crystal systems are included in a hexagonal crystal system.

<Structure of Oxide Semiconductor>

The structure of an oxide semiconductor is described below.

An oxide semiconductor is classified into a single crystal oxide semiconductor and a non-single-crystal oxide semiconductor. Examples of a non-single-crystal oxide semiconductor include a c-axis-aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not to have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 46A:
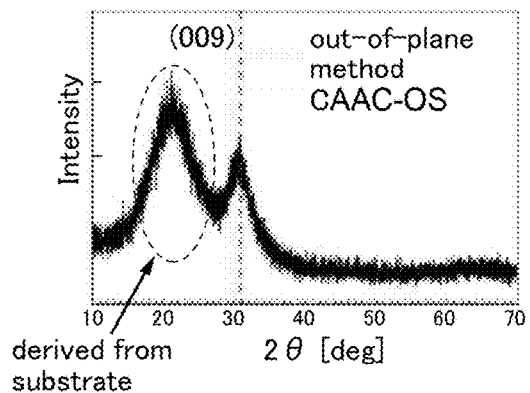
FIGS. 46A to 46E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle ($2\theta$) of around 31° as shown in FIG. 46A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a $2\theta$ of around 36° in addition to the peak at a $2\theta$ of around 31°. The peak at a $2\theta$ of around 36° is derived from a crystal structure that is classified into the space group Fd-3m; thus, this peak is preferably not exhibited in a CAAC-OS.

Figure 46B:
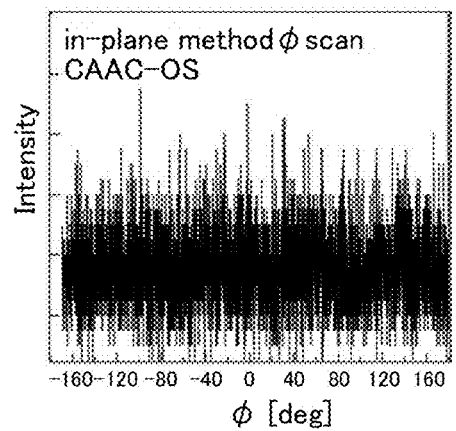
Figure 46C:
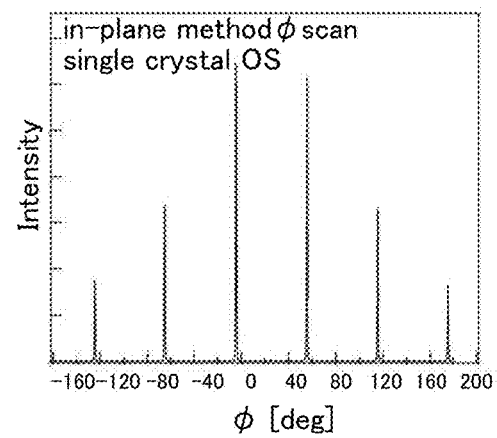

On the other hand, in structural analysis of the CAAC-OS by an in-plane method in which an X-ray is incident on the CAAC-OS in a direction parallel to the formation surface, a peak appears at a $2\theta$ of around 56°. This peak is attributed to the (110) plane of the $InGaZnO_4$ crystal. When analysis ($\phi$ scan) is performed with $2\theta$ fixed at around 56° and with the sample rotated using a normal vector to the sample surface as an axis ($\phi$ axis), as shown in FIG. 46B, a peak is not clearly observed. In contrast, in the case where single crystal $InGaZnO_4$ is subjected to $\phi$ scan with $2\theta$ fixed at around 56°, as shown in FIG. 46C, six peaks that are derived from crystal planes equivalent to the (110) plane are observed. Accordingly, the structural analysis using XRD shows that the directions of a-axes and b-axes are irregularly oriented in the CAAC-OS.

Figure 46D:
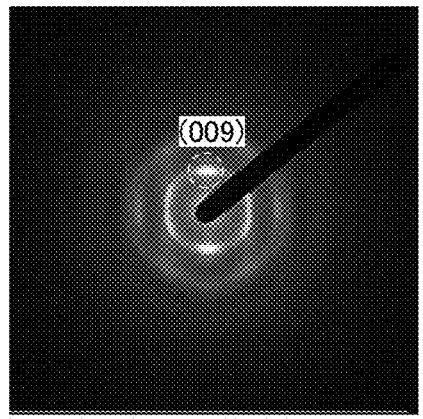
Figure 46E:
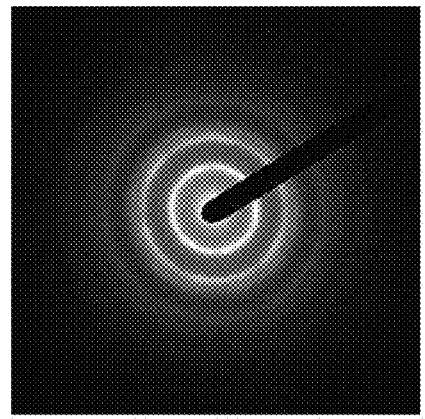

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 46D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 46E shows a diffraction pattern obtained in such a manner that an electron beam with a probe diameter of 300 nm is incident on the same sample in a direction perpendicular to the sample surface. As shown in FIG. 46E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 46E is considered to be derived from the (010) plane, the (100) plane, and the like of the $InGaZnO_4$ crystal. The second ring in FIG. 46E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a crystal grain boundary is not clearly observed in some cases. Thus, in the CAAC-OS, a reduction in electron mobility due to the crystal grain boundary is less likely to occur.

Figure 47A:
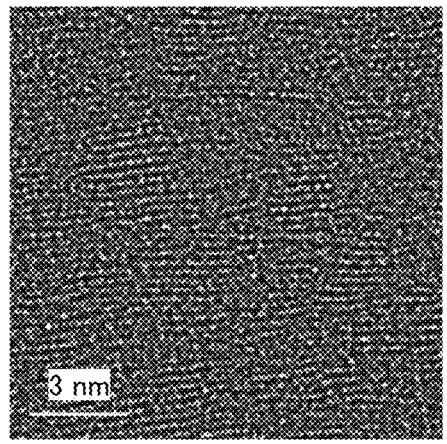
FIGS. 47A to 47E show a cross-sectional TEM image and plan-view TEM images of a CAAC-OS and images obtained through analysis thereof.

FIG. 47A shows a high-resolution TEM image of a cross section of the CAAC-OS that is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 47A shows pellets in which metal atoms are arranged in a layered manner. FIG. 47A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 47B:
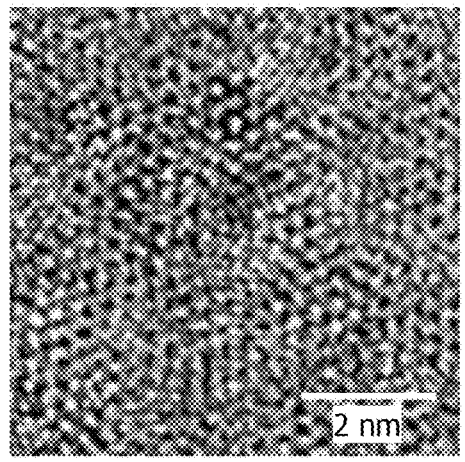
Figure 47C:
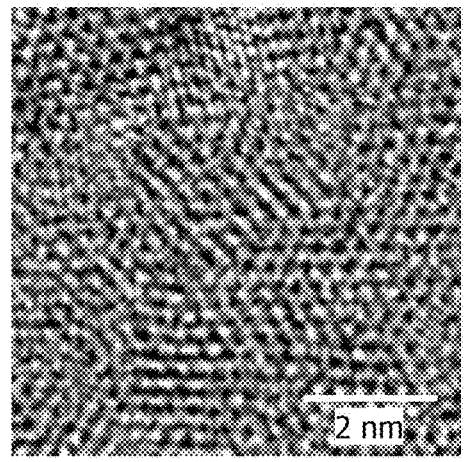
Figure 47D:
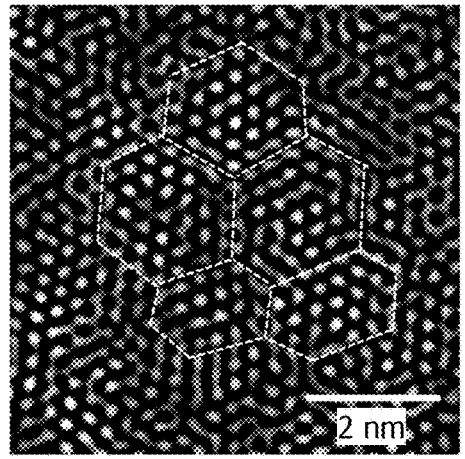
Figure 47E:
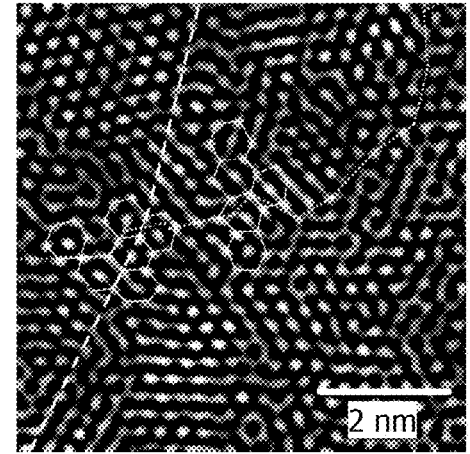

FIGS. 47B and 47C show Cs-corrected high-resolution TEM images of a plane of the CAAC-OS observed from a direction substantially perpendicular to the sample surface. FIGS. 47D and 47E are images obtained through image processing of FIGS. 47B and 47C. The method of image processing is as follows. The image in FIG. 47B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 47D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 47E, a dotted line denotes a portion where the direction of a lattice arrangement changes between a region with a well lattice arrangement and another region with a well lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, the interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. For example, oxygen vacancy in the oxide semiconductor might serve as a carrier trap or serve as a carrier generation source when hydrogen is captured therein.

The CAAC-OS having small amounts of impurities and oxygen vacancy is an oxide semiconductor with a low carrier density. Specifically, an oxide semiconductor with a carrier density of lower than $8\times10^{11}$ cm$^3$, preferably lower than $1\times10^{11}$ cm$^3$, further preferably lower than $1\times10^{10}$ cm$^{-3}$, and higher than or equal to $1\times10^{-9}$ cm$^{-3}$ can be used. Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 48A:
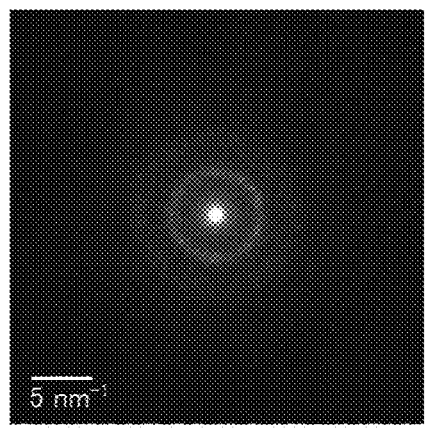
FIGS. 48A to 48D show electron diffraction patterns and a cross-sectional TEM image of an nc-OS.
Figure 48B:
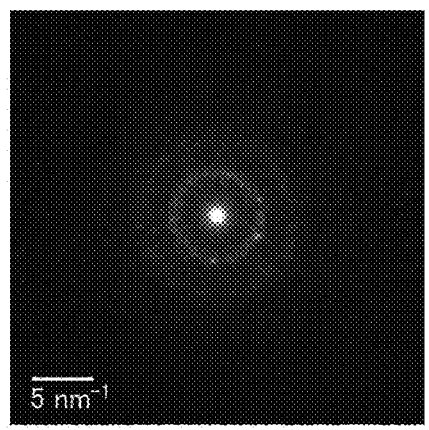

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 48A is observed. FIG. 48B shows a diffraction pattern (a nanobeam electron diffraction pattern) obtained when an electron beam with a probe diameter of 1 nm is incident on the same sample. As shown in FIG. 48B, a plurality of spots is observed in a ring-like region. In other words, ordering in an nc-OS is not observed with an electron beam with a probe diameter of 50 nm but is observed with an electron beam with a probe diameter of 1 nm.

Figure 48C:
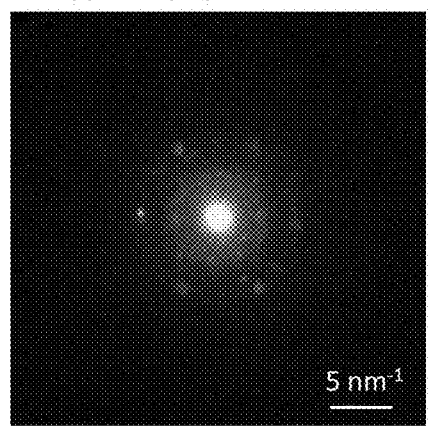

Furthermore, an electron diffraction pattern in which spots are arranged in an approximately regular hexagonal shape is observed in some cases as shown in FIG. 48C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 48D:
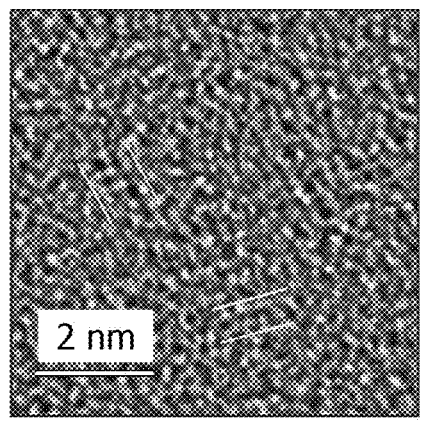

FIG. 48D shows a Cs-corrected high-resolution TEM image of a cross section of an nc-OS observed from a direction substantially parallel to the formation surface. In a high-resolution TEM image, an nc-OS has a region in which a crystal part is observed, such as the part indicated by additional lines in FIG. 48D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a crystal grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<A-Like OS>

An a-like OS has a structure between those of the nc-OS and the amorphous oxide semiconductor.

Figure 49A:
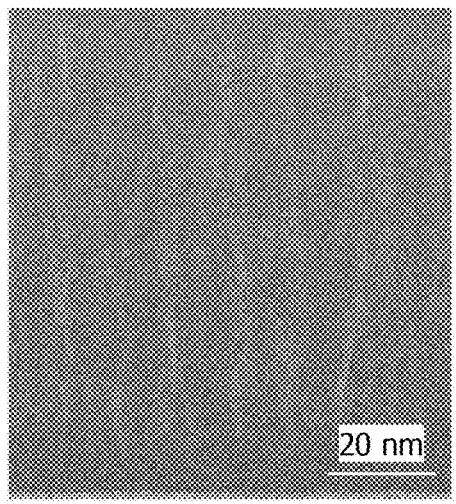
FIGS. 49A and 49B show cross-sectional TEM images of an a-like OS.
Figure 49B:
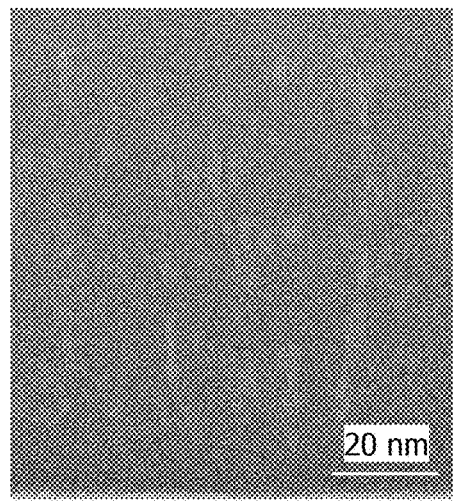

FIGS. 49A and 49B are high-resolution cross-sectional TEM images of an a-like OS. FIG. 49A is the high-resolution cross-sectional TEM image of the a-like OS at the start of the electron irradiation. FIG. 49B is the high-resolution cross-sectional TEM image of the a-like OS after the electron ($e^-$) irradiation at $4.3 \times 10^8$ $e^-/nm^2$. FIGS. 49A and 49B show that stripe-like bright regions extending vertically are observed in the a-like OS from the start of the electron irradiation. It can also be found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 50:
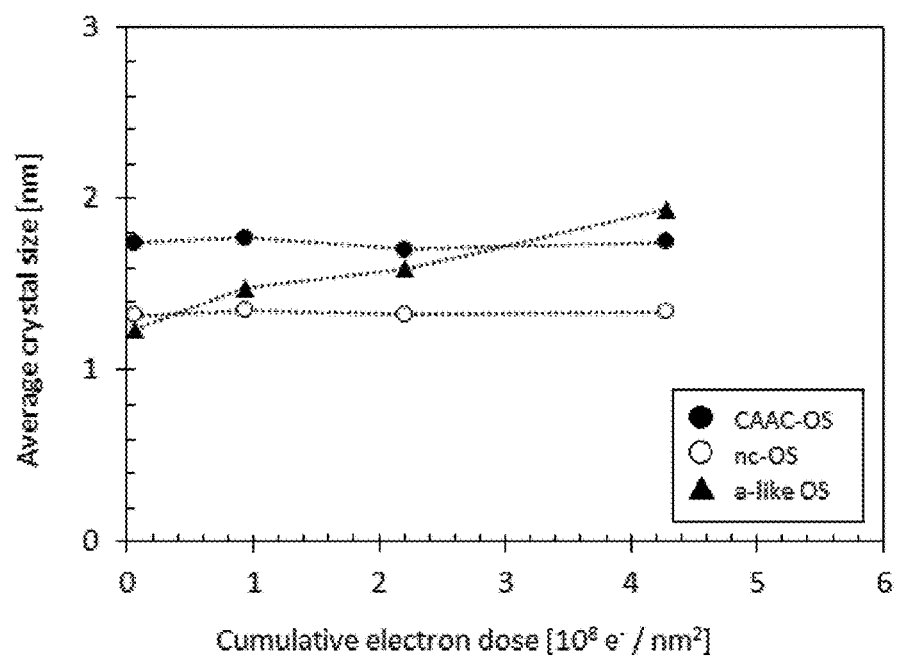
FIG. 50 shows a change in a crystal part of an In—Ga—Zn oxide induced by electron irradiation.

FIG. 50 shows change in the average size of crystal parts (at 22 points to 30 points) in each sample. Note that the crystal part size corresponds to the length of a lattice fringe. FIG. 50 indicates that the crystal part size in the a-like OS increases with an increase in the cumulative electron dose in obtaining TEM images, for example. As shown in FIG. 50, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 50, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiation were as follows: the accelerating voltage was 300 kV; the current density was $6.7 \times 10^5$ $e^-/(nm^2 \cdot s)$; and the diameter of the irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked film including two or more films of an amorphous oxide semiconductor, an a-like OS, an nc-OS, and a CAAC-OS, for example.

The structures described in this embodiment can be used in appropriate combination with any of the structures described in the other embodiments.

Embodiment 6

In this embodiment, circuit structure examples to which the OS transistors described in the above embodiments can be applied will be described with reference to FIGS. 51A to 51C, FIGS. 52A to 52C, FIGS. 53A and 53B, and FIGS. 54A and 54B.

Figure 51A:
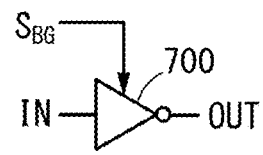
FIGS. 51A to 51C are circuit diagrams and a timing chart of an inverter circuit.

FIG. 51A illustrates a circuit diagram of an inverter applicable to the circuits 23 to 25 or the like. An inverter 700 outputs a signal whose logic is inverted from the logic of a signal supplied to an input terminal IN to an output terminal OUT. The inverter 700 includes a plurality of OS transistors. A signal $S_{BG}$ can switch electrical characteristics of the OS transistors.

Figure 51B:
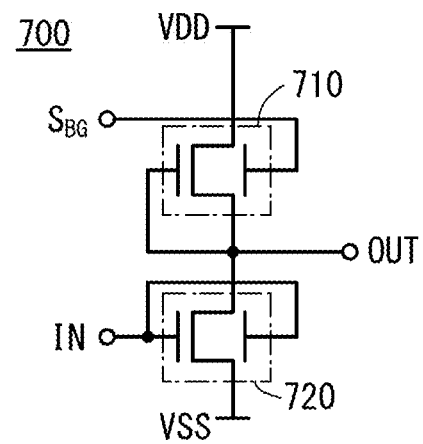

FIG. 51B is a circuit diagram illustrating an example of the inverter 700. The inverter 700 includes an OS transistor 710 and an OS transistor 720. The inverter 700 can be formed using n-channel transistors and can have a circuit structure in which all the transistors have the same conductivity. With the circuit structure in which all the transistors have the same conductivity, the inverter can be formed at lower cost than a CMOS inverter.

The inverter 700 including the OS transistors can be provided over a CMOS circuit including Si transistors. Since the inverter 700 can be provided so as to overlap with the CMOS circuit, no additional area is required for the inverter 700, and thus, an increase in the circuit area can be suppressed.

Each of the OS transistors 710 and 720 includes a first gate functioning as a front gate, a second gate functioning as a back gate, a first terminal functioning as one of a source and a drain, and a second terminal functioning as the other of the source and the drain.

The first gate of the OS transistor 710 is connected to its second terminal. The second gate of the OS transistor 710 is connected to a wiring that transmits the signal $S_{BG}$. The first terminal of the OS transistor 710 is connected to a wiring that supplies a voltage VDD. The second terminal of the OS transistor 710 is connected to the output terminal OUT.

The first gate of the OS transistor 720 is connected to the input terminal IN. The second gate of the OS transistor 720 is connected to the input terminal IN. The first terminal of the OS transistor 720 is connected to the output terminal OUT. The second terminal of the OS transistor 720 is connected to a wiring that supplies a voltage VSS.

Figure 51C:
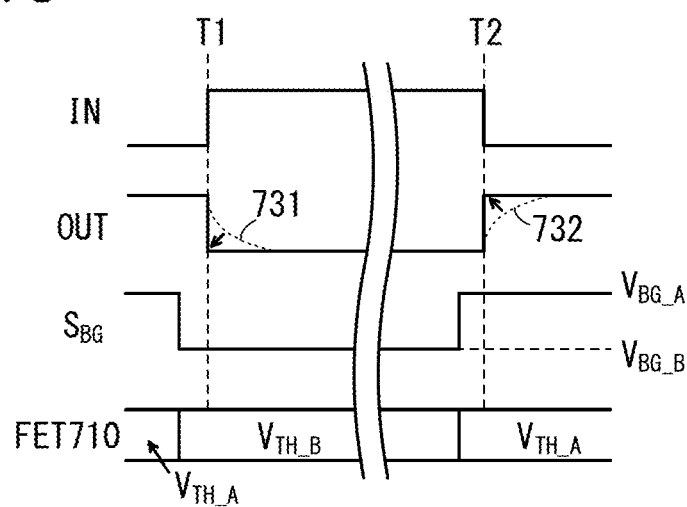

FIG. 51C is a timing chart illustrating the operation of the inverter 700. The timing chart in FIG. 51C illustrates changes of a signal waveform of the input terminal IN, a signal waveform of the output terminal OUT, a signal waveform of the signal $S_{BG}$, and the threshold voltage of the OS transistor 710 (FET 710).

The signal $S_{BG}$ supplied to the second gate of the OS transistor 710 can control the threshold voltage of the OS transistor 710.

The signal $S_{BG}$ includes a voltage $V_{BG\_A}$ for shifting the threshold voltage in the negative direction and a voltage $V_{BG\_B}$ for shifting the threshold voltage in the positive direction. The threshold voltage of the OS transistor 710 can be shifted in the negative direction to be a threshold voltage $V_{TH\_A}$ when the voltage $V_{BG\_A}$ is applied to the second gate. The threshold voltage of the OS transistor 710 can be shifted in the positive direction to be a threshold voltage $V_{TH\_B}$ when the voltage $V_{BG\_B}$ is applied to the second gate.

Figure 52A:
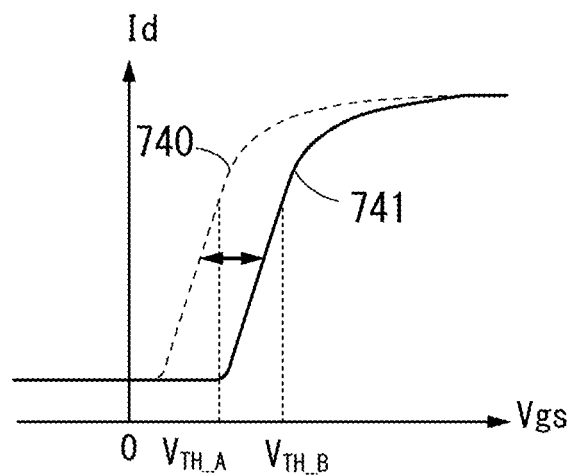
FIGS. 52A to 52C are a graph and circuit diagrams for describing control of the threshold voltage.

To visualize the above description, FIG. 52A shows a Vg-Id curve, which is one of the electrical characteristics of a transistor.

When a high voltage such as the voltage $V_{BG\_A}$ is applied to the second gate, the electrical characteristics of the OS transistor 710 can be shifted to match a curve shown by a dashed line 740 in FIG. 52A. When a low voltage such as the voltage $V_{BG\_B}$ is applied to the second gate, the electrical characteristics of the OS transistor 710 can be shifted to match a curve shown by a solid line 741 in FIG. 52A. As shown in FIG. 52A, switching the signal $S_{BG}$ between the voltage $V_{BG\_A}$ and the voltage $V_{BG\_B}$ enables the threshold voltage of the OS transistor 710 to be shifted in the positive direction or the negative direction.

Figure 52B:
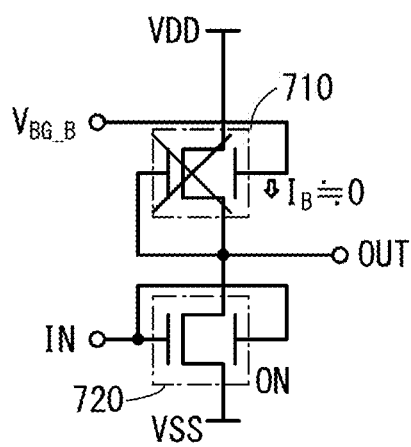

The shift of the threshold voltage in the positive direction toward the threshold voltage $V_{TH\_B}$ can make current less likely to flow in the OS transistor 710. FIG. 52B visualizes the state. As illustrated in FIG. 52B, a current $I_B$ that flows in the OS transistor 710 can be extremely low. Thus, when a signal supplied to the input terminal IN is at a high level and the OS transistor 720 is on (ON), the voltage of the output terminal OUT can drop sharply.

Since a state in which current is less likely to flow in the OS transistor 710 as illustrated in FIG. 52B can be obtained, a signal waveform 731 of the output terminal in the timing chart in FIG. 51C can be made steep. Shoot-through current between the wiring that supplies the voltage VDD and the wiring that supplies the voltage VSS can be low, leading to low-power operation.

Figure 52C:
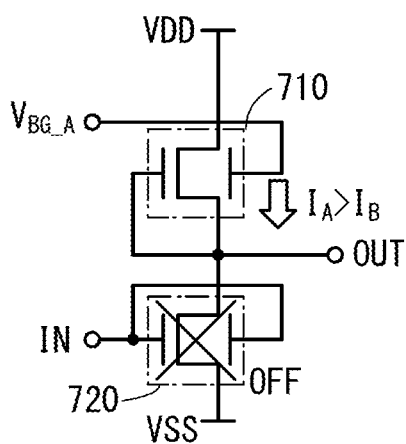

The shift of the threshold voltage in the negative direction toward the threshold voltage $V_{TH\_A}$ can make current flow easily in the OS transistor 710. FIG. 52C visualizes the state. As illustrated in FIG. 52C, a current $I_A$ flowing at this time can be higher than at least the current $I_B$. Thus, when a signal supplied to the input terminal IN is at a low level and the OS transistor 720 is off (OFF), the voltage of the output terminal OUT can be increased sharply.

Since a state in which current is likely to flow in the OS transistor 710 as illustrated in FIG. 52C can be obtained, a signal waveform 732 of the output terminal in the timing chart in FIG. 51C can be made steep.

Note that the threshold voltage of the OS transistor 710 is preferably controlled by the signal $S_{BG}$ before the state of the OS transistor 720 is switched, i.e., before time T1 or time T2. For example, as in FIG. 51C, it is preferable that the threshold voltage of the OS transistor 710 be switched from the threshold voltage $V_{TH\_A}$ to the threshold voltage $V_{TH\_B}$ before time T1 at which the level of the signal supplied to the input terminal IN is switched to a high level. Moreover, as in FIG. 51C, it is preferable that the threshold voltage of the OS transistor 710 be switched from the threshold voltage $V_{TH\_B}$ to the threshold voltage $V_{TH\_A}$ before time T2 at which the level of the signal supplied to the input terminal IN is switched to a low level.

Figure 53A:
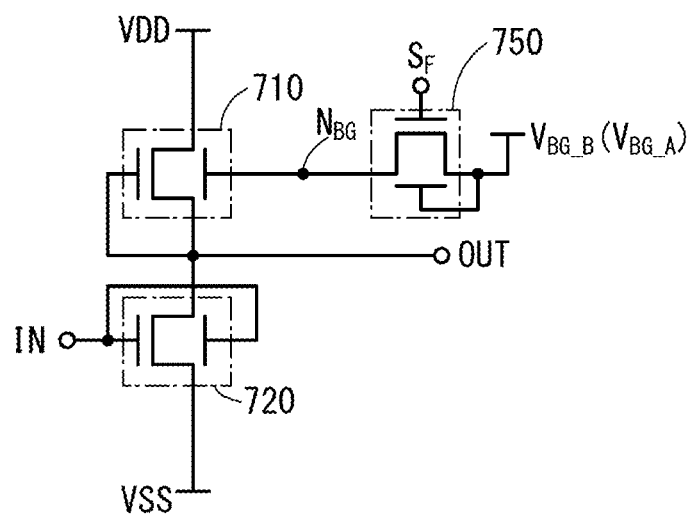
FIGS. 53A and 53B are a circuit diagram and a timing chart of an inverter circuit.

Although the timing chart in FIG. 51C illustrates the structure in which the level of the signal $S_{BG}$ is switched in accordance with the signal supplied to the input terminal IN, a different structure may be employed in which voltage for controlling the threshold voltage is held by the second gate of the OS transistor 710 in a floating state, for example. FIG. 53A illustrates an example of such a circuit structure.

The circuit structure in FIG. 53A is the same as that in FIG. 51B, except that an OS transistor 750 is added. A first terminal of the OS transistor 750 is connected to the second gate of the OS transistor 710. A second terminal of the OS transistor 750 is connected to a wiring that supplies the voltage $V_{BG\_B}$ (or the voltage $V_{BG\_A}$). A first gate of the OS transistor 750 is connected to a wiring that supplies a signal $S_F$. A second gate of the OS transistor 750 is connected to the wiring that supplies the voltage $V_{BG\_B}$ (or the voltage $V_{BG\_A}$).

Figure 53B:
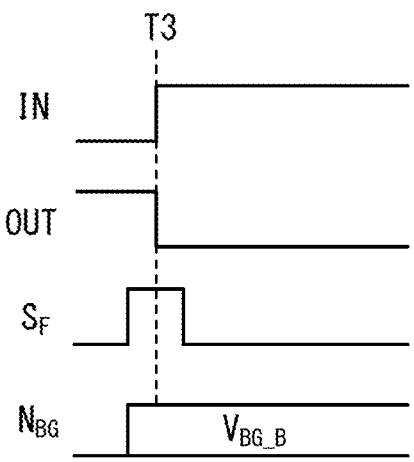

The operation with the circuit structure in FIG. 53A will be described with reference to a timing chart in FIG. 53B.

The voltage for controlling the threshold voltage of the OS transistor 710 is supplied to the second gate of the OS transistor 710 before time T3 at which the level of the signal supplied to the input terminal IN is switched to a high level. The signal $S_F$ is set to a high level and the OS transistor 750 is turned on, so that the voltage $V_{BG\_B}$ for controlling the threshold voltage is supplied to a node $N_{BG}$.

The OS transistor 750 is turned off after the voltage of the node $N_{BG}$ becomes $V_{BG\_B}$. Since the off-state current of the OS transistor 750 is extremely low, the voltage $V_{BG\_B}$ held by the node $N_{BG}$ can be retained while the OS transistor 750 remains off. Therefore, the number of times the voltage $V_{BG\_B}$ is supplied to the second gate of the OS transistor 750 can be reduced and accordingly, the power consumption for rewriting the voltage $V_{BG\_B}$ can be reduced.

Figure 54A:
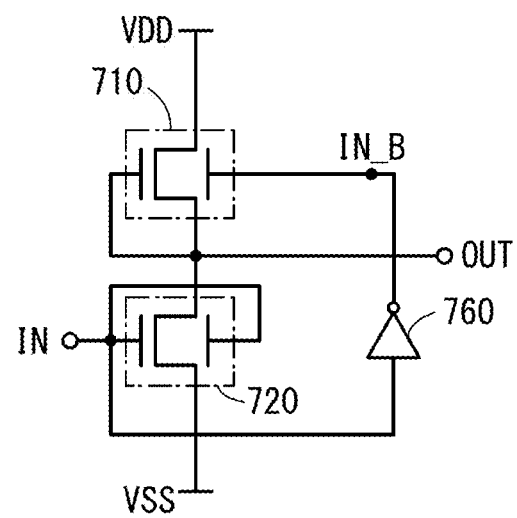
FIGS. 54A and 54B are a circuit diagram and a timing chart of an inverter circuit.

Although FIG. 51B and FIG. 53A each illustrate the case where the voltage is supplied to the second gate of the OS transistor 710 by control from the outside, a different structure may be employed in which voltage for controlling the threshold voltage is generated on the basis of the signal supplied to the input terminal IN and supplied to the second gate of the OS transistor 710, for example. FIG. 54A illustrates an example of such a circuit structure.

The circuit structure in FIG. 54A is the same as that in FIG. 51B, except that a CMOS inverter 760 is provided between the input terminal IN and the second gate of the OS transistor 710. An input terminal of the CMOS inverter 760 is connected to the input terminal IN. An output terminal of the CMOS inverter 760 is connected to the second gate of the OS transistor 710.

The operation with the circuit structure in FIG. 54A is described with reference to a timing chart in FIG. 54B. The timing chart in FIG. 54B illustrates changes of a signal waveform of the input terminal IN, a signal waveform of the output terminal OUT, an output waveform IN_B of the CMOS inverter 760, and a threshold voltage of the OS transistor 710 (FET 710).

The output waveform IN_B which corresponds to a signal whose logic is inverted from the logic of the signal supplied to the input terminal IN can be used as a signal that controls the threshold voltage of the OS transistor 710. Therefore, the threshold voltage of the OS transistor 710 can be controlled as described with reference to FIGS. 52A to 52C. For example, the signal supplied to the input terminal IN is at a high level and the OS transistor 720 is turned on at time T4 in FIG. 54B. At this time, the output waveform IN_B is at a low level. Accordingly, current can be made less likely to flow in the OS transistor 710; thus, a drop in the voltage of the output terminal OUT can be made steep.

Figure 54B:
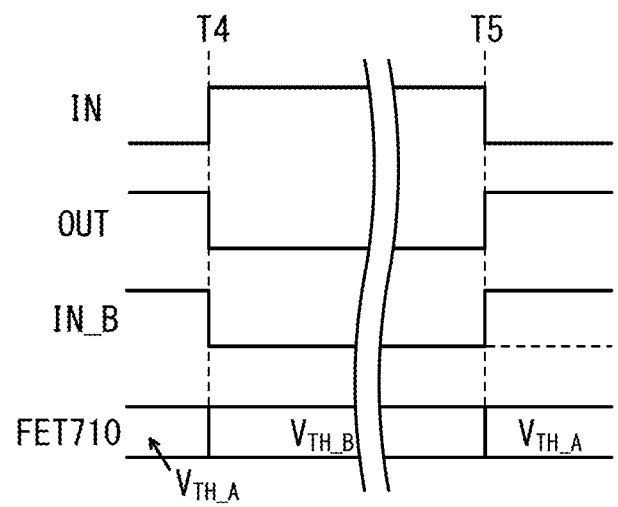

Moreover, the signal supplied to the input terminal IN is at a low level and the OS transistor 720 is turned off at time T5 in FIG. 54B. At this time, the output waveform IN_B is at a high level. Accordingly, current can easily flow in the OS transistor 710; thus, a rise in the voltage of the output terminal OUT can be made steep.

As described above, in the structure of the inverter including the OS transistor in this embodiment, the voltage of the back gate is switched in accordance with the logic of the signal supplied to the input terminal IN. In such a structure, the threshold voltage of the OS transistor can be controlled. The control of the threshold voltage of the OS transistor by the signal supplied to the input terminal IN can make a change in the voltage of the output terminal OUT steep. Moreover, shoot-through current between the wirings that supply power supply voltages can be reduced. Thus, power consumption can be reduced.

The structures described in this embodiment can be used in appropriate combination with any of the structures described in the other embodiments.

Embodiment 7

In this embodiment, examples of a semiconductor device which includes a plurality of circuits including OS transistors and described in the above embodiment are described with reference to FIGS. 55A to 55E, FIGS. 56A and 56B, FIGS. 57A and 57B, and FIGS. 58A to 58C.

Figure 55A:
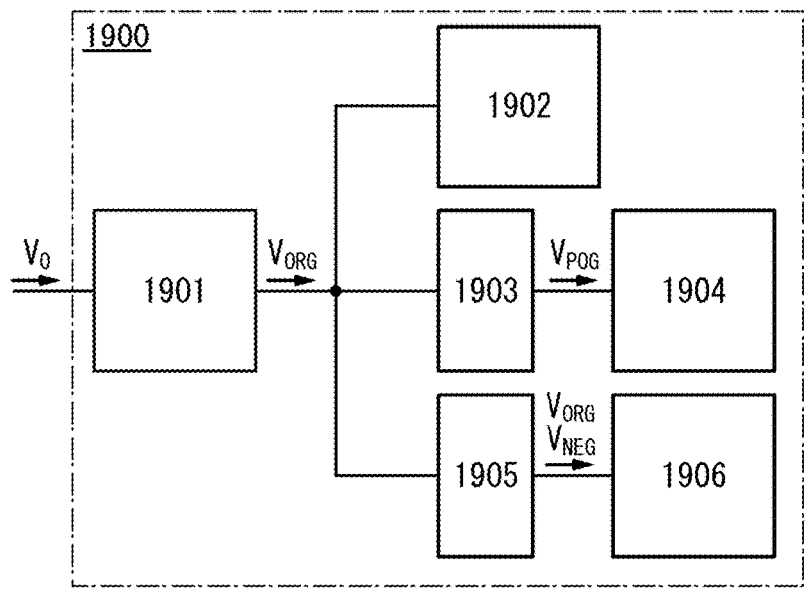
FIGS. 55A to 55E are a block diagram, circuit diagrams, and waveform charts of a semiconductor device.

FIG. 55A is a block diagram of a semiconductor device 1900. The semiconductor device 1900 includes a power supply circuit 1901, a circuit 1902, a voltage generation circuit 1903, a circuit 1904, a voltage generation circuit 1905, and a circuit 1906.

The power supply circuit 1901 is a circuit that generates a voltage $V_{ORG}$ used as a reference. The voltage $V_{ORG}$ is not necessarily one voltage and can be a plurality of voltages. The voltage $V_{ORG}$ can be generated on the basis of a voltage $V_0$ supplied from the outside of the semiconductor device 1900. The semiconductor device 1900 can generate the voltage $V_{ORG}$ on the basis of one power supply voltage supplied from the outside. Therefore, the semiconductor device 1900 can operate without supply of a plurality of power supply voltages from the outside.

The circuits 1902, 1904, and 1906 operate with different power supply voltages. For example, the power supply voltage of the circuit 1902 is a voltage applied on the basis of the voltage $V_{ORG}$ and the voltage $V_{SS}$ ($V_{ORG}$>$V_{SS}$). For example, the power supply voltage of the circuit 1904 is a voltage applied on the basis of a voltage $V_{POG}$ and the voltage $V_{SS}$ ($V_{POG}$>$V_{ORG}$). For example, the power supply voltages of the circuit 1906 are voltages applied on the basis of the voltage $V_{ORG}$, the voltage $V_{SS}$, and a voltage $V_{NEG}$ ($V_{ORG}$>$V_{SS}$>$V_{NEG}$). When the voltage $V_{SS}$ is equal to a ground potential (GND), the kinds of voltages generated in the power supply circuit 1901 can be reduced.

The voltage generation circuit 1903 is a circuit that generates the voltage $V_{POG}$. The voltage generation circuit 1903 can generate the voltage $V_{POG}$ on the basis of the voltage $V_{ORG}$ supplied from the power supply circuit 1901. Therefore, the semiconductor device 1900 including the circuit 1904 can operate with one power supply voltage supplied from the outside.

The voltage generation circuit 1905 is a circuit that generates the voltage $V_{NEG}$. The voltage generation circuit 1905 can generate the voltage $V_{NEG}$ on the basis of the voltage $V_{ORG}$ supplied from the power supply circuit 1901. Therefore, the semiconductor device 1900 including the circuit 1906 can operate with one power supply voltage supplied from the outside.

Figure 55B:
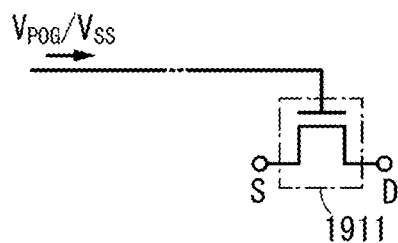
Figure 55C:
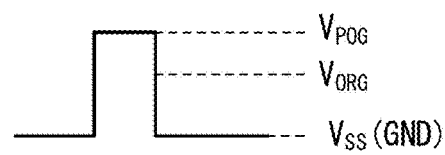

FIG. 55B illustrates an example of the circuit 1904 that operates with the voltage $V_{POG}$ and FIG. 55C illustrates an example of a waveform of a signal for operating the circuit 1904.

FIG. 55B illustrates a transistor 1911. A signal supplied to a gate of the transistor 1911 is generated on the basis of, for example, the voltage $V_{POG}$ and the voltage $V_{SS}$. The signal is generated on the basis of the voltage $V_{POG}$ at a time when the transistor 1911 is turned on and on the basis of the voltage $V_{SS}$ at a time when the transistor 1911 is turned off. As shown in FIG. 55C, the voltage $V_{POG}$ is higher than the voltage $V_{ORG}$. Therefore, a conduction state between a source (S) and a drain (D) of the transistor 1911 can be obtained more surely. As a result, the frequency of malfunction of the circuit 1904 can be reduced.

Figure 55D:
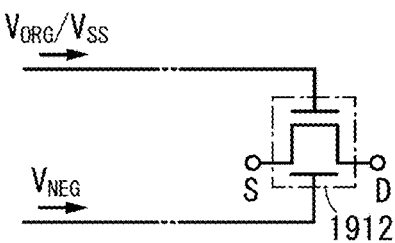
Figure 55E:
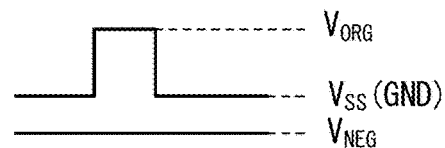

FIG. 55D illustrates an example of the circuit 1906 that operates with the voltage $V_{NEG}$ and FIG. 55E illustrates an example of a waveform of a signal for operating the circuit 1906.

FIG. 55D illustrates a transistor 1912 having a back gate. A signal supplied to a gate of the transistor 1912 is generated on the basis of, for example, the voltage $V_{ORG}$ and the voltage $V_{SS}$. The signal is generated on the basis of the voltage $V_{ORG}$ at a time when the transistor 1912 is turned on and on the basis of the voltage $V_{SS}$ at a time when the transistor 1912 is turned off. A signal supplied to the back gate of the transistor 1912 is generated on the basis of the voltage $V_{NEG}$. As shown in FIG. 55E, the voltage $V_{NEG}$ is lower than the voltage $V_{SS}$ (GND). Therefore, the threshold voltage of the transistor 1912 can be controlled to shift in the positive direction. Thus, the transistor 1912 can be surely turned off and a current flowing between a source (S) and a drain (D) can be reduced. As a result, the frequency of malfunction of the circuit 1906 can be reduced and power consumption thereof can be reduced.

The voltage $V_{NEG}$ may be directly supplied to the back gate of the transistor 1912. Alternatively, a signal supplied to the gate of the transistor 1912 may be generated on the basis of the voltage $V_{ORG}$ and the voltage $V_{NEG}$ and the generated signal may be supplied to the back gate of the transistor 1912.

Figure 56A:
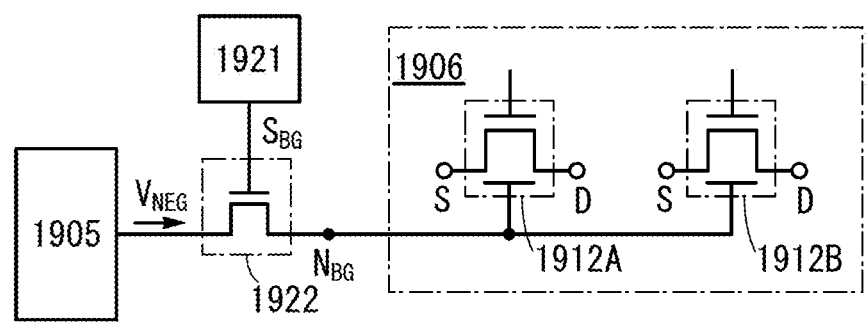
FIGS. 56A and 56B are a circuit diagram and a timing chart of a semiconductor device.
Figure 56B:
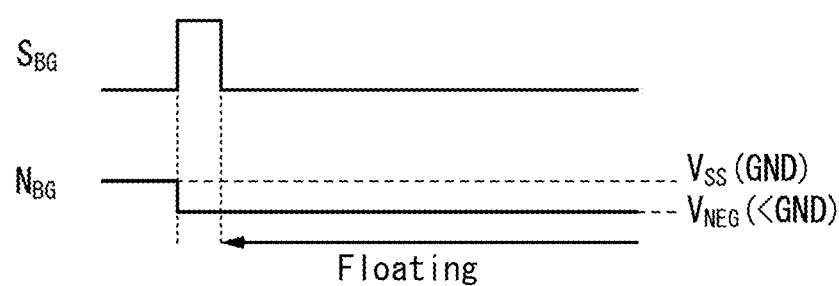

FIGS. 56A and 56B illustrate a modification example of FIGS. 55D and 55E.

In a circuit diagram illustrated in FIG. 56A, a transistor 1922 whose conduction state can be controlled by a control circuit 1921 is provided between the voltage generation circuit 1905 and the circuit 1906. The transistor 1922 is an n-channel OS transistor. The control signal $S_{BG}$ output from the control circuit 1921 is a signal for controlling conduction state of the transistor 1922. Transistors 1912A and 1912B included in the circuit 1906 are OS transistors like the transistor 1922.

A timing chart in FIG. 56B shows changes in a potential of the control signal $S_{BG}$ and a potential of a node $N_{BG}$. The potential of the node $N_{BG}$ indicates the states of potentials of back gates of the transistors 1912A and 1912B. When the control signal $S_{BG}$ is at a high level, the transistor 1922 is turned on and the voltage of the node $N_{BG}$ becomes the voltage $V_{NEG}$. Then, when the control signal $S_{BG}$ is at a low level, the node $N_{BG}$ is brought into an electrically floating state. Since the transistor 1922 is an OS transistor, its off-state current is low. Accordingly, even when the node $N_{BG}$ is in an electrically floating state, the voltage $V_{NEG}$ which has been supplied can be held.

Figure 57A:
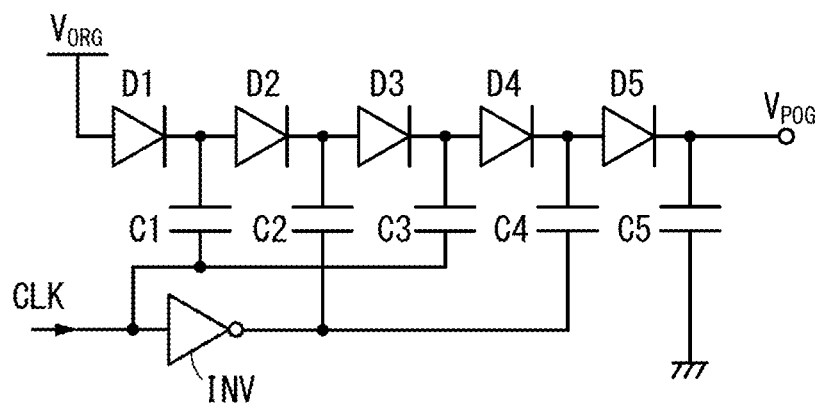
FIGS. 57A and 57B are circuit diagrams each illustrating a voltage generation circuit.

FIG. 57A illustrates an example of a circuit structure applicable to the above-described voltage generation circuit 1903. The voltage generation circuit 1903 illustrated in FIG. 57A is a five-stage charge pump including diodes D1 to D5, capacitors C1 to C5, and an inverter INV. A clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{POG}$ can be obtained by increasing the voltage $V_{ORG}$ by a voltage five times a potential difference between the voltage $V_{ORG}$ and the voltage $V_{SS}$ with application of the clock signal CLK. Note that a forward voltage of the diodes D1 to D5 is 0 V. A desired voltage $V_{POG}$ can be obtained when the number of stages of the charge pump is changed.

Figure 57B:
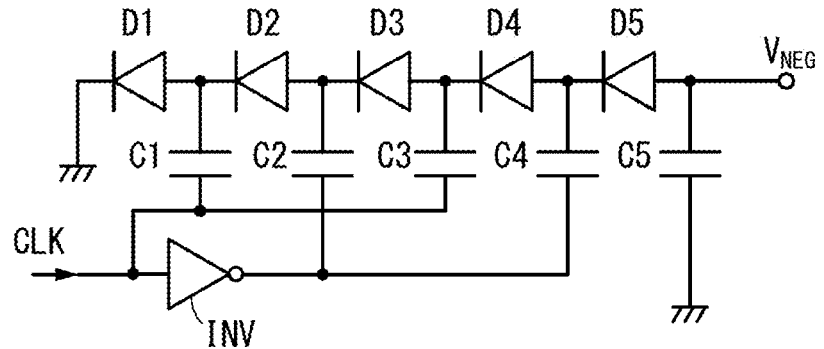

FIG. 57B illustrates an example of a circuit structure applicable to the above-described voltage generation circuit 1905. The voltage generation circuit 1905 illustrated in FIG. 57B is a four-stage charge pump including the diodes D1 to D5, the capacitors C1 to C5, and the inverter INV. The clock signal CLK is supplied to the capacitors C1 to C5 directly or through the inverter INV. When a power supply voltage of the inverter INV is a voltage applied on the basis of the voltage $V_{ORG}$ and the voltage $V_{SS}$, the voltage $V_{NEG}$ can be obtained by decreasing the ground voltage, i.e., the voltage $V_{SS}$ by a voltage four times the potential difference between the voltage $V_{ORG}$ and the voltage $V_{SS}$ with the application of the clock signal CLK. Note that a forward voltage of the diodes D1 to D5 is 0 V. A desired voltage $V_{NEG}$ can be obtained when the number of stages of the charge pump is changed.

Figure 58A:
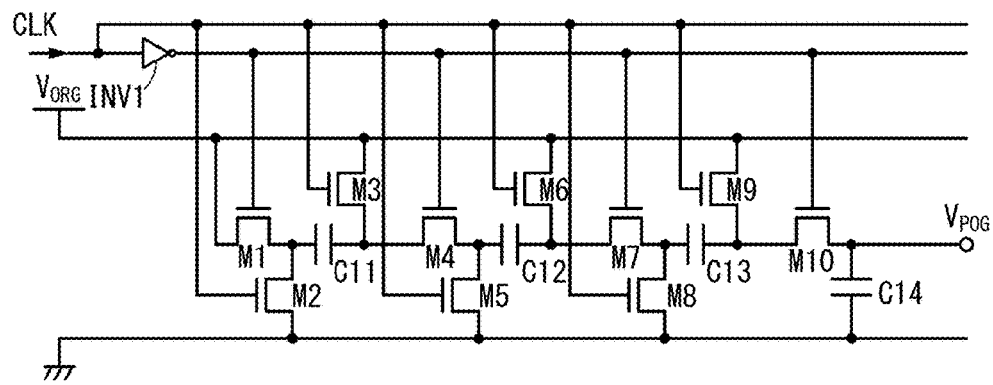
FIGS. 58A to 58C are circuit diagrams each illustrating a voltage generation circuit.
Figure 58B:
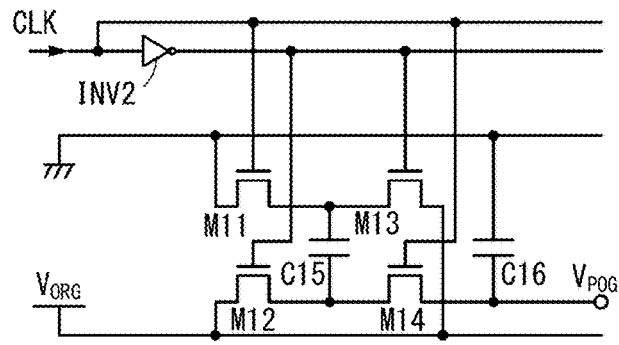
Figure 58C:
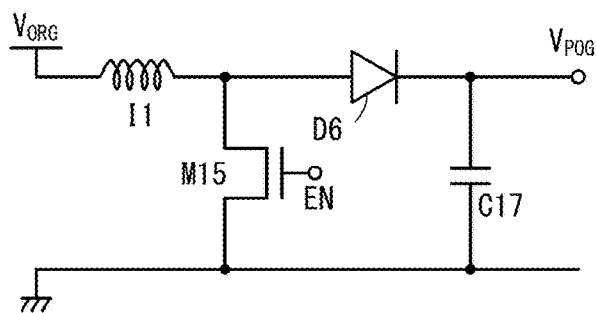

The circuit structure of the voltage generation circuit 1903 is not limited to the structure of the circuit diagram illustrated in FIG. 57A. Modification examples of the voltage generation circuit 1903 are shown in FIGS. 58A to 58C. Note that further modification can be made to voltage generation circuits 1903A to 1903C illustrated in FIGS. 58A to 58C by changing voltages supplied to wirings or arrangement of elements.

The voltage generation circuit 1903A illustrated in FIG. 58A includes transistors M1 to M10, capacitors C11 to C14, and an inverter INV1. The clock signal CLK is supplied to gates of the transistors M1 to M10 directly or through the inverter INV1. The voltage $V_{POG}$ can be obtained by increasing the voltage $V_{ORG}$ by a voltage four times the potential difference between the voltage $V_{ORG}$ and the voltage $V_{SS}$ with the application of the clock signal CLK. A desired voltage $V_{POG}$ can be obtained when the number of stages is changed. In the voltage generation circuit 1903A in FIG. 58A, off-state current of each of the transistors M1 to M10 can be low when the transistors M1 to M10 are OS transistors, and leakage of charge held in the capacitors C11 to C14 can be suppressed. Accordingly, raising from the voltage $V_{ORG}$ to the voltage $V_{POG}$ can be efficiently performed.

The voltage generation circuit 1903B illustrated in FIG. 58B includes transistors M11 to M14, capacitors C15 and C16, and an inverter INV2. The clock signal CLK is supplied to gates of the transistors M11 to M14 directly or through the inverter INV2. The voltage $V_{POG}$ can be obtained by increasing the voltage $V_{ORG}$ by a voltage twice the potential difference between the voltage $V_{ORG}$ and the voltage $V_{SS}$ with the application of the clock signal CLK. In the voltage generation circuit 1903B in FIG. 58B, off-state current of each of the transistors M11 to M14 can be low when the transistors M11 to M14 are OS transistors, and leakage of charge held in the capacitors C15 and C16 can be suppressed. Accordingly, raising from the voltage $V_{ORG}$ to the voltage $V_{POG}$ can be efficiently performed.

The voltage generation circuit 1903C in FIG. 58C includes an inductor I1, a transistor M15, a diode D6, and a capacitor C17. The conduction state of the transistor M15 is controlled by a control signal EN. Owing to the control signal EN, the voltage $V_{POG}$ which is obtained by increasing the voltage $V_{ORG}$ can be obtained. Since the voltage generation circuit 1903C in FIG. 58C increases the voltage using the inductor I1, the voltage can be increased efficiently.

As described above, in any of the structures of this embodiment, a voltage required for circuits included in a semiconductor device can be internally generated. Thus, in the semiconductor device, the number of power supply voltages supplied from the outside can be reduced.

The structures described in this embodiment can be used in appropriate combination with any of the structures described in the other embodiments.

Embodiment 8

In this embodiment, examples of a package and a module each including an image sensor chip are described. For the image sensor chip, the structure of an imaging device of one embodiment of the present invention can be used.

Figure 59A:
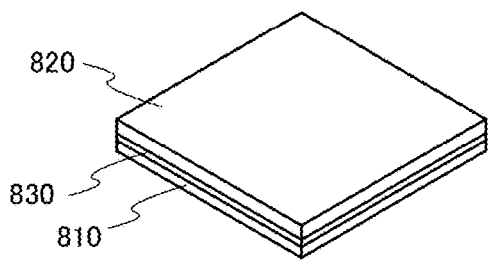
FIGS. 59A to 59D are perspective views and a cross-sectional view of a package including an imaging device.

FIG. 59A is an external perspective view showing the top surface side of a package including an image sensor chip. The package includes a package substrate 810 to which an image sensor chip 850 is fixed, a cover glass 820, an adhesive 830 for bonding the package substrate 810 and the cover glass 820 to each other, and the like.

Figure 59B:
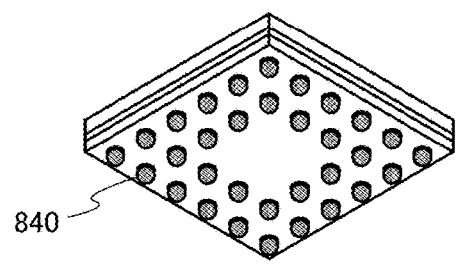

FIG. 59B is an external perspective view showing the bottom surface side of the package. On the bottom surface of the package, a ball grid array (BGA) including solder balls as bumps 840 is formed. Although the BGA is employed here, a land grid array (LGA), a pin grid array (PGA), or the like may be alternatively employed.

Figure 59C:
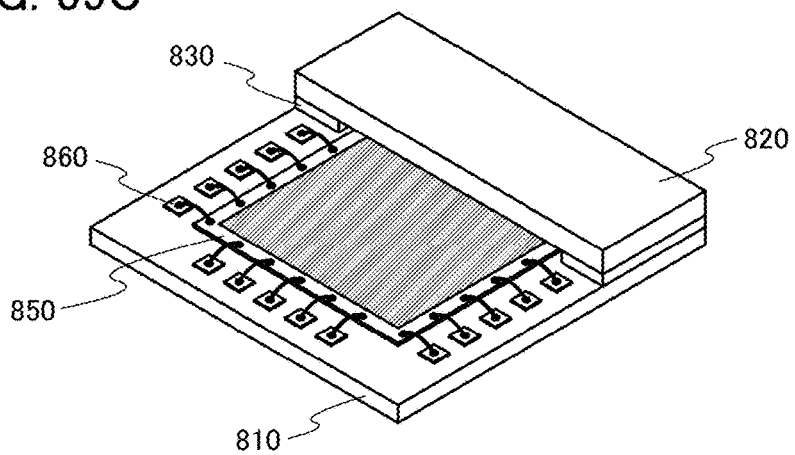
Figure 59D:
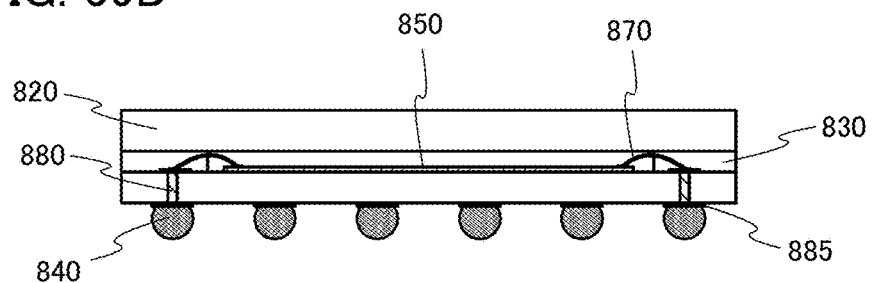

FIG. 59C is a perspective view of the package, in which the cover glass 820 and the adhesive 830 are partly illustrated. FIG. 59D is a cross-sectional view of the package.

Electrode pads 860 are formed over the package substrate 810, and electrically connected to the bumps 840 through through-holes 880 and lands 885. The electrode pads 860 are electrically connected to electrodes of the image sensor chip 850 through wires 870.

Figure 60A:
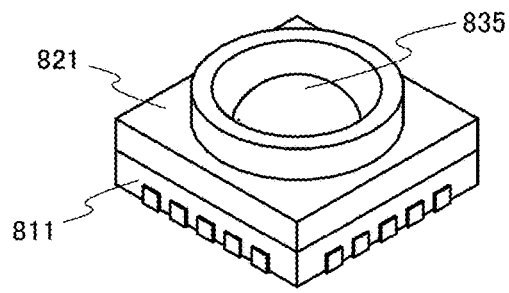
FIGS. 60A to 60D are perspective views and a cross-sectional view of a package including an imaging device.

FIG. 60A is an external perspective view showing the top surface side of a camera module in which an image sensor chip is mounted on a package with a built-in lens. The camera module includes a package substrate 811 to which an image sensor chip 851 is fixed, a lens cover 821, a lens 835, and the like. Furthermore, an IC chip 890 having functions of a driver circuit, a signal conversion circuit, and the like of an imaging device is provided between the package substrate 811 and the image sensor chip 851. Thus, a system in package (SiP) is formed.

Figure 60B:
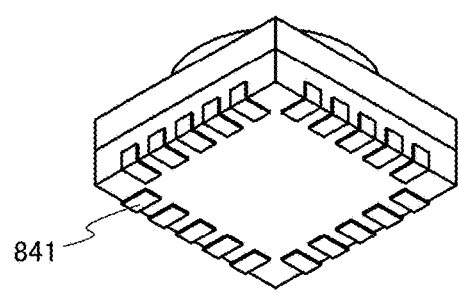

FIG. 60B is an external perspective view showing the bottom surface side of the camera module. On the bottom surface and four side surfaces of the package substrate 811, mounting lands 841 are provided; this structure can be called a quad flat no-lead package (QFN). Although QFN is employed here, a quad flat package (QFP), the above BGA, or the like may be alternatively employed.

Figure 60C:
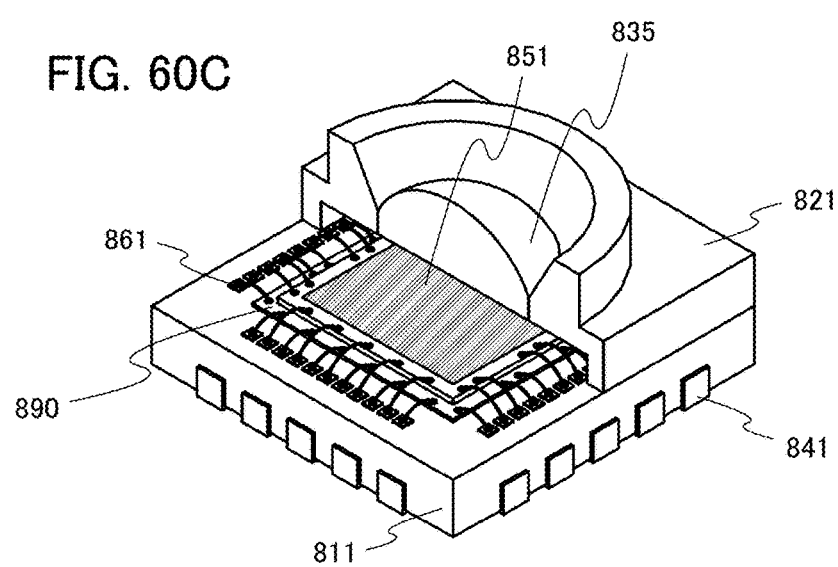
Figure 60D:
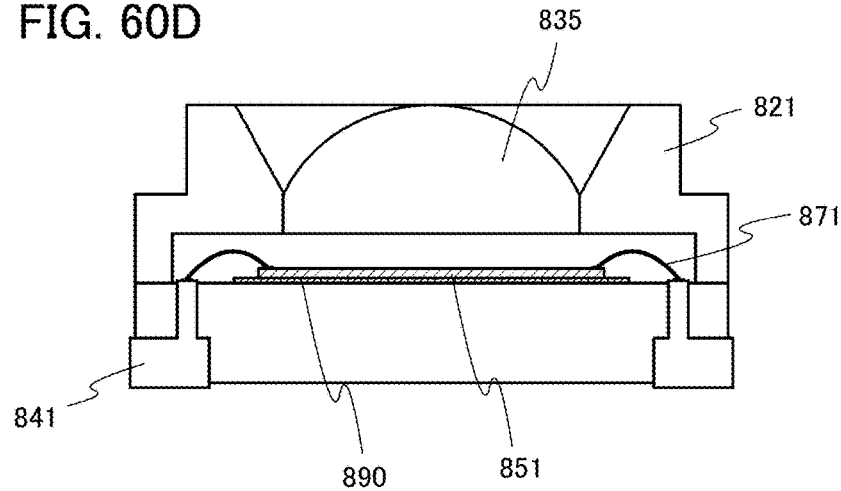

FIG. 60C is a perspective view of the module, in which the lens cover 821 and the lens 835 are partly illustrated. FIG. 60D is a cross-sectional view of the camera module. The mounting lands 841 are partly used as electrode pads 861. The electrode pads 861 are electrically connected to electrodes of the image sensor chip 851 and the IC chip 890 through wires 871.

The image sensor chip can be easily mounted on the package having the above structure, and can be incorporated into a variety of semiconductor devices and electronic devices.

The structures described in this embodiment can be used in appropriate combination with any of the structures described in the other embodiments.

Embodiment 9

Examples of an electronic device that can use the imaging device according to one embodiment of the present invention or a semiconductor device including the imaging device include display devices, personal computers, image memory devices or image reproducing devices provided with storage media, mobile phones, game machines (including portable game machines), portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 61A to 61E illustrate specific examples of these electronic devices.

Figure 61A:
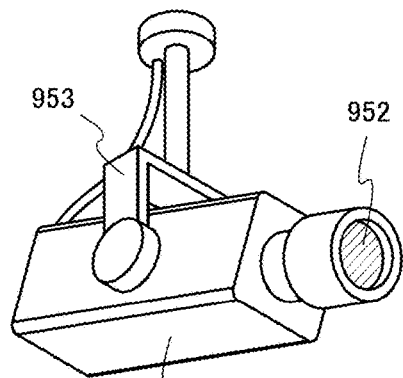
FIGS. 61A to 61F each illustrate an electronic device.

FIG. 61A illustrates a monitoring camera, which includes a housing 951, a lens 952, a support portion 953, and the like. The imaging device of one embodiment of the present invention can be included as a component for obtaining an image in the monitoring camera. Note that a "monitoring camera" is a common name and does not limit the uses. For example, a device that has a function of a monitoring camera can also be called a camera or a video camera.

Figure 61B:
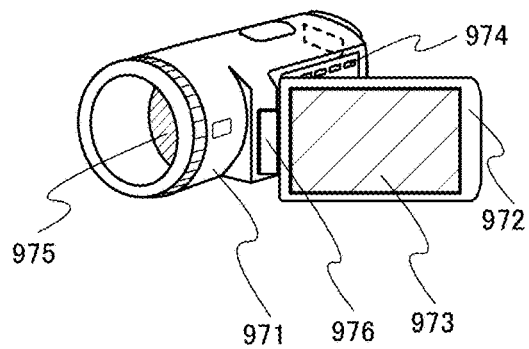

FIG. 61B illustrates a video camera, which includes a first housing 971, a second housing 972, a display portion 973, operation keys 974, a lens 975, a joint 976, and the like. The operation keys 974 and the lens 975 are provided for the first housing 971, and the display portion 973 is provided for the second housing 972. The imaging device of one embodiment of the present invention can be included as a component for obtaining an image in the video camera.

Figure 61C:
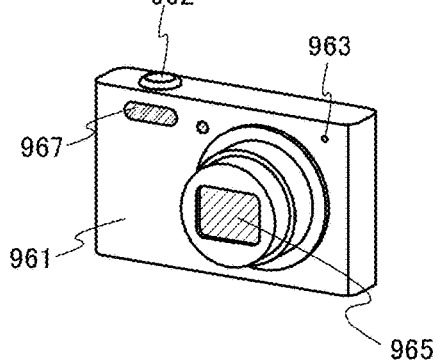

FIG. 61C illustrates a digital camera, which includes a housing 961, a shutter button 962, a microphone 963, a light-emitting portion 967, a lens 965, and the like. The imaging device of one embodiment of the present invention can be included as a component for obtaining an image in the digital camera.

Figure 61D:
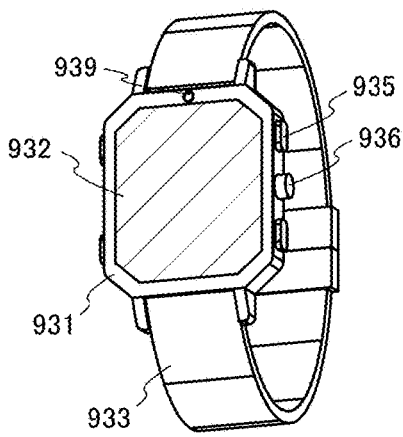

FIG. 61D illustrates a wrist-watch-type information terminal, which includes a housing 931, a display portion 932, a wristband 933, operation buttons 935, a winder 936, a camera 939, and the like. The display portion 932 may be a touch panel. The imaging device of one embodiment of the present invention can be included as a component for obtaining an image in the information terminal.

Figure 61E:
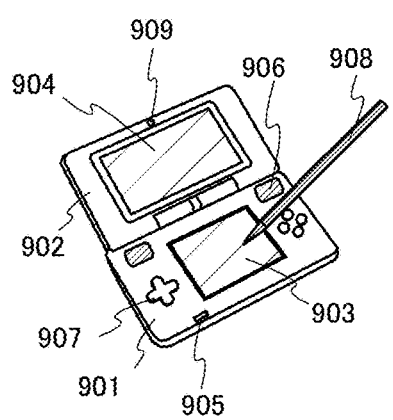

FIG. 61E illustrates a portable game machine, which includes housings 901 and 902, display portions 903 and 904, a microphone 905, speakers 906, an operation key 907, a stylus 908, a camera 909, and the like. Although the portable game machine in FIG. 61E has the two display portions 903 and 904, the number of display portions included in a portable game machine is not limited to this. The imaging device of one embodiment of the present invention can be included as one component for obtaining an image in the portable game machine.

Figure 61F:
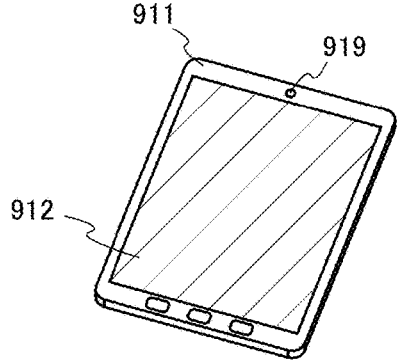

FIG. 61F illustrates a portable data terminal, which includes a first housing 911, a display portion 912, a camera 919, and the like. A touch panel function of the display portion 912 enables input and output of information. The imaging device of one embodiment of the present invention can be included as one component for obtaining an image in the portable data terminal.

This embodiment can be combined with any of the other embodiments in this specification as appropriate.

This application is based on Japanese Patent Application serial no. 2015-145656 filed with Japan Patent Office on Jul. 23, 2015, the entire contents of which are hereby incorporated by reference.

What is claimed is:
1. An imaging device comprising:
a photoelectric conversion element;
first to seventh transistors; and
first and second capacitors,
wherein the fourth transistor comprises a first gate and a second gate,
wherein the second gate faces the first gate with a channel formation region therebetween,
wherein one terminal of the photoelectric conversion element is electrically connected to one of a source and a drain of the first transistor,
wherein the other of the source and the drain of the first transistor is electrically connected to one of a source and a drain of the second transistor and one terminal of the first capacitor,
wherein the other terminal of the first capacitor is electrically connected to one of a source and a drain of the third transistor and the first gate of the fourth transistor,
wherein one of a source and a drain of the fourth transistor is electrically connected to one of a source and a drain of the fifth transistor and one of a source and a drain of the sixth transistor,
wherein the other of the source and the drain of the fourth transistor is electrically connected to one of a source and a drain of the seventh transistor and one terminal of the second capacitor, and wherein the other of the source and the drain of the sixth transistor is electrically connected to the other terminal of the second capacitor and the second gate of the fourth transistor.

2. The imaging device according to claim 1 further comprising a third capacitor,
wherein one terminal of the third capacitor is electrically connected to the other terminal of the first capacitor.

3. The imaging device according to claim 2 further comprising a fourth capacitor,
wherein one terminal of the fourth capacitor is electrically connected to the other terminal of the second capacitor.

4. The imaging device according to claim 1,
wherein each of the first to seventh transistors comprises an oxide semiconductor in an active layer,
wherein the oxide semiconductor comprises In, Zn, and M, and
wherein M is Al, Ti, Ga, Sn, Y, Zr, La, Ce, Nd, or Hf.

5. The imaging device according to claim 1,
wherein the photoelectric conversion element comprises selenium or a compound comprising selenium in a photoelectric conversion layer.

6. A module comprising:
the imaging device according to claim 1; and
a lens.

7. An electronic device comprising:
the imaging device according to claim 1; and
a display device.

8. An imaging device comprising:
a photoelectric conversion element;
first to eighth transistors; and
first and second capacitors,
wherein the fourth transistor comprises a first gate and a second gate,
wherein the second gate faces the first gate with a channel formation region therebetween,
wherein one terminal of the photoelectric conversion element is electrically connected to one of a source and a drain of the first transistor,
wherein the other of the source and the drain of the first transistor is electrically connected to one of a source and a drain of the second transistor and one terminal of the first capacitor,
wherein the other terminal of the first capacitor is electrically connected to one of a source and a drain of the third transistor and the first gate of the fourth transistor,
wherein one of a source and a drain of the fourth transistor is electrically connected to one of a source and a drain of the fifth transistor and one of a source and a drain of the sixth transistor,
wherein the other of the source and the drain of the fourth transistor is electrically connected to one of a source and a drain of the seventh transistor and one terminal of the second capacitor,
wherein the other of the source and the drain of the sixth transistor is electrically connected to the other terminal of the second capacitor and the second gate of the fourth transistor, and
wherein the other of the source and the drain of the seventh transistor is electrically connected to one of a source and a drain of the eighth transistor.

9. The imaging device according to claim 8 further comprising a third capacitor,
wherein one terminal of the third capacitor is electrically connected to the other terminal of the first capacitor.

10. The imaging device according to claim 9 further comprising a fourth capacitor,
wherein one terminal of the fourth capacitor is electrically connected to the other terminal of the second capacitor.

11. The imaging device according to claim 8,
wherein each of the first to eighth transistors comprises an oxide semiconductor in an active layer,
wherein the oxide semiconductor comprises In, Zn, and M, and
wherein M is Al, Ti, Ga, Sn, Y, Zr, La, Ce, Nd, or Hf.

12. The imaging device according to claim 8,
wherein the photoelectric conversion element comprises selenium or a compound comprising selenium in a photoelectric conversion layer.

13. A module comprising:
the imaging device according to claim 8; and
a lens.

14. An electronic device comprising:
the imaging device according to claim 8; and
a display device.

* * * * *